(12) United States Patent
Santos Rodriguez et al.

(10) Patent No.: US 10,529,612 B2
(45) Date of Patent: Jan. 7, 2020

(54) METHOD FOR PROCESSING ONE SEMICONDUCTOR WAFER OR A PLURALITY OF SEMICONDUCTOR WAFERS AND PROTECTIVE COVER FOR COVERING THE SEMICONDUCTOR WAFER

(71) Applicant: Infineon Technologies AG, Neubiberg (DE)

(72) Inventors: Francisco Javier Santos Rodriguez, Villach (AT); Roland Rupp, Lauf (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 53 days.

(21) Appl. No.: 15/648,543

(22) Filed: Jul. 13, 2017

(65) Prior Publication Data

US 2018/0019150 A1    Jan. 18, 2018

(30) Foreign Application Priority Data

Jul. 14, 2016    (DE) .................. 10 2016 112 977

(51) Int. Cl.
*H01L 21/683* (2006.01)
*B24B 37/32* (2012.01)
(Continued)

(52) U.S. Cl.
CPC .......... *H01L 21/6835* (2013.01); *B24B 37/32* (2013.01); *H01L 21/30625* (2013.01);
(Continued)

(58) Field of Classification Search
CPC ............. H01L 21/6835; H01L 21/6836; H01L 21/30625
See application file for complete search history.

(56) References Cited

U.S. PATENT DOCUMENTS 7,044,838 B2 *  5/2006  Maloney ................. B24B 37/30
451/288
7,144,299 B2 * 12/2006  Arana ..................... B24B 7/228
451/28

(Continued)

FOREIGN PATENT DOCUMENTS

DE    102004018250 A1    11/2005
DE    102004018249 B3     3/2006
(Continued)

*Primary Examiner* — Mark W Tornow
*Assistant Examiner* — Abbigale A Boyle
(74) *Attorney, Agent, or Firm* — Viering, Jentschura & Partner MBB

(57) ABSTRACT

In various embodiments, a method for processing a semiconductor wafer is provided. The semiconductor wafer includes a first main processing side and a second main processing side, which is arranged opposite the first main processing side, and at least one circuit region having at least one electronic circuit on the first main processing side. The method includes forming a stiffening structure, which at least partly surrounds the at least one circuit region and which stiffens the semiconductor wafer, wherein the stiffening structure has a cutout at least above part of the at least one circuit region, and thinning the semiconductor wafer, including the stiffening structure, from the second main processing side.

21 Claims, 19 Drawing Sheets

(51) Int. Cl.
*H01L 21/673* (2006.01)
*H01L 21/306* (2006.01)

(52) U.S. Cl.
CPC .... *H01L 21/67383* (2013.01); *H01L 21/6836* (2013.01); *H01L 2221/6834* (2013.01); *H01L 2221/68327* (2013.01); *H01L 2221/68381* (2013.01)

(56) References Cited

U.S. PATENT DOCUMENTS

| | | |
|---|---|---|
| 7,863,104 B2 | 1/2011 | Kroeninger et al. |
| 7,892,947 B2 | 2/2011 | Bradl et al. |
| 8,357,588 B2 | 1/2013 | Bradl et al. |
| 9,412,707 B2 * | 8/2016 | Chung ................ H01L 23/3114 |
| 2005/0236693 A1 | 10/2005 | Kroninger et al. |
| 2006/0040467 A1 | 2/2006 | Dolechek et al. |
| 2007/0117351 A1 | 5/2007 | Bradl et al. |
| 2008/0014715 A1 * | 1/2008 | Leitner ............... H01L 21/6835 |
| | | 438/458 |
| 2009/0098684 A1 | 4/2009 | Kroeninger et al. |
| 2011/0048611 A1 * | 3/2011 | Carre ................ H01L 21/6835 |
| | | 156/73.1 |
| 2011/0232074 A1 | 9/2011 | Bradl et al. |
| 2016/0086838 A1 | 3/2016 | Santos Rodriguez et al. |
| 2017/0213764 A1 * | 7/2017 | Lai ................... H01L 21/30625 |

FOREIGN PATENT DOCUMENTS

| | | |
|---|---|---|
| DE | 102006032488 B4 | 9/2008 |
| DE | 112006003839 T5 | 2/2009 |
| WO | 2005101459 A2 | 10/2005 |
| WO | 2007122438 A1 | 11/2007 |

* cited by examiner

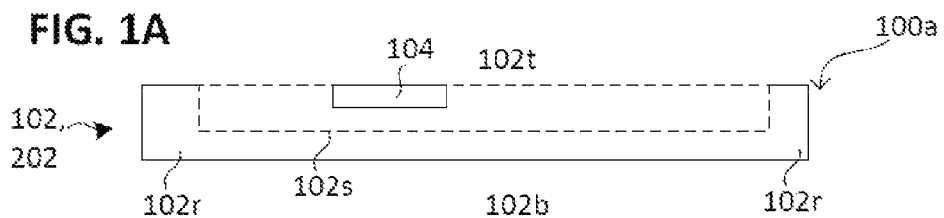
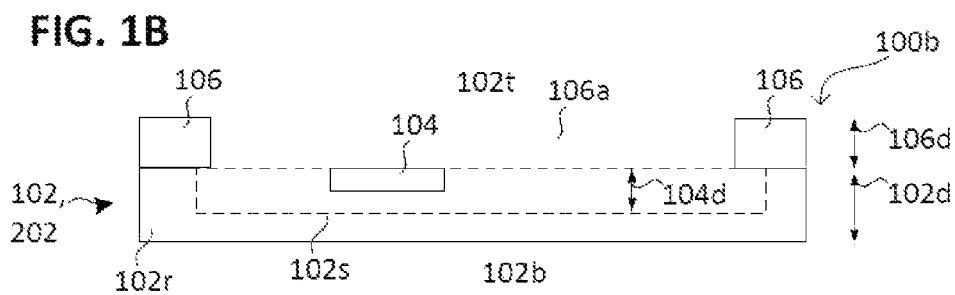
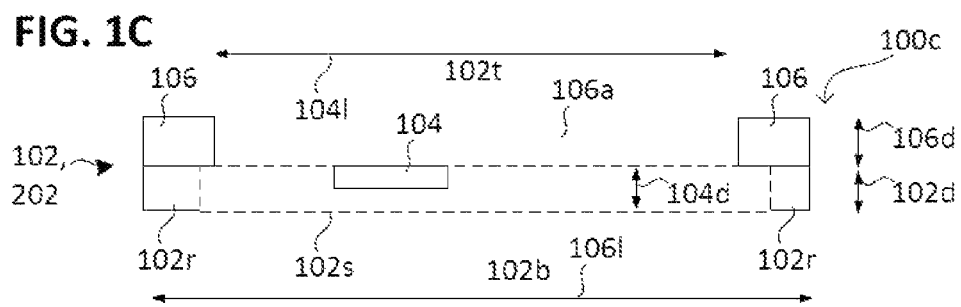
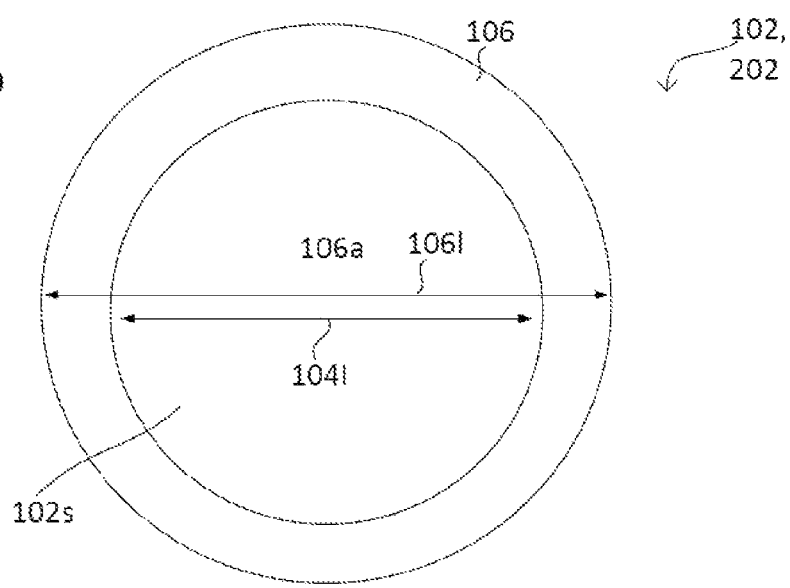

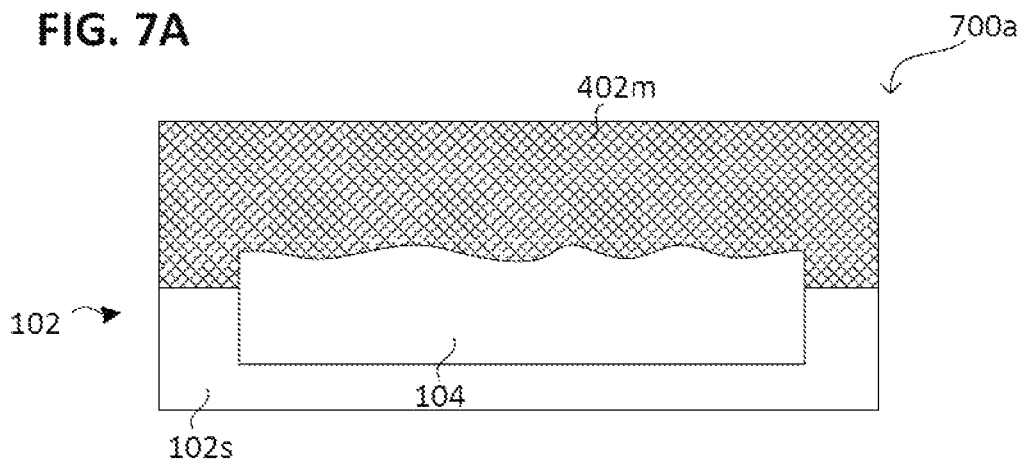
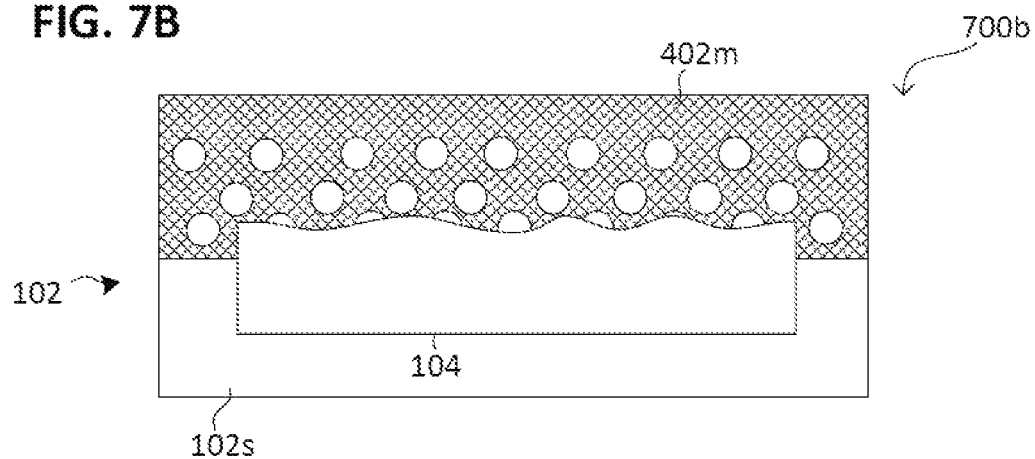
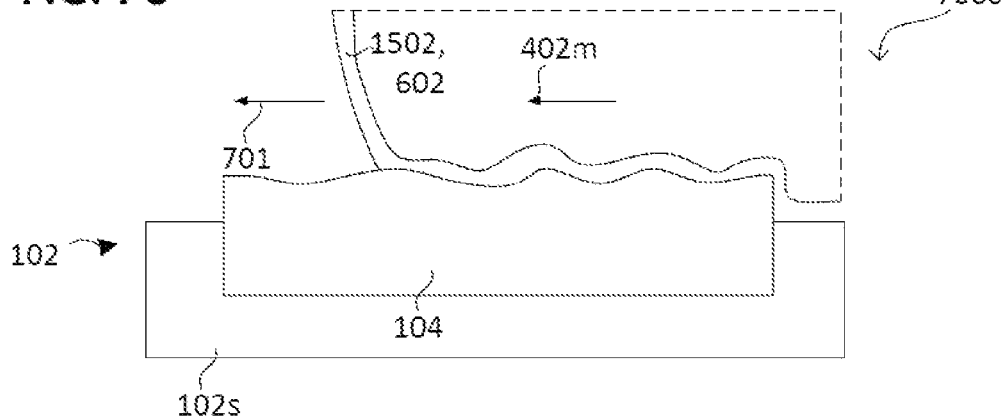

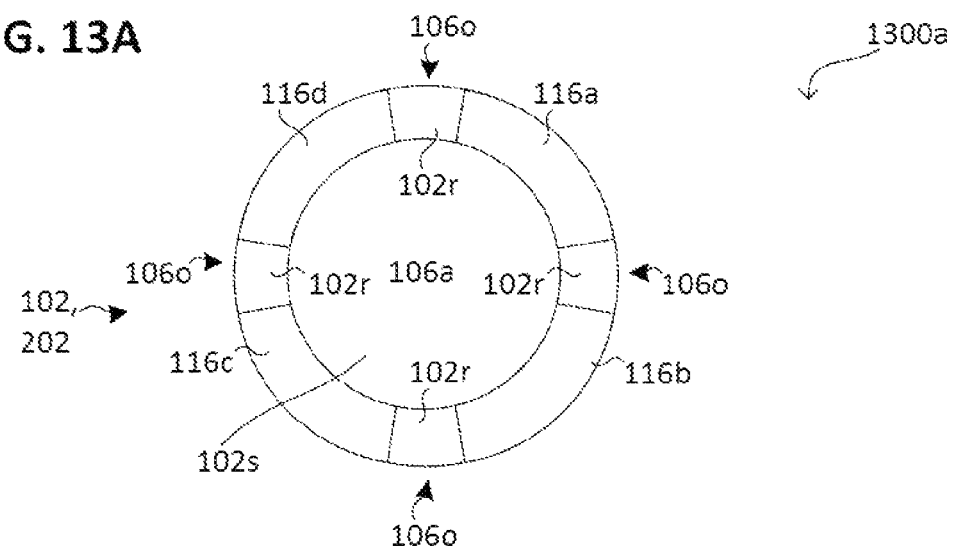
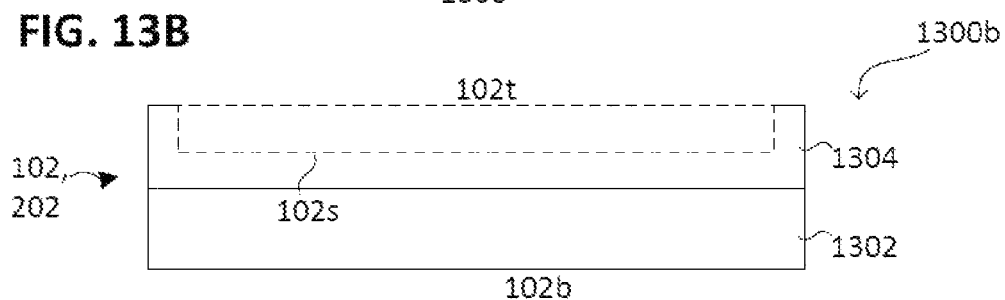
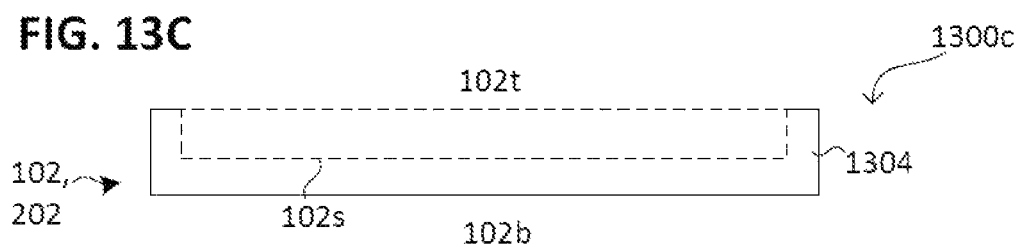
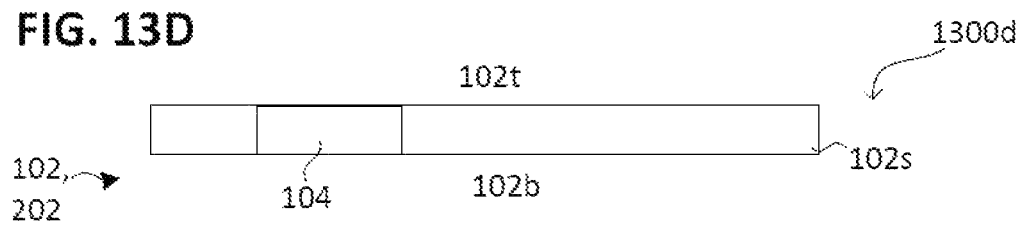

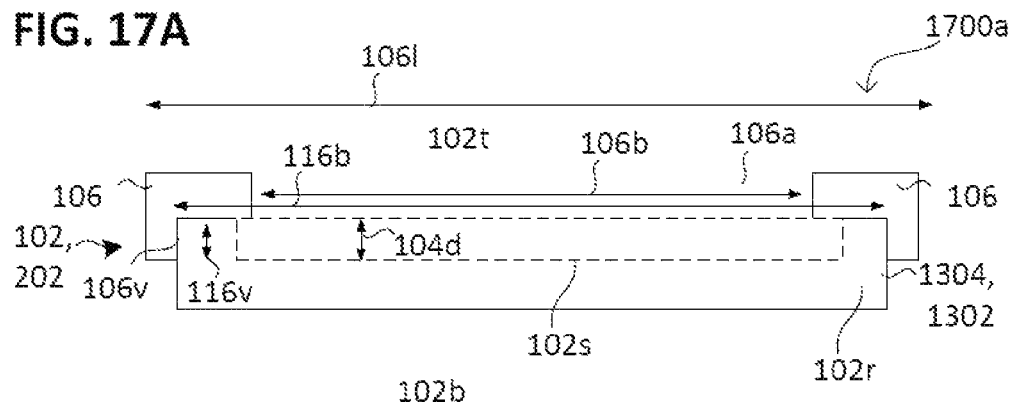
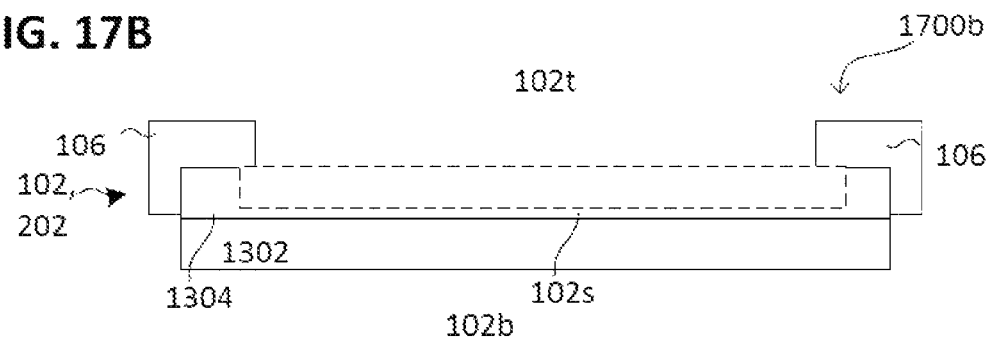
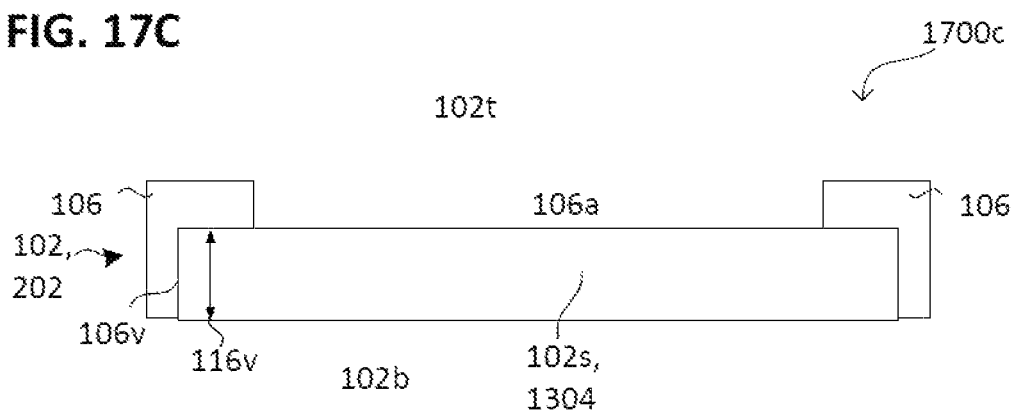

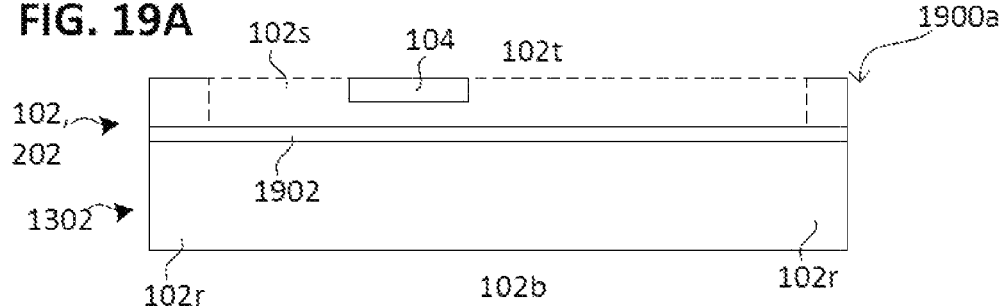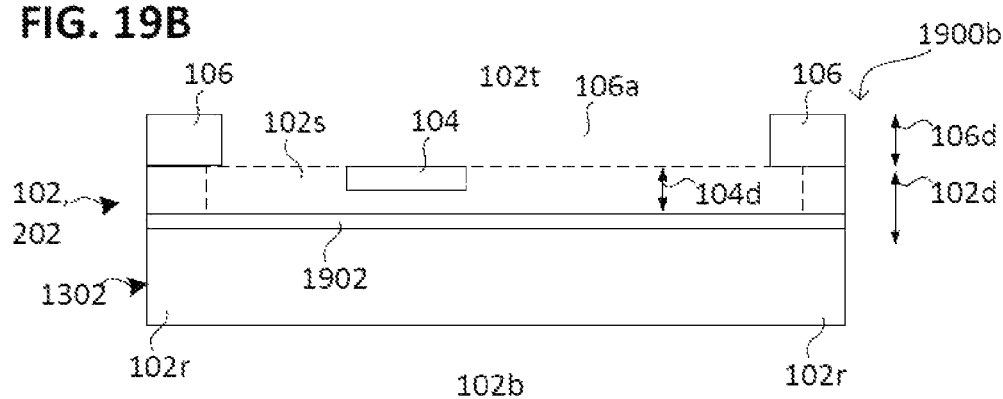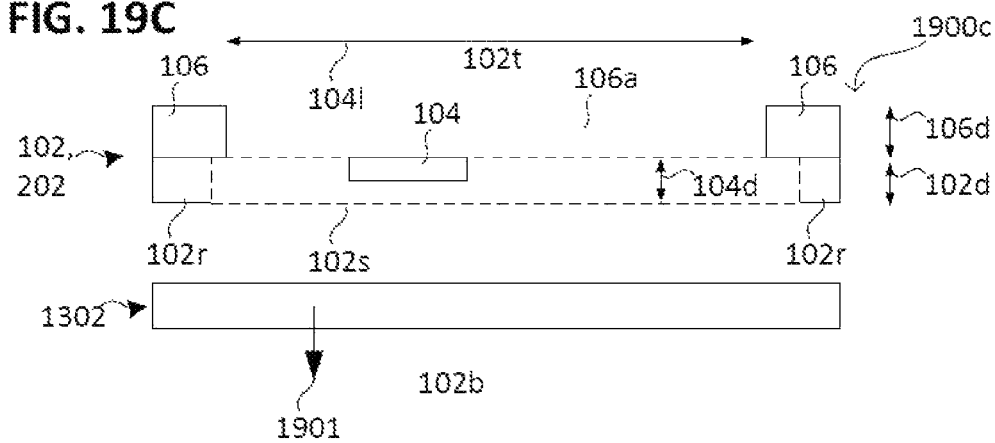

METHOD FOR PROCESSING ONE SEMICONDUCTOR WAFER OR A PLURALITY OF SEMICONDUCTOR WAFERS AND PROTECTIVE COVER FOR COVERING THE SEMICONDUCTOR WAFER

CROSS-REFERENCE TO RELATED APPLICATION

This application claims priority to German Patent Application Serial No. 10 2016 112 977.1, which was filed Jul. 14, 2016, and is incorporated herein by reference in its entirety.

TECHNICAL FIELD

Various embodiments relate generally to a method for processing one semiconductor wafer or a plurality of semiconductor wafers and a protective cover for covering the semiconductor wafer.

BACKGROUND

In general, it is possible to process, singulate and embed a semiconductor chip (also referred to as integrated circuit, IC, chip or microchip) using semiconductor technology on and/or in a wafer (or a substrate or a carrier). A finished produced chip (e.g. an embedded integrated circuit) can be mounted in or on a carrier and contacted in order to provide a specific functionality, such as e.g. the switching of electric currents. In order to reduce resistive losses of the chip, which reduces the power consumption thereof, particularly in the case of high electric currents, the chip overall can be produced so as to be as thin as possible, such that a vertical current path through the chip is as short as possible. In order to produce such chips, correspondingly thin wafers are required, e.g. for producing metal oxide semiconductor field effect transistors (MOSFETs), insulated-gate bipolar transistors (also referred to as IGBT) or emitter controlled diodes (also referred to as Emcon diode).

The processing of correspondingly thin wafers can constitute a particular challenge since said wafers are very sensitive and not mechanically loadable. It is conventional practice, therefore, to mechanically stiffen a thin wafer in order to counteract damage to the thin wafer as a result of the deformation thereof. The stiffening of the thin wafer can become necessary, for example, while the rear side thereof is thinned to the desired thickness. Likewise, other processes, such as transporting the wafer or cleaning the wafer, for example, can necessitate stiffening.

It is conventional practice, for stiffening the wafer, to selectively grind away the rear side thereof, such that the edge of the wafer remains (e.g. also referred to as rear-side support ring) which surrounds the thinned region of the wafer. Alternatively or additionally, during thinning or after thinning, the wafer is adhesively bonded by its front side onto a planar carrier, which together form an adhesively bonded laminate.

However, preventing the adhesive used for adhesively bonding the front side of the wafer from coming into direct contact with the electronic circuits is possibly only with great effort. Therefore, it is conventional practice to use an adhesive which can easily be released again, such that damage to the electronic circuits situated on the front side of the wafer is avoided as much as possible. Nevertheless, wetting of the front side with the adhesive cannot be avoided, and even easily releasable adhesives can be removed without residues only with considerable effort. This is achieved by means of polymer-based adhesives, but they restrict the temperatures to which the adhesively bonded laminate can be subjected (e.g. to less than 200° C.). Easily rereleasable adhesives likewise increase the risk of the laminate detaching prematurely.

The adhesively bonded laminate makes the chemical mechanical polishing of the rear side of the wafer more difficult or makes it essentially impossible. In particular, the non-planar rear side of the laminate makes the further processing thereof more difficult and necessitates further adaptations, e.g. if a wafer chuck is intended to be used.

SUMMARY

In various embodiments, a method for processing a semiconductor wafer is provided. The semiconductor wafer includes a first main processing side and a second main processing side, which is arranged opposite the first main processing side, and at least one circuit region having at least one electronic circuit on the first main processing side. The method includes forming a stiffening structure, which at least partly surrounds the at least one circuit region and which stiffens the semiconductor wafer, wherein the stiffening structure has a cutout at least above part of the at least one circuit region, and thinning the semiconductor wafer, including the stiffening structure, from the second main processing side.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A to 1C in each case show a semiconductor wafer in a method in accordance with various embodiments in a schematic side view or cross-sectional view;

FIG. 1D shows a semiconductor wafer in a method in accordance with various embodiments in a schematic plan view;

FIGS. 7A to 7C in each case show a semiconductor wafer in a method in accordance with various embodiments in a schematic side view or cross-sectional view;

FIG. 13A shows a semiconductor wafer in a method in accordance with various embodiments in a schematic plan view;

FIGS. 13B to 13D in each case show a semiconductor wafer in a method in accordance with various embodiments in a schematic side view or cross-sectional view;

FIGS. 17A to 17C in each case show a semiconductor wafer in a method in accordance with various embodiments in a schematic side view or cross-sectional view;

FIGS. 19A to 19C in each case show a semiconductor wafer in a method in accordance with various embodiments in a schematic side view or cross-sectional view.

DESCRIPTION

Figure 2A:
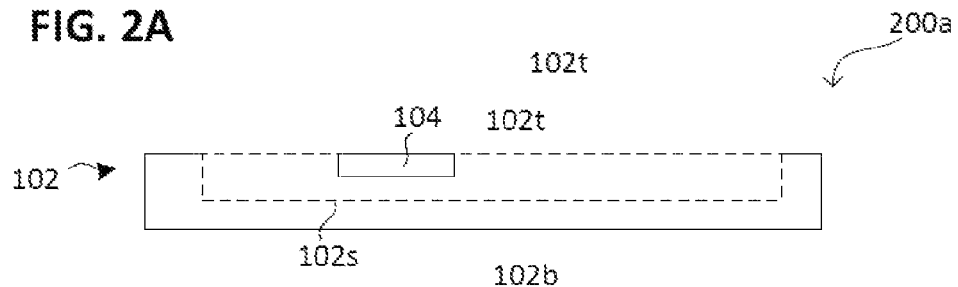
FIGS. 2A to 2E in each case show a semiconductor wafer in a method in accordance with various embodiments in a schematic side view or cross-sectional view.
Figure 2B:
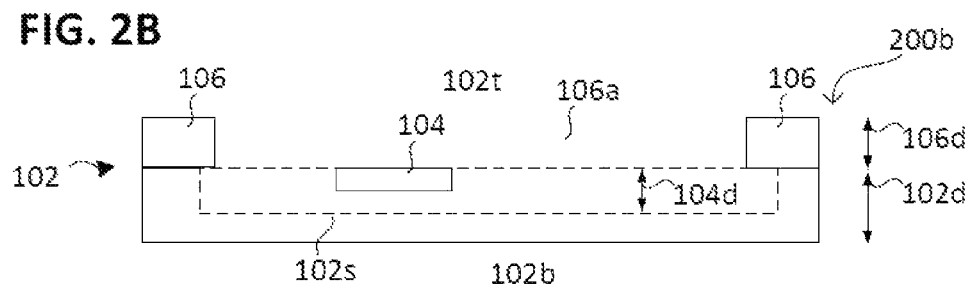
Figure 2C:
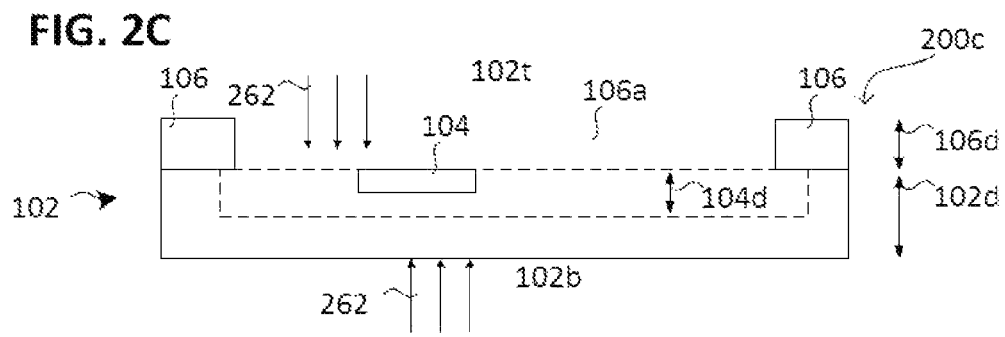
Figure 2D:
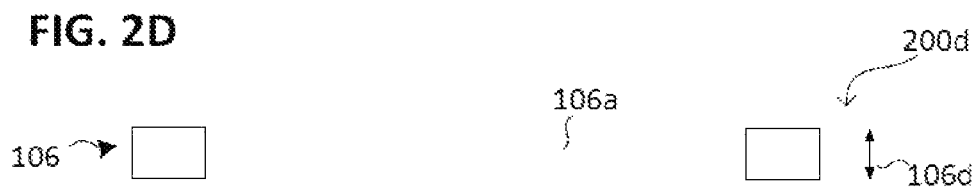
Figure 2E:
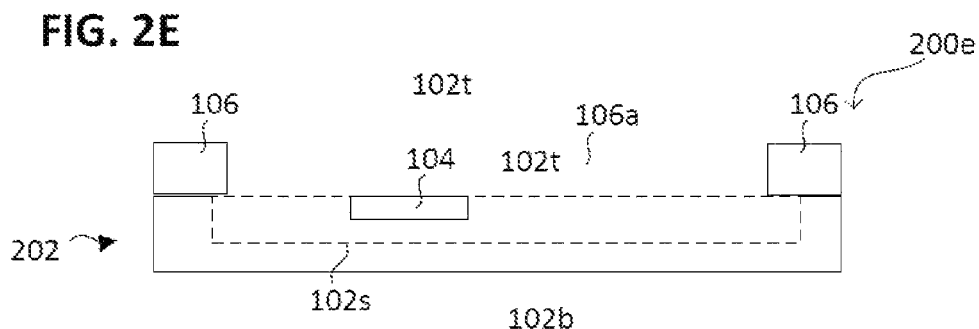
Figure 3A:
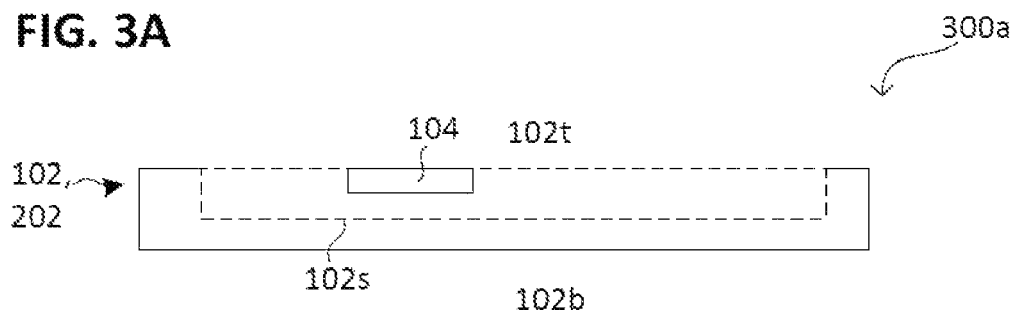
FIGS. 3A to 3D in each case show a semiconductor wafer in a method in accordance with various embodiments in a schematic side view or cross-sectional view.
Figure 3B:
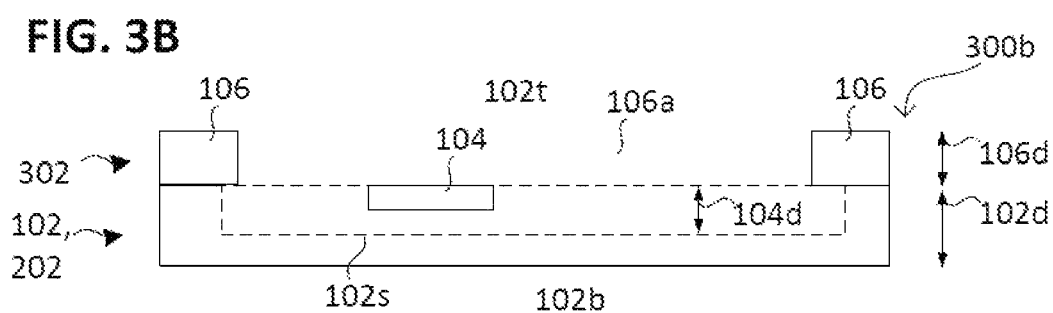
Figure 3C:
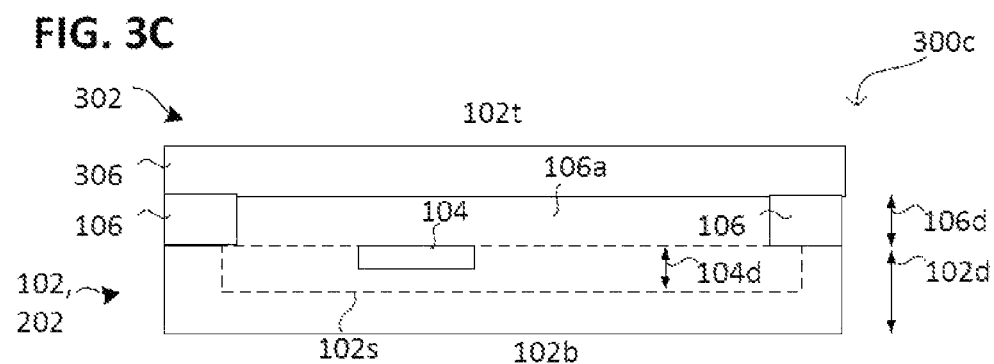
Figure 3D:
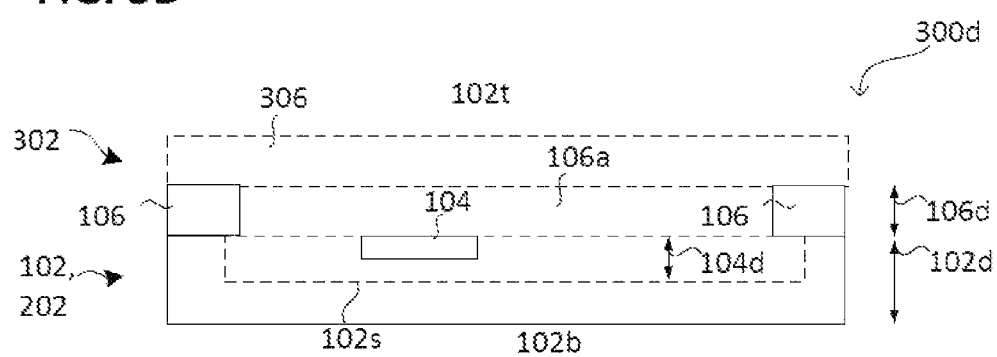

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

The term "exemplary" is used here with the meaning "serving as an example, exemplar or illustration". Any embodiment or configuration that is described here as "exemplary" should not necessarily be understood as preferred or advantageous vis-à-vis other embodiments or configurations.

The term "above" with respect to deposited material, a structure or a body that is formed "above" a side or surface can be understood in accordance with various embodiments to mean that the deposited material, the structure or the body is formed "directly on", e.g. in direct (e.g. physical) contact with, the stated side or surface. The term "above" with respect to a deposited material that is formed "above" a side or surface can be understood in accordance with various embodiments to mean that the deposited material is formed "indirectly on" the stated side or surface, wherein one or a plurality of additional layers are arranged between the stated side or surface and the deposited material, the structure or the body.

The term "lateral" or "laterally" with respect to the "lateral" extent of a structure (or of a substrate, a wafer or a carrier) or "laterally" adjoining can be used in accordance with various embodiments to denote an extent or a positional relationship along a surface of a substrate, a wafer or a carrier. That means that a surface of a substrate (for example a surface of a carrier or a surface of a wafer) can serve as a reference which is generally designated as the main processing surface (e.g. on a main processing side) of the substrate, of the carrier or of the wafer. Furthermore, the term "width", which is used with regard to a "width" of a structure (or of a structure element) can be used here to denote the lateral extent of a structure.

Furthermore, the term "height", which is used with respect to a height of a structure (or of a structure element), can be used here to denote the extent of a structure along a direction perpendicular to the surface of a substrate (e.g. perpendicular to the main processing surface of a substrate), i.e. a vertical extent. The term "thickness", which is used with regard to a "thickness" of a layer, can be used here to denote the spatial extent of the layer perpendicular to the surface of the carrier (of the material) on which the layer is deposited, i.e. a vertical extent. If the surface of the carrier is parallel to the surface of the substrate (for example to the main processing surface), the thickness of the layer applied on the carrier can be equal to the height of the layer. Furthermore, a "vertical" structure can denote a structure which extends in a direction perpendicular to the lateral direction (e.g. perpendicular to the main processing surface of a substrate), and a "vertical" extent can denote an extent along a direction perpendicular to a lateral direction (for example an extent perpendicular to the main processing surface of a substrate).

In the context of this description, the terms "connected" and "coupled" are used to describe both a direct and an indirect connection and a direct or indirect coupling, e.g. electrically conductive. In the figures, identical or similar elements are provided with identical reference signs, in so far as this is expedient.

In accordance with various embodiments, the term "fluid" can be understood as including or formed from a liquid material and/or a gaseous material, e.g. a mixture thereof. The term "fluid" can be understood to mean that the material is flowable (also referred to as viscous), e.g. solely on account of its weight force.

In accordance with various embodiments, a connection between two structures (e.g. bodies or regions) can be understood as a mechanical cohesion which restricts or prevents mobility between two structures.

In accordance with various embodiments, the term "light-sensitive" in connection with a material or a structure can be understood to mean that the chemical structure thereof can be altered by means of light (that is to say that it can be converted), e.g. by its being exposed to a conversion light intensity or more, e.g. having a wavelength from a conversion wavelength range.

In accordance with various embodiments, the term "thermosensitive" in connection with a material or a structure can be understood to mean that the chemical structure thereof can be altered by means of thermal energy (also referred to as heat), e.g. by its being brought to a conversion temperature or more.

A releasable connection (e.g. between two components, e.g. between the stiffening structure and the edge region) can be understood in accordance with various embodiments as a nondestructively releasable connection. In other words, the releasable connection between two components can be removed without damaging the two components. The releasable connection between two components can be (e.g. thermally, mechanically and/or chemically) less resistant than each of the two components. The non-releasable connection between two components can be (e.g. thermally, mechanically and/or chemically) more resistant than each of the two components. By way of example, the non-releasable connection can be cancelled only by destruction of at least one of the two components.

By way of example, the releasable connection between the two components can impart a force (also referred to as adhesion force) which is less than their breaking force. Relative to the area of the connection, the breaking force can correspond to the tensile strength (in force per area). The non-releasable connection can impart between the two components a force (also referred to as adhesion force) which is greater than their breaking force.

The breaking force can be understood as force required to break or rupture the component.

The term "resistance" in connection with processing (e.g. thinning) can be understood as endurance vis-à-vis a thermal, mechanical and/or chemical alteration (i.e. thermal resistance, mechanical resistance, chemical resistance) which is brought about by the processing, e.g. vis-à-vis a chemical reaction (e.g. oxidation), a thermal influence and/or vis-à-vis a material erosion. A greater resistance results in a slower alteration, e.g. no alteration. By way of example, a structure (e.g. a region or a layer) and/or a material can be altered by the processing to a lesser extent and/or more slowly the greater its resistance. The resistance can be related to a specific type of processing and/or deviate from one another for different types of processing.

The mechanically less resistant structure (e.g. region or layer) and/or the mechanically less resistant material can have for example a lower breaking strength, breaking force, tensile strength or hardness than the mechanically more resistant structure (e.g. region or layer) and/or the mechanically more resistant material. The chemically less resistant structure (e.g. region or layer) and/or the chemically less resistant material can have for example a lower chemical reactivity vis-à-vis a chemical processing agent than the chemically more resistant structure (e.g. region or layer) and/or the mechanically more resistant material.

A resistance can be reduced, for example, by a surface area being increased. Thus, for a chemically reactive etchant, for example, it is possible to provide a larger surface area that can be attacked by the etchant. Alternatively or additionally, a resistance can be increased by a mechanical hardness and/or breaking force being increased and/or a chemical reactivity vis-à-vis the etchant being reduced (also referred to as passivation). The chemical reactivity can describe the ability of a material to enter into a chemical reaction, e.g. the speed at which the chemical reaction takes place or the energy threshold necessary to initiate the reaction (also referred to as activation energy).

In accordance with various embodiments, thermally stable in connection with a temperature can be understood to mean that a structure or a material can be loaded at least up to the temperature without losing its function. By way of example, the structure or the material at least up to the temperature can enter into no or hardly any chemical reactions with its surroundings and/or remain chemically stable. By way of example, the structure or the material at least up to the temperature can maintain its state of matter and/or its chemical composition. By way of example, the structure or the material at least up to the temperature can maintain its shape and/or its volume (i.e. without changing structurally). By way of example, the temperature up to which the structure or the material is thermally stable can be a conversion temperature.

In accordance with various embodiments, a chip (also referred to as an integrated circuit or an integrated electronic circuit) can be formed as a thin chip or as a very thin chip. A thin chip can have a thickness in the range of approximately 70 µm to approximately 250 µm. A very thin chip can have a thickness in the range of approximately 5 µm to approximately 70 µm. The chip can optionally be thicker than a thin chip, e.g. in a range of approximately 250 µm to approximately 1 mm (millimetre).

In accordance with various embodiments, a chip can have and/or provide a vertical current path (i.e. a current path through the chip), e.g. between two contact pads arranged on opposite sides of the chip (e.g. on the rear side thereof and the front side thereof).

In accordance with various embodiments, a circuit region (can be part of a useful layer) can be understood as a region which is provided and/or processed for producing individual electronic components and/or electronic circuits. By way of example, the circuit region can be chemically altered, coated and/or structured at least in sections. The circuit region including at least one electronic component can also be referred to as component layer. The circuit region may include or be formed from a semiconductor region.

In accordance with various embodiments, a semiconductor region (e.g. the circuit region) can be processed in order to form one or a plurality of electronic components, e.g. separated from one another or interconnected with one another. A plurality of components interconnected with one another can form an electronic circuit, for example. In general, an electronic circuit (also referred to as a chip or a semiconductor chip) or electronic circuits can be formed in the semiconductor region.

Each or the chip may include an active chip area. The active chip area can be arranged in a part of the semiconductor region and may include at least one electronic component (exactly one electronic component or a plurality of electronic components), such as at least one transistor, at least one resistor, at least one capacitor, at least one diode or the like. The at least one electronic component can be configured for performing operations, e.g. computation operations or storage operations. Alternatively or additionally, the at least one electronic component can be configured for performing switching operations or amplification operations, e.g. in power electronics (e.g. using power components).

Various electronic components, such as e.g. a transistor and/or a diode, can be configured for high-voltage applications (also referred to as high-voltage diode or high-voltage transistor). Alternatively or additionally, the at least one electronic component may include or be formed from a transistor and/or a diode, e.g. can be a metal oxide semiconductor field effect transistor (MOSFET), an emitter controlled diode and/or an insulated gate bipolar transistor (IGBT).

In accordance with various embodiments a chip (also referred to as an integrated electronic circuit) can be singulated from the semiconductor region (or from the semiconductor wafer) by material being removed from a kerf of the semiconductor region (also referred to as dividing or cutting apart the semiconductor region). By way of example, material can be removed from the kerf of the semiconductor region by scribing and breaking, splitting, blade dividing (separation), plasma dividing (separation), laser dividing or mechanical sawing (for example by using a separating saw). After the semiconductor chip has been singulated, it can be electrically contacted and subsequently encapsulated (e.g. in a closed or half-open fashion), e.g. by means of a moulding material and/or into a chip carrier (also referred to as chip package) suitable for use in an electronic device. By way of example, the chip can be connected by means of wires within the chip carrier and/or the chip carrier can be soldered on a printed circuit board and/or on a leadframe (for example an IGBT or a power MOSFET).

In accordance with various embodiments, the circuit region and the edge region and also optionally the stiffening structure, optionally the stiffening structure cover and/or optionally the filling body may include or be formed from one of the semiconductor materials below. The term semiconductor material can be understood as a chemical composition which includes or is formed from a semiconducting base material and/or is semiconducting in an undoped state, i.e. has an electrical conductivity in a range of approximately $10^{-6}$ siemens/metre to approximately $10^6$ siemens/metre. During the processing of the wafer, the semiconducting base material can be doped for example at least in sections, which increases its electrical conductivity in the doped locations (e.g. above $10^6$ siemens/metre).

The semiconductor material or the semiconducting base material may include or be formed from, for example, an elemental semiconductor (also referred to as semiconductor, e.g. a silicon or germanium) or a compound semiconductor (e.g. silicon carbide, gallium nitride or SiGe).

In accordance with various embodiments, the circuit region or at least the at least one electronic circuit can have a greater dopant concentration than the edge region, than the filling body, than the stiffening structure cover and/or than the stiffening structure.

In accordance with various embodiments, a semiconductor wafer (e.g. a reconfigured wafer), e.g. its substrate, and/or a semiconductor region (e.g. the circuit region) may include or be formed from a semiconductor material (e.g. the semiconducting base material) of one type or of different types, including group IV semiconductors (e.g. silicon or germanium), compound semiconductors, e.g. group III-V compound semiconductors (for example gallium arsenide), group III semiconductors, group V semiconductors or semiconducting polymers. In a plurality of embodiments, the semiconductor wafer, e.g. its substrate and/or the semiconductor region (e.g. the circuit region thereof) can be formed from silicon (doped or undoped). In a plurality of alternative embodiments, the semiconductor wafer, e.g. its substrate, can be a silicon-on-insulator (SOI) wafer. As an alternative, it is possible to use any other suitable semiconductor material for the semiconductor wafer and/or the semiconductor region, for example a semiconductor compound (semiconducting chemical compound) such as gallium phosphide (GaP), indium phosphide (InP), silicon carbide (SiC) or gallium nitride (GaN), but also any suitable ternary semiconductor compound or quaternary semiconductor compound, such as indium gallium arsenide (InGaAs), for example.

In accordance with various embodiments, the edge region and the circuit region and also optionally the stiffening structure (also referred to as support layer) and/or optionally the stiffening structure cover may include or be formed from a semiconductor region.

In accordance with various embodiments, the stiffening structure, the filling body and/or the stiffening structure cover may include or be formed from an oxide (e.g. a semiconductor oxide such as silicon dioxide or a metal oxide). Alternatively or additionally, the filling body can be porous. By way of example, the filling body may include or be formed from a porous oxide or porous semiconductor material (e.g. silicon, silicon-germanium and/or SiC). Alternatively or additionally, the stiffening structure and/or the stiffening structure cover may include or be formed from the semiconductor material (e.g. silicon, silicon-germanium and/or SiC), e.g. the semiconductor material of the circuit region. Optionally, the stiffening structure may include or be formed from an epitaxial material.

In accordance with various embodiments, the cross section of the or each semiconductor wafer can have an arbitrary shape, for example can be circular, elliptical, polygonal (e.g. rectangular, e.g. square), e.g. a mixture thereof. Illustratively, the shape of the cross section can be adapted to the conditions.

In accordance with various embodiments, the filling body can be formed by means of physical foaming. Physical foaming may include continuous foaming (also referred to as extrusion) and/or discontinuous foaming, e.g. injection moulding. Foaming may include relaxing a material from which the filling body is formed (that is to say that the material can expand, with a pressure in the material decreasing). The material may include or be formed from a fluid. The fluid may include a liquid material in which a gas (e.g. nitrogen or carbon dioxide) is dissolved and/or introduced. By way of example, the fluid can be introduced into the cutout by means of a nozzle, e.g. through an opening of the stiffening structure and/or through an opening of the stiffening structure cover. After foaming, the liquid material can be converted to a solid state (for example by means of solidification), that is to say to a solid material. The foamed and solidified material can also be referred to as a solid foam (foam material).

In accordance with various embodiments, for the purpose of foaming the material, a fluid (e.g. including or formed from a gas, such as nitrogen or carbon dioxide) can be introduced into the material (e.g. present as a melt). By way of example, the fluid can be introduced either directly into the cutout or into a nozzle by means of which the material is introduced into the cutout.

The fluid can be dissolved in the material (e.g. present as a melt), e.g. by the fluid and the material being joined together at or above a solubility pressure. Furthermore, the fluid can expand as soon as the pressure of the material is reduced, e.g. to or below the solubility pressure (e.g. by virtue of the material passing into the cutout). By means of the expansion of the material (illustratively foaming), a foamed filling body can be provided which includes or is formed from e.g. a compact outer skin and/or a microcellular foam. The number and size of the foam cells can be dependent on the nucleation (number of crystallization nuclei) and on other physical parameters such as pressure, temperature and mould filling level.

In accordance with various embodiments, the filling body can be formed by means of chemical foaming. Chemical foaming may include adding to the material a solid propellant, e.g. in the form of powder or granules. The propellant can be configured to decompose with emission of a gas (e.g. carbon dioxide). In other words, the propellant can be configured to release a gas, e.g. at or above a conversion temperature of the propellant (illustratively a decomposition temperature). In order to release the gas (i.e. in order to start the decomposition process), the material can be heated to or above the conversion temperature. If the material has a pressure greater than or equal to the solubility pressure, the released gas can be dissolved in the material. Alternatively or additionally, the gas can expand as soon as the pressure of the material is reduced, e.g. to or below the solubility pressure (e.g. by virtue of the material passing into the cutout). Alternatively, the material can be heated to or above the conversion temperature after the material has been introduced into the cutout, such that the gas is released only in the cutout.

In accordance with various embodiments, a carrier system including the stiffening structure and optionally including the stiffening structure cover and/or optionally including the filling body is provided. In accordance with various embodiments, the carrier system manages without an adhesive layer above the circuit region (for example the active region of the chips). The carrier system provided can have a sufficient mechanical stability (for stiffening) and can facilitate the further processing of the semiconductor wafer, e.g. by means of grinding the rear side and/or by means of a high-temperature process. The high-temperature process may include subjecting the semiconductor wafer to a temperature (illustratively a high temperature) which is greater than the thermal stability of conventional adhesive materials, for example greater than approximately 250° C., e.g. greater than approximately 500° C., e.g. greater than approximately 600° C., e.g. greater than approximately 700° C., e.g. greater than approximately 800° C., e.g. greater than approximately 900° C.

In accordance with various embodiments, a ring (also referred to as support ring) arranged on the front side of the semiconductor wafer can be used, for example in combination with one or a plurality of decomposable components (for example the stiffening structure, the stiffening structure cover and/or the useful layer) and/or without the use of an adhesive in physical contact with the circuit region (for example the active region of the chips).

In accordance with various embodiments, the semiconductor wafer may include at least one of the following:
  an epitaxial layer above an etch stop (e.g. above an etch stop layer), for example in physical contact therewith, or
  an epitaxial layer in physical contact with the substrate (i.e. without an etch stop).

The epitaxial layer makes it possible that an epitaxial layer-based electronic circuit can be formed in the circuit region. The layer need not necessarily be epitaxial.

In accordance with various embodiments, the stiffening structure may include or be formed from at least one of the following:
  a ring (by way of example, the stiffening structure can be formed in a ring-shaped fashion);
  an overhang;
  crystalline SiC, e.g. polycrystalline SiC, also referred to as poly-SiC) and/or monocrystalline SiC;
  glass (in other words silicon dioxide);
  a connection to the edge region of the semiconductor wafer, which connection is provided by means of a high-temperature adhesive (for example if the stiffening structure includes or is formed from crystalline SiC and/or glass);
  a connection to the edge region, which connection is provided by means of anodic bonding (for example if the stiffening structure includes or is formed from glass); and/or
  a connection to the edge region, which connection is provided by means of laser welding (for example if the stiffening structure includes or is formed from glass).

Optionally, the carrier system may include a stiffening structure cover. The stiffening structure cover can prevent contamination from reaching the circuit region. If a filling body including a polymer is used, the stiffening structure cover can inhibit or substantially prevent the outgassing of the polymer. The stiffening structure cover can then be degassed under open-loop or closed-loop control in order to prevent a pressure build-up that might deform the semiconductor wafer.

In accordance with various embodiments, the stiffening structure cover may include or be formed from at least one of the following:
  glass;
  poly-SiC;
  ternary carbide; and/or
  a polymer.

In accordance with various embodiments, the carrier system may include a stiffening structure and furthermore include or be formed from at least one of the following:
  a stiffening structure cover including or formed from glass, a filling body (e.g. including or formed from a polymer foam), and a connection to the edge region, which connection is provided by means of a UV-releasable adhesive (i.e. an adhesive which can be released by means of ultraviolet light);
  a stiffening structure cover including or formed from glass, a filling body (e.g. including or formed from a polymer foam), and a connection to the edge region, which connection is provided by means of a thermally releasable (also referred to as thermorelease) adhesive (i.e. an adhesive which can be released by means of heat, i.e. by means of thermal energy);
  a stiffening structure cover including or formed from glass, a filling body (e.g. including or formed from a polymer foam), and a connection to the edge region, which connection is provided by means of a positively locking engagement (e.g. by means of a rotary closure);
  a stiffening structure cover including or formed from poly-SiC, a filling body (e.g. including or formed from a polymer foam), and a connection to the edge region, which connection is provided by means of a UV-releasable adhesive (i.e. an adhesive which can be released by means of ultraviolet light);
  a stiffening structure cover including or formed from poly-SiC, a filling body (e.g. including or formed from a polymer foam), and a connection to the edge region, which connection is provided by means of a thermally releasable (also referred to as thermorelease) adhesive (i.e. an adhesive which can be released by means of heat, i.e. by means of thermal energy); or
  a stiffening structure cover including or formed from poly-SiC, a filling body (e.g. including or formed from a polymer foam), and a connection to the edge region, which connection is provided by means of a positively locking engagement (e.g. by means of a rotary closure).

Optionally, the stiffening structure and the stiffening structure cover may include or be formed from the same material.

In accordance with various embodiments, the stiffening structure and the circuit region (or the useful layer) can have the same shape (for example round or square).

In accordance with various embodiments, the stiffening structure can have a lateral extent greater than or equal to the lateral extent of the useful layer. If the stiffening structure has a lateral extent greater than the useful layer, the useful layer can be better protected, for example its sensitive edge. If the stiffening structure has a lateral extent greater than the useful layer, the stiffening structure can optionally have a depression into which the useful layer engages (such that the overhang is formed). Thus, illustratively, a stop for the mechanical thinning of the semiconductor wafer can be provided.

In accordance with various embodiments, the stiffening structure can have a greater hardness than the circuit region (or the useful layer). This makes it possible that mechanical processing can be stopped by means of the stiffening structure.

In accordance with various embodiments, the stiffening structure can have a greater modulus of elasticity than the circuit region (or the useful layer). This can make it possible that mechanical processing can be stopped by means of the stiffening structure.

In accordance with various embodiments, at least one component of the carrier system (for example the stiffening structure, the stiffening structure cover and/or the useful layer) can be reused (recycled), for example if the component includes or is formed from glass, silicon and/or SiC (e.g. poly-SiC). By way of example, the stiffening structure can be reused if it includes or is formed from glass or SiC (e.g. poly-SiC). In order to reuse the stiffening structure, the stiffening structure cover can optionally be removed therefrom, for example if the stiffening structure cover includes or is formed from silicon. The silicon can be removed by means of etching, for example. Reusing a component can be understood to mean that the component is used to stiffen a plurality of semiconductor wafers successfully.

FIG. 1A, FIG. 1B and FIG. 1C in each case illustrate a semiconductor wafer in a method in accordance with various embodiments in a schematic side view or cross-sectional view (e.g. with a direction of view along a main processing side $102t$, $102b$), e.g. the first semiconductor wafer $102$ and/or the second semiconductor wafer $202$.

The method may include, in $100a$, providing the semiconductor wafer $102$, $202$. The semiconductor wafer $102$, $202$ may include a first main processing side $102t$ (illustratively a front side) and a second main processing side $102b$ (illustratively a rear side). The second main processing side $102b$ and the first main processing side $102t$ can be mutually opposite sides of the semiconductor wafer $102$, $202$.

The semiconductor wafer $102$, $202$ may include at least one circuit region $102s$ in which at least one electronic circuit $104$ is formed, on the first main processing side $102t$.

The semiconductor wafer $102$, $202$ can furthermore include an edge region $102r$, which at least partly surrounds the circuit region $102s$. By way of example, the edge region $102r$ can be extended around the circuit region $102s$ in a ring-shaped fashion. Optionally, the edge region $102r$ can extend from the first main processing side $102t$ to the second main processing side $102b$.

The edge region $102r$ and the circuit region $102s$ can be connected to one another monolithically (e.g. integrally), for example.

The method may include, in $100b$: forming a stiffening structure $106$, which at least partly surrounds the at least one circuit region $102s$. The stiffening structure $106$ can be configured for stiffening the semiconductor wafer $102$, $202$. By way of example, the stiffening structure $106$ can have a thickness $106d$ (also referred to as vertical spatial extent $106d$) which is greater than a thickness $102d$ of the semiconductor wafer $102$ before the formation of the stiffening structure $106$ (e.g. the edge region $102r$) thereof. Alternatively or additionally, the stiffening structure $106$ can have a thickness $106d$ (more generally a vertical extent $106d$) which is greater than a thickness $104d$ of the circuit region $102s$.

Forming the stiffening structure $106$ may include joining together the stiffening structure $106$ and the edge region $102r$ of the first semiconductor wafer $102$, e.g. by means of a non-releasable connection (e.g. cohesively). In other words, a non-releasable connection can be formed between the stiffening structure $106$ and the edge region $102r$ of the second semiconductor wafer $102$, e.g. by means of anodic bonding or by means of laser beam welding. Alternatively, a releasable connection can be formed (e.g. if the stiffening structure $106$ is intended to be detached nondestructively again), as is described in greater detail below.

In accordance with various embodiments, the stiffening structure $106$ can have a greater vertical extent $106d$ (also referred to as thickness $106d$) than the circuit region $102s$ (e.g. transversely with respect to the first main processing side $102t$, i.e. transversely with respect to an interface between the stiffening structure $106$ and the circuit region $102s$).

In accordance with various embodiments, the stiffening structure $106$ can be extended along a closed path. By way of example, the stiffening structure $106$ can be formed in a ring-shaped fashion (also referred to as support ring $106$). Illustratively, the stiffening structure $106$ can be arranged on a front side $102t$ of the semiconductor wafer $102$ (e.g. including or formed from a front-side support ring $106$).

In accordance with various embodiments, the stiffening structure $106$ can have a thickness $106d$ of greater than approximately 200 µm (micrometers), e.g. greater than approximately 300 µm, e.g. greater than approximately 400 µm, e.g. greater than approximately 500 µm, e.g. greater than approximately 600 µm, e.g. greater than approximately 700 µm. Alternatively or additionally, the semiconductor wafer $102$ including the stiffening structure $106$ can have a thickness $106d$, $102d$ (i.e. the sum of thickness $106d$ and thickness $102d$) of greater than approximately 500 µm, e.g. greater than approximately 600 µm, e.g. greater than approximately 700 µm, e.g. greater than approximately 800 µm, e.g. greater than approximately 900 µm, e.g. greater than approximately 1000 µm.

In accordance with various embodiments, the stiffening structure $106$ can have a greater hardness than the semiconductor wafer $102$ (before the formation of the stiffening structure $106$), e.g. a greater hardness than the circuit region $102s$ thereof and/or the edge region $102r$ thereof. Alternatively or additionally, the stiffening structure $106$ can have a greater modulus of elasticity than the semiconductor wafer $102$ (before the formation of the stiffening structure $106$), e.g. a greater modulus of elasticity than the circuit region $102s$ thereof and/or the edge region $102r$ thereof.

Stiffening can be understood to mean that the semiconductor wafer $102$ after the formation of the stiffening structure 106 has a greater string constant than before the formation of the stiffening structure 106, e.g. vis à vis torsion or bending. In other words, a force (also referred to as restoring force) which counteracts a deformation of the semiconductor wafer 102, after the formation of the stiffening structure 106, can be greater than before the formation of the stiffening structure 106. By way of example, the spring constant and/or the restoring force can be at least approximately doubled, at least approximately tripled, at least approximately quadrupled, at least approximately increased fivefold or at least approximately increased tenfold by means of the formation of the stiffening structure 106.

The stiffening structure 106 can have a cutout 106a at least above part of the at least one circuit region 102s. The cutout 106a can expose the part of the circuit region 102s. In other words, the cutout 106a can extend through the stiffening structure 106. By way of example, the cutout 106a can be at least partly surrounded (i.e. partly or completely) by a section of the stiffening structure 106, e.g. by a ring-shaped section of the stiffening structure 106 (e.g. by a support ring 106).

In accordance with various embodiments, a coefficient of thermal expansion of the stiffening structure 106 can be in a range of approximately 50% to approximately 150% of a coefficient of thermal expansion of the circuit region 102s and/or of the edge region 102r, e.g. in a range of approximately 75% to approximately 125%, e.g. in a range of approximately 90% to approximately 110%. Thermally induced stresses can thus be reduced.

The method may include, in 100c: thinning the semiconductor wafer 102, including the stiffening structure 106, from the second main processing side 102b. The thickness 106d, 102d of the semiconductor wafer 102 (including the stiffening structure 106) can be reduced by means of thinning, e.g. over the entire lateral extent 106l of the semiconductor wafer 102, 202. By way of example, the circuit region 102s can be exposed by means of thinning. In general, thinning the semiconductor wafer 102, 202 may include removing material therefrom, e.g. from that main processing side of the semiconductor wafer 102, 202 which is processed by means of thinning.

Thinning may include at least partly removing the edge region 102r and/or the rear side of the semiconductor wafer 102, 202. Optionally, the edge region 102r can be left. A depression surrounded by the edge region 102r can then be formed by means of thinning. The edge region 102r can illustratively include or be formed from a rear-side support ring.

Alternatively or additionally, thinning can be carried out using a sacrificial layer (e.g. including a porous material, such as porous silicon, for example) at which separation is carried out, as is described in even greater detail below (cf. FIG. 19A).

The semiconductor wafers 102, 202 described below can be processed as in 100c.

FIG. 1D illustrates a semiconductor wafer 102 in accordance with various embodiments in a schematic plan view (e.g. looking at the first main processing side 102t) after the formation of the stiffening structure 106, e.g. before thinning and/or after thinning.

Optionally, the stiffening structure 106 can have a depression 106v surrounding the cutout 106a (cf. FIG. 17A to FIG. 17C). Alternatively or additionally, the circuit region 102s can be arranged at least partly in the depression 106v and/or be at least partly exposed by the latter.

In accordance with various embodiments, the stiffening structure 106 (or the cutout 106a) can have a greater lateral extent 106l than the circuit region 102s (i.e. than the lateral extent 104l thereof) (e.g. along the first main processing side 102t and/or transversely with respect to the first main processing side 102t).

FIG. 2A, FIG. 2B, FIG. 2C, FIG. 2D and FIG. 2E illustrate semiconductor wafers 102, 202 in a method in accordance with various embodiments in a schematic side view or cross-sectional view.

The method may include, in 200a, providing a first semiconductor wafer 102. The first semiconductor wafer 102 may include a first main processing side 102t and a second main processing side 102b. The second main processing side 102b and the first main processing side 102t can be mutually opposite sides of the first semiconductor wafer 102.

The method may include, in 200b: forming a stiffening structure 106, which at least partly surrounds the at least one circuit region 102s of the first semiconductor wafer 102. Forming the stiffening structure 106 may include joining together the stiffening structure 106 and the edge region 102r of the first semiconductor wafer 102, e.g. by means of a releasable connection (e.g. cohesively and optionally cohesively in a positively locking manner). In other words, a releasable connection can be formed between the stiffening structure 106 and the edge region 102r of the second semiconductor wafer 102, e.g. by means of an adhesive, e.g. by means of a thermosensitive adhesive.

The positively locking connection can optionally be provided by means of a depression 106v (cf. FIG. 17A to FIG. 17B). By way of example, the edge region 102r and the stiffening structure 106 can have mutually matching insertion sections and/or engage around one another.

The method may include, in 200c: processing the first semiconductor wafer 102. Processing may include at least one of the following: chemical processing (e.g. cleaning, doping, etching, implanting, reacting, etc.); thermal processing (e.g. irradiating, heating, cooling, melting, solidifying, etc.); and/or mechanical processing (e.g. machining, grinding, polishing, milling, sawing, dividing, etc.), e.g. subtractive processing (taking material away) or additive processing (adding material). Processing may include for example processing, e.g. chemically altering and/or eroding, the first main processing side 102t. Alternatively or additionally, processing may include processing, e.g. chemically altering and/or eroding, the second main processing side 102b. By way of example, processing may include thinning the first semiconductor wafer 102 by means of chemical processing and/or by means of mechanical processing (cf. FIG. 1C, for example).

In accordance with various embodiments, processing may include subtractive processing, such as dividing, eroding or machining, for example.

Eroding can be understood as a group of (thermal and/or chemical) processing processes which belong to the main group of separation. This group of processing processes, in contrast to machining or dividing, can separate individual workpiece layers or parts in a non-mechanical way. Eroding may include for example: thermal eroding (e.g. laser beam processing, plasma etching), chemical eroding (e.g. etching), electrochemical eroding (e.g. electroeroding).

Machining (also referred to as material removal) can be understood as a group of mechanical processing processes in which individual workpiece layers or parts are mechanically separated in the form of swarf. Machining can be understood as material-removing processing which is carried out by means of a geometrically undetermined cutting blade.

Dividing may include separating the semiconductor wafer 102 into a plurality of parts, e.g. without swarf formation, e.g. by means of cracking, by means of breaking and/or by means of cutting.

The method may include, in 200d: removing the stiffening structure 106 from the first semiconductor wafer 102. By way of example, removing may include releasing the stiffening structure 106 from the first semiconductor wafer 102, e.g. by releasing the releasable connection between the stiffening structure 106 and the edge region 102r of the semiconductor wafer 102.

The method may include, in 200e: stiffening a second semiconductor wafer 202 (also referred to as additional semiconductor wafer 102) by means of the stiffening structure 106 (e.g. as described above or below). Stiffening the second semiconductor wafer 202 may include joining together the stiffening structure 106 and the edge region 102r of the second semiconductor wafer 202, e.g. by means of a releasable connection (e.g. cohesively and optionally in a positively locking manner) or by means of a non-releasable connection. By way of example, a releasable connection can be formed between the stiffening structure 106 and the edge region 102r of the second semiconductor wafer 202, e.g. by means of an adhesive, e.g. by means of a thermosensitive adhesive.

The positively locking connection can optionally be provided by means of a depression 106v (cf. FIG. 17A to FIG. 17B). By way of example, the edge region 102r and the stiffening structure 106 may include mutually matching insertion sections and/or engage around one another.

FIG. 3A, FIG. 3B, FIG. 3C and FIG. 3D illustrate in each case a semiconductor wafer in a method in accordance with various embodiments, in a schematic side view or cross-sectional view, e.g. the first semiconductor wafer 102 and/or the second semiconductor wafer 202.

The method may include, in 300a, providing a semiconductor wafer 102, 202. The semiconductor wafer 102, 202 may include a first main processing side 102t and a second main processing side 102b. The second main processing side 102b and the first main processing side 102t can be mutually opposite sides of the semiconductor wafer 102, 202.

The method may include, in 300b: forming a protective cover 302 above the circuit region 102s. The protective cover 302 may include or be formed from the stiffening structure 106.

Optionally, forming the protective cover 302 may include, in 300c: forming a stiffening structure cover 306 above the circuit region 102s. In other words, the protective cover 302 may include or be formed from the stiffening structure 106 and a stiffening structure cover 306. Illustratively, the stiffening structure 106 may include or be formed from a spacer (e.g. a spacer ring) that defines a distance 106d (corresponds to the thickness 106d of the stiffening structure 106) between the stiffening structure cover 306 and the circuit region 102s of the semiconductor wafer 102.

In accordance with various embodiments, the stiffening structure cover 306 may include or be formed from a planar carrier, e.g. formed from a stiffening material, such as, for example, a metal, glass or silicon carbide. By way of example, the stiffening structure cover 306 can be or remain free of a polymer, for example from a coating therewith. Outgassing that might be caused by the polymer can thus be avoided. If the substances released by the outgassing do not constitute any impairment, the stiffening structure cover 306 may include or be formed from a polymer. In a similar manner, the stiffening structure cover 306 can be or remain free of a polymer, for example from a coating therewith, if a high temperature resistance (also referred to as thermal resistance) of the stiffening structure cover 306 is required. If no special requirements are made of the temperature resistance, the stiffening structure cover 306 may include or be formed from a polymer.

Forming the stiffening structure cover 306 may include joining together the stiffening structure 106 and the stiffening structure cover 306, e.g. by means of a releasable connection (e.g. in a positively locking manner and/or cohesively) and/or e.g. in a dust-tight fashion (e.g. in a vacuum-tight fashion). In other words, a releasable connection can be formed between the stiffening structure 106 and the stiffening structure cover 306, e.g. cohesively (e.g. by means of an adhesive, e.g. by means of a thermosensitive adhesive) or in a positively locking manner.

The positively locking connection may include a rotary closure, for example. By way of example, the stiffening structure cover 306 and the stiffening structure 106 may include mutually matching threads or engagement sections (e.g. for forming a plug-rotary closure, such as a bayonet closure, for example).

Alternatively or additionally, the connection can be imparted by means of a magnetic force. In other words, a magnetic connection can be provided. In order to form the magnetic connection, the stiffening structure cover 306 and/or the stiffening structure 106 may include a permanent magnet. Optionally, a ferromagnetic material can be used as an alternative or in addition to the permanent magnet of the stiffening structure cover 306 or the permanent magnet of the stiffening structure 106.

In accordance with various embodiments, the protective cover 302 at least above part of the circuit region 102s can have a cutout 106a (e.g. a depression and/or a through opening) which is open towards the circuit region 102s. By way of example, a cavity 106a can be formed between the protective cover 302 (e.g. between the stiffening structure cover 306 thereof) and the circuit region 102s. The cavity 106a can be closed at least on the first main processing side 102t, e.g. in a vacuum-tight fashion and/or in a dust-tight fashion.

In accordance with various embodiments, a coefficient of thermal expansion of the stiffening structure cover 306 can be in a range of approximately 50% to approximately 150% of a coefficient of thermal expansion of the circuit region 102s and/or of the edge region 102r, e.g. in a range of approximately 75% to approximately 125%, e.g. in a range of approximately 90% to approximately 110%. Thermally induced stresses can thus be reduced.

The method may include in 300d: processing the semiconductor wafer 102, including the protective cover 302, from the second main processing side 102b. Processing may include at least one of the following: chemical processing (e.g. cleaning, doping, etching, implanting, reacting, etc.); thermal processing (e.g. irradiating, heating, cooling, melting, solidifying, etc.); and/or mechanical processing (e.g. machining, grinding, polishing, milling, sawing, dividing, etc.). Processing may include for example processing, e.g. chemically altering and/or eroding, the first main processing side 102t. Alternatively or additionally, processing may include processing, e.g. chemically altering and/or eroding, the second main processing side 102b. By way of example, processing may include thinning the first semiconductor wafer 102 by means of chemical processing and/or by means of mechanical processing (cf. FIG. 1C, for example). Alternatively or additionally, processing may include depositing one or a plurality of layers (if required). Processing the semiconductor wafer 102, including the protective cover 302, can be required e.g. when grinding the semiconductor wafer 102 if e.g. contamination of the circuit region with grinding residues is intended to be prevented. Optionally, the protective cover 302 can be removed after grinding, and the semiconductor wafer 102 can be processed further without a protective cover 302 (illustratively, the protective cover 302 can be optional after thinning).

Figure 4A:
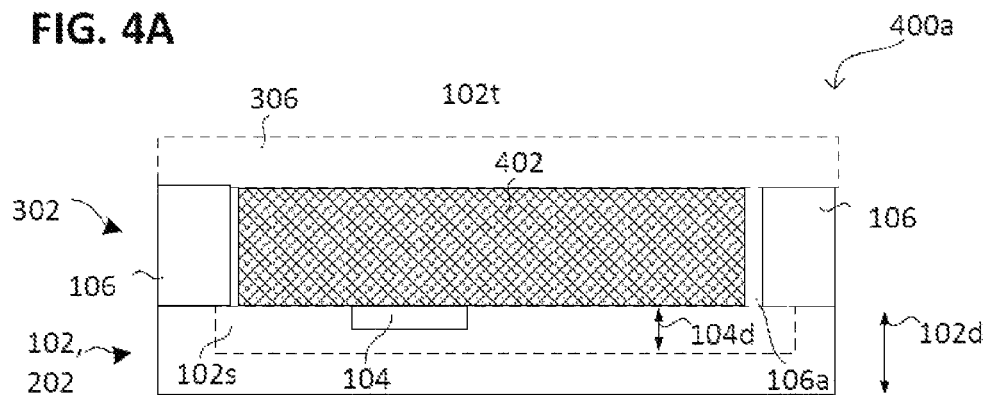
FIGS. 4A to 4C in each case show a semiconductor wafer in a method in accordance with various embodiments in a schematic side view or cross-sectional view.
Figure 4B:
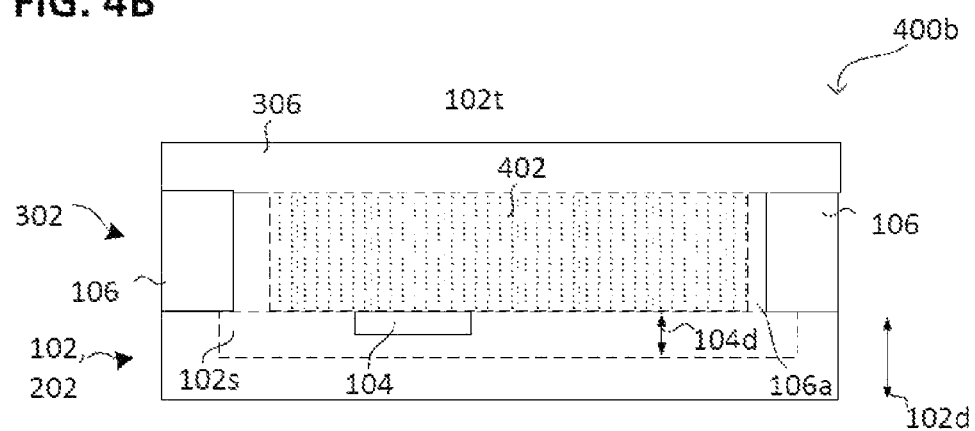
Figure 4C:
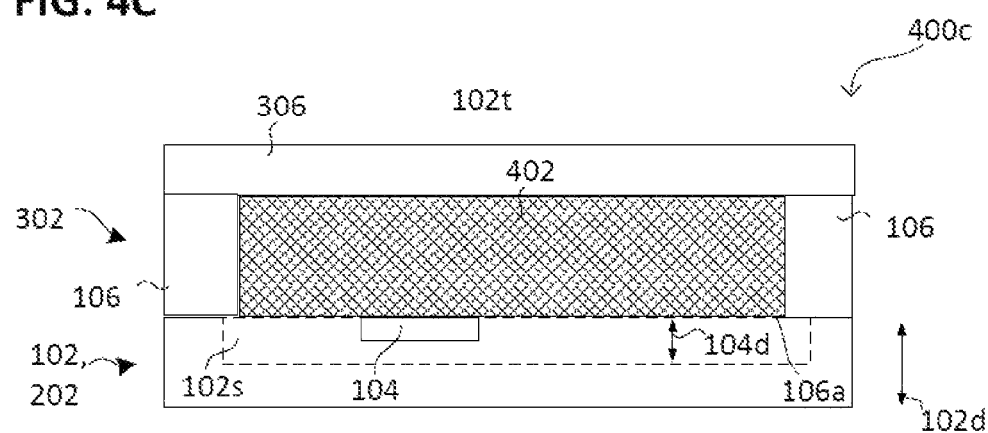

FIG. 4A, FIG. 4B and FIG. 4C illustrate in each case a semiconductor wafer 102, 202 in a method in accordance with various embodiments in a schematic side view or cross-sectional view, e.g. the first semiconductor wafer 102 and/or the second semiconductor wafer 202.

The semiconductor wafer 102, 202 may include the stiffening structure 106 and optionally the stiffening structure cover 306, which are arranged above the circuit region 102s. The stiffening structure 106 and optionally the stiffening structure cover 306 can for example be part of the protective cover 302 or form the latter.

The method may include, in 400a: forming a filling body 402 in the cutout 106a. The filling body 402 can be in physical contact with the circuit region 102s or at least with at least one electronic circuit 104. In general, the filling body 402 can at least partly fill (i.e. partly or completely) the cutout 106a.

The stiffening structure 106 can illustratively serve as a sleeve that receives the filling body 402.

In accordance with various embodiments, the filling body 402 may include or be formed from at least one material 402m of the following materials: a metal; a transition metal, an oxide (e.g. a metal oxide or a transition metal oxide); a dielectric; a polymer (e.g. a carbon-based polymer or a silicon-based polymer); a ceramic (e.g. an oxynitride; a nitride; a carbide and/or a glass or vitreous material); a semimetal (e.g. carbon); a semiconductor; a semiconductor oxide; a semi-organic material, and/or an organic material.

By way of example, the filling body 402 may include or be formed from a plastic, e.g. a polymer (e.g. a carbon-based polymer or a silicon-based polymer). By way of example, the filling body 402 may include or be formed from a composite material. The composite material may include or be formed from a matrix and a filling material. The filling material can be a fibrous material, e.g. a glass fibre, a carbon fibre or a natural fibre. The matrix may include or be formed from the plastic, e.g. an epoxy resin. Alternatively or additionally, the filling material may include or be formed from a gas or a fluid (e.g. if the filling body 402 has pores 402p). By way of example, the pores 402p can be embedded into a matrix composed of plastic or metal. By way of example, the plastic may include or be formed from a thermoplastic or a thermosetting plastic, e.g. a lacquer, a potting material (e.g. potting resin) and/or a resin (e.g. a synthetic resin). The plastic can enable less expensive production and/or can be introduced into the cutout 106a in a liquid state, as described in greater detail below.

Alternatively or additionally, the filling body 402 may include or be formed from a ceramic or a metal (e.g. if the filling body 402 is introduced into the cutout 106a in a preconfigured fashion). This can enable a high thermal stability of the filling body 402. By way of example, the filling body 402 may include or be formed from a metal foam. Alternatively or additionally, the filling body 402 may include or be formed from a fibre tangle, e.g. composed of glass fibres.

In accordance with various embodiments, the filling body 402 can have a thermal stability of approximately 150° C. or more, e.g. of approximately 500° C. or more, e.g. of approximately 600° C. or more, e.g. of approximately 700° C. or more, e.g. of approximately 800° C. or more, e.g. of approximately 900° C. or more. The thermal stability of the filling body 402 can facilitate the processing of the semiconductor wafer 102, e.g. if the latter is brought to a high temperature, e.g. to 400° C. or more for activating a dopant or to 900° C. or more for heat treating the semiconductor wafer 102. The thermal stability in connection with a temperature can be understood to mean that the filling body 402 (or the material 402m thereof) is chemically stable at least up to the temperature, i.e. exhibits substantially no structural or chemical alterations, e.g. no phase transitions and/or no chemical reaction with another material (e.g. no oxidation).

In accordance with various embodiments, the filling body 402 can have a lower adhesion (e.g. no adhesion) to the circuit region 102s or at least to the at least one electronic circuit 104 than the stiffening structure 106 to the edge region 102r. In other words, the filling body 402 can exhibit a lower (e.g. substantially no) promotion of adhesion to the circuit region 102s or at least to the at least one electronic circuit 104 in comparison with the promotion of adhesion to the edge region 102r by the stiffening structure 106. By way of example, the interface between the filling body 402 and the circuit region 102s or at least to the at least one electronic circuit 104 can be free of a connection (e.g. an adhesive connection). By way of example, the filling body 402 can be plugged (e.g. connected in a force-locking manner), inserted (e.g. loosely) or cast into the cutout 106a. In contrast, the stiffening structure 106 can be connected to the edge region 102r. The filling body 402 can be brought into physical contact with the circuit region 102s.

In accordance with various embodiments, a force of adhesion of the filling body 402 to the circuit region 102s can be less than a weight force of the filling body 402, e.g. less than approximately 50% of the weight force of the filling body 402, e.g. less than approximately 25% of the weight force of the filling body 402. What can thus be achieved is that the filling body 402 exerts as little force as possible on the circuit region 102s and/or can be removed more easily.

Optionally, the filling body 402 can be at a distance from the stiffening structure 106 or a gap can be formed between them at least in sections, e.g. if this has a smaller lateral extent than the cutout 106a. This can facilitate arranging the filling body 402 in the cutout 106a, e.g. if the filling body 402 is inserted into the cutout 106a (e.g. in a preconfigured manner). By way of example, the gap can enable ventilation if the filling body 402 is joined together with the stiffening structure 106 and/or they are arranged jointly above the circuit region 102s.

Alternatively or additionally, the filling body 402 can be in physical contact with the stiffening structure 106, e.g. at least in sections; by way of example, the filling body 402 can be configured with an accurate fit with respect to the cutout 106a (for example if the filling body 402 and the stiffening structure 106 are connected to one another). This can facilitate accurate arrangement and/or can manifest a protective effect against dust. In other words, the stiffening structure 106 and the filling body 402 can be part of the protective cover 302 or form the latter. Optionally, the stiffening structure cover 306 can be dispensed with if the accurately fitting (e.g. dust-tight) filling body 402 is used.

The filling body 402 and the stiffening structure 106 can differ from one another in at least their chemical composition, their porosity, their hardness and/or their modulus of elasticity.

Optionally, the stiffening structure cover 306 can be dispensed with if the filling body 402 is used.

Optionally, the method may include, in 400a: processing the semiconductor wafer 102, including the protective cover 302, from the second main processing side 102b, e.g. analogously to the processing in 300d.

Alternatively or additionally, the method may include, in 400b: forming the stiffening structure cover 306 above the cutout 106a, e.g. if the semiconductor wafer 102 does not yet include a stiffening structure cover 306. Optionally, the filling body 402 can be dispensed with if the stiffening structure cover 306 is used. Likewise, the filling body 402 can be dispensed with if the subsequent processing (e.g. thinning) of the semiconductor wafer 102, 202 is carried out only by means of etching (illustratively, this results in a lower mechanical loading than in the case of mechanical processing).

The stiffening structure 106 can be arranged between the stiffening structure cover 306 and the circuit region 102s. Optionally, the stiffening structure 106 and the stiffening structure cover 306 can be joined together, e.g. connected to one another, e.g. if they are arranged jointly (i.e. connected as a unit) above the circuit region 102s.

By way of example, the method may include, in 400c: forming the filling body 402 in the cutout 106a and the stiffening structure cover 306 above the cutout 106a and above the filling body 402. The filling body 402 can be brought into physical contact with the stiffening structure cover 306 and/or with the circuit region 102s.

Forming the stiffening structure cover 306 can optionally be carried out after forming the filling body 402, e.g. if the filling body 402 is introduced, e.g. inserted (e.g. loosely) or plugged (e.g. connected in a force-locking manner), into the cutout 106a in a preconfigured manner (i.e. in a solid state). The filling body 402 can then be covered by means of the stiffening structure cover 306.

Forming the stiffening structure cover 306 can be carried out before forming the filling body 402, e.g. if the material 402m of the filling body 402 is introduced, e.g. injected (e.g. by means of a nozzle), into the cutout 106a in a fluid (e.g. liquid) state. A cavity 106a can then be filled by means of the filling body 402.

In general, the filling body 402 can at least partly fill the cutout 106a. By way of example, a gap can be formed between the stiffening structure 106 and the filling body 402 and/or they can be formed in physical contact with one another (e.g. if the filling body 402 is configured with an accurate fit with respect to the cutout 106a).

In accordance with various embodiments, the filling body 402 can have a lower modulus of elasticity than the stiffening structure 106, than the circuit region 102s and/or than the stiffening structure cover 306 (or the material thereof), e.g. with approximately half the magnitude or less, e.g. with approximately one quarter of the magnitude or less, e.g. with approximately one tenth of the magnitude or less.

Alternatively or additionally, the filling body 402 can have a lower bulk modulus than the stiffening structure 106, than the circuit region 102s and/or than the stiffening structure cover 306 (or the material thereof), e.g. with approximately half the magnitude or less, e.g. with approximately one quarter of the magnitude or less, e.g. with approximately one tenth of the magnitude or less.

Alternatively or additionally, the filling body 402 (or the material 402m thereof) can have a lower shear strength than the stiffening structure 106, than the circuit region 102s and/or than the stiffening structure cover 306 (or the material thereof), e.g. with approximately half the magnitude or less, e.g. with approximately one quarter of the magnitude or less, e.g. with approximately one tenth of the magnitude or less.

Alternatively or additionally, the material 402m of the filling body 402 (e.g. if it is introduced into the cutout 106a in a fluid state) can have a lower viscosity than the stiffening structure 106, than the circuit region 102s and/or than the stiffening structure cover 306 (or the material thereof), e.g. with approximately half the magnitude or less, e.g. with approximately one quarter of the magnitude or less, e.g. with approximately one tenth of the magnitude or less, e.g. with approximately one hundredth of the magnitude or less, e.g. with approximately one thousandth of the magnitude or less.

Alternatively or additionally, the filling body 402 (or the material 402m thereof) can have a lower density (e.g. averaged spatially over the filling body 402) than the stiffening structure 106, than the circuit region 102s and/or than the stiffening structure cover 306 (or the material thereof), e.g. with approximately half the magnitude or less, e.g. with approximately one quarter of the magnitude or less, e.g. with approximately one tenth of the magnitude or less.

Alternatively or additionally, the filling body 402 (or the material 402m thereof) can have a lower hardness than the stiffening structure 106, than the circuit region 102s and/or than the stiffening structure cover 306 (or the material thereof), e.g. with approximately half the magnitude or less, e.g. with approximately one quarter of the magnitude or less, e.g. with approximately one tenth of the magnitude or less.

Alternatively or additionally, the filling body 402 (or the material 402m thereof) can have a greater porosity than the stiffening structure 106, than the circuit region 102s and/or than the stiffening structure cover 306 (or the material thereof), e.g. with approximately double the magnitude or more, e.g. with approximately quadruple the magnitude or more, e.g. with approximately ten times the magnitude or more.

Figure 5A:
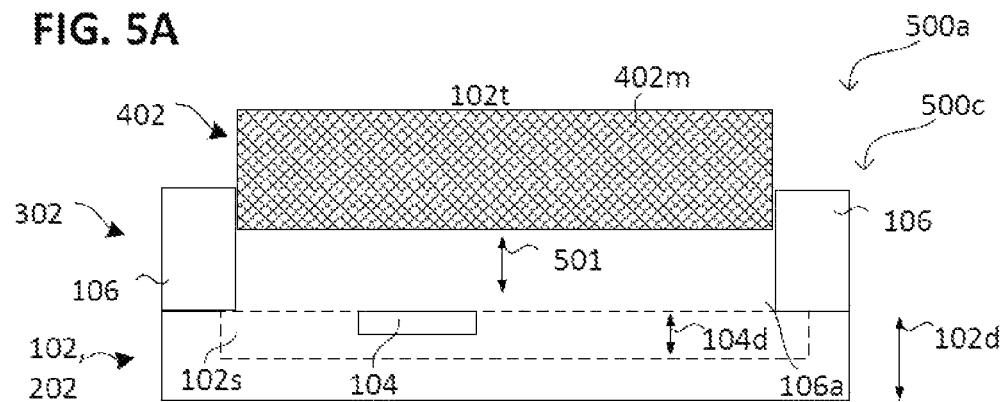
FIGS. 5A to 5C in each case show a semiconductor wafer in a method in accordance with various embodiments in a schematic side view or cross-sectional view.
Figure 5B:
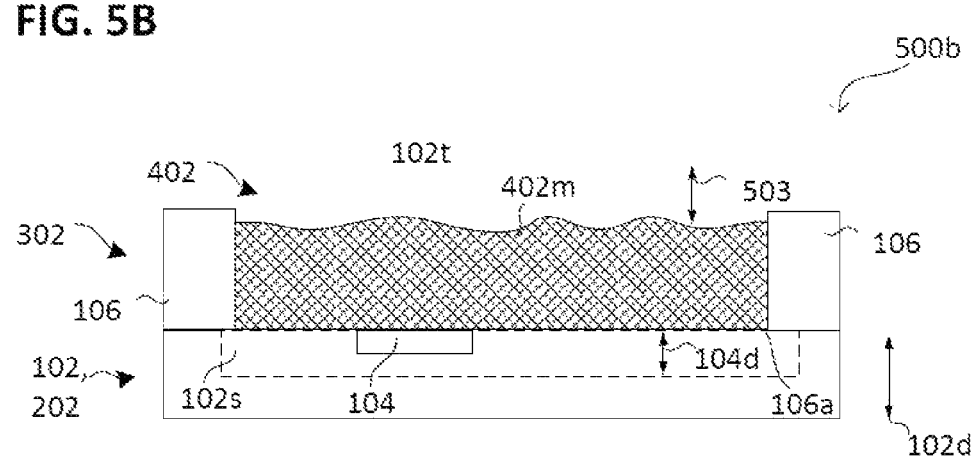
Figure 5C:
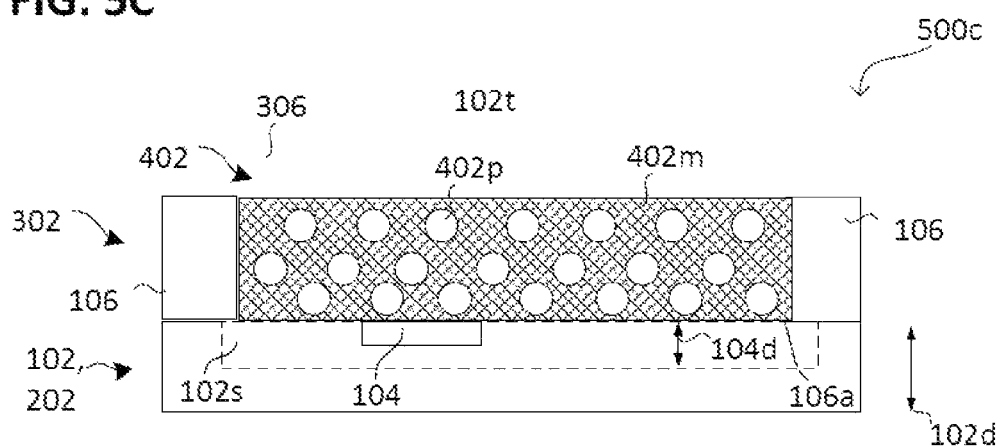

FIG. 5A, FIG. 5B and FIG. 5C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 500a, for the purpose of forming the filling body 402, inserting 501 a solid material 402m into the cutout 106a, e.g. a preconfigured filling body 402. Forming the filling body 402 can be carried out in 500a while the semiconductor wafer 102, 202 includes the stiffening structure 106 or alternatively jointly with the stiffening structure 106. Forming the filling body 402 can be carried out in 500a before processing (e.g. thinning) the semiconductor wafer 102, 202.

Alternatively or additionally, the method may include, in 500a, for the purpose of removing the filling body 402, extracting 501 a solid material 402m from the cutout 106a, e.g. the preconfigured filling body 402. Removing the filling body 402 can be carried out while the semiconductor wafer 102, 202 includes the stiffening structure 106 or alternatively jointly with the stiffening structure 106. Removing the filling body 402 can be carried out in 500a after processing (e.g. thinning) the semiconductor wafer 102, 202. The removed filling body 402 can optionally be used for stiffening an additional semiconductor wafer, e.g. jointly with the stiffening structure 106 (e.g. if the latter is removed nondestructively).

In accordance with various embodiments, removing the filling body 402 can be carried out without residues.

The method may include, in 500b, for the purpose of forming the filling body 402, introducing 503, e.g. injecting (e.g. by means of a nozzle), a viscous material 402m (i.e. in a fluid state) into the cutout 106a. Afterwards, for the purpose of forming the filling body 402, the viscous material 402m in the cutout 106a can be solidified, e.g. by its temperature being lowered and/or by its curing (for example if the viscous material 402m includes a plastic and/or a solvent). Forming the filling body 402 can be carried out in 500b while the semiconductor wafer 102, 202 includes the stiffening structure 106. The solidified material 402m can form the filling body 402. An adhesion during the curing of the viscous material 402m can be prevented, for example, if the viscous material 402m differs chemically from the circuit region 102s, no chemical reaction or wetting takes place between them and/or by using a separating layer between them, as described in even greater detail below.

By way of example, adhesion during the curing of the viscous material 402m can be prevented if the viscous material 402m wets the circuit region 102s only poorly or not at all, i.e. if the cohesion force of the viscous material 402m (within the latter) is greater than the adhesion force vis-à-vis the circuit region 102s.

The method can alternatively or additionally include, in 500b, for the purpose of removing the filling body 402, converting the material 402m of the filling body 402 into a fluid state (liquefying it), e.g. melting it, evaporating it, incinerating it or dissolving it by means of a solvent (e.g. if the material 402m includes a plastic). Removing 503 the filling body 402 can be carried out in 500b while the semiconductor wafer 102, 202 includes the stiffening structure 106 and/or after the latter has been removed. Extracting the material 402 from the cutout 106a can facilitate reusing the stiffening structure 106 and/or the stiffening structure cover 306. Removing the filling body 402 from the cutout 106a can be carried out, for example, after the removal of the stiffening structure 106 from the semiconductor wafer 102, 202.

By way of example, the filling body 402 may include or be formed from a material 402m having a melting point of 200° C. or less, e.g. an animal or vegetable polymer and/or a wax (e.g. an animal, vegetable or synthetic wax). This can facilitate converting the material 402m of the filling body 402 between a fluid state and a solid state (e.g. melting and solidifying).

The method may include, in 500c, for the purpose of forming the filling body 402, forming a multiplicity of pores 402p, e.g. a network of interconnected pores 402p (also referred to as open-pored). In other words, the method may include, in 500b, forming a porous filling body 402. The porous filling body 402 may include a multiplicity of pores 402p, e.g. a network of interconnected pores 402p.

In 500c, the pores can be formed in the cutout 106a, e.g. by the material 402m of the filling body 402 being relaxed. Alternatively, the method may include, in 500c, inserting a filling body 402 including the multiplicity of pores 402p (e.g. in a preconfigured manner) in the cutout 106a. The porous filling body 402 may include a multiplicity of pores 402p, e.g. a network of interconnected pores 402p.

The porosity (also referred to as void proportion) can be understood as a dimensionless variable which describes the ratio of void volume to total volume of a material or of a structure (e.g. of the filling body 402). A fluid material (e.g. a gas or a liquid) can be arranged in the pores 402p, e.g. in a manner filling the latter. The porosity can be understood as a spatially averaged variable, e.g. averaged over a region, a material or a structure (e.g. a body). In accordance with various embodiments, the porosity can be the product of a spatial density of the pores 402p and their average size.

In accordance with various embodiments, a porous material, a porous region or a porous structure (e.g. a porous body, e.g. the filling body 402) can be understood as having a porosity in a range of approximately 5% to approximately 95%, e.g. in a range of approximately 10% to approximately 90%. The density of a porous material, of a porous region or of a porous structure (e.g. of the filling body 402) can be understood to mean that the pores 402p are taken into account in the density, that is to say that the density is averaged spatially over the solid material and the pores. The greater the porosity, the lower the density can be.

Forming the pores 402p may include arranging a viscous material 402m in the cutout 106a and foaming the viscous material 402m in the cutout 106a. Foaming may include expanding (i.e. relaxing) a gas arranged in the material 402m, e.g. by reducing the pressure of the viscous material 402m. Afterwards, the material 402m can be converted to a solid state and thus form the solid matrix of a foam.

Figure 6A:
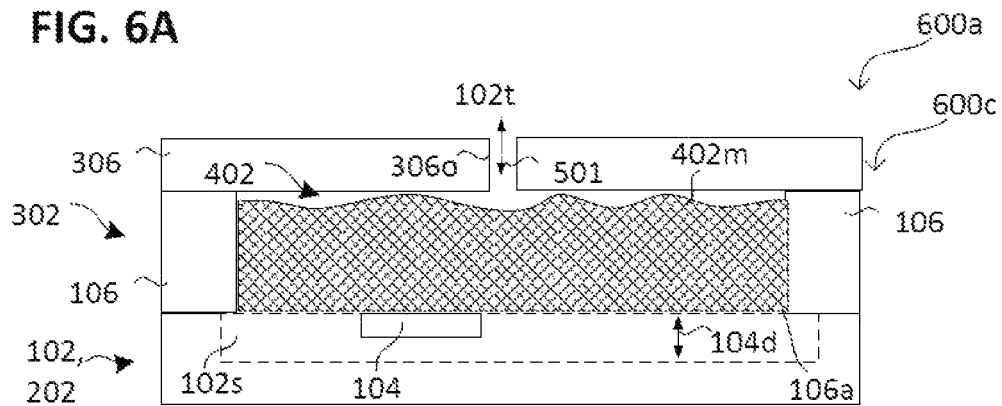
FIGS. 6A to 6C in each case show a semiconductor wafer in a method in accordance with various embodiments in a schematic side view or cross-sectional view.
Figure 6B:
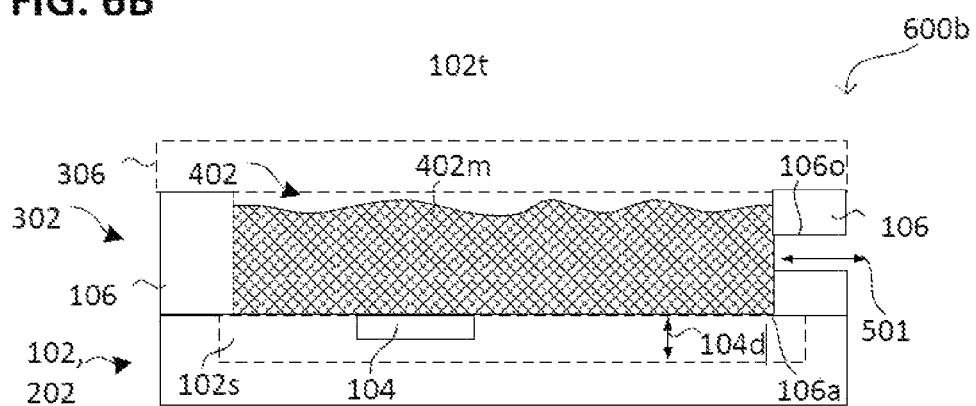
Figure 6C:
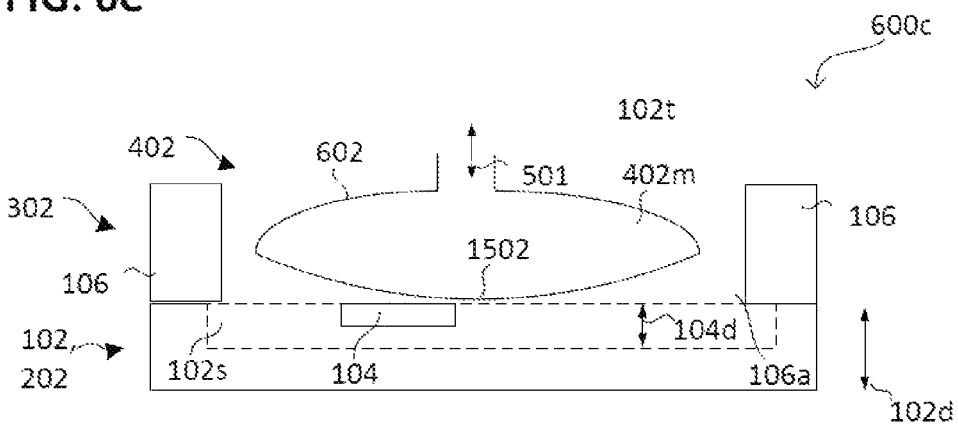

FIG. 6A, FIG. 6B and FIG. 6C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 600a, for the purpose of forming the filling body 402, introducing 501 the material 402m (e.g. in a fluid state, i.e. including a gas and/or a liquid) through an opening 306o of the stiffening structure cover 306 into the cutout 106a. The method can optionally include, in 600a, forming the opening 306o in the stiffening structure cover 306, e.g. before the material 402m is introduced 501 into the cutout 106a. Alternatively or additionally, the method can optionally include, in 600a, closing the opening 306o of the stiffening structure cover 306, e.g. after the material 402m is introduced 501 into the cutout 106a. Forming the opening 306o can be carried out by removing part of the stiffening structure cover 306, e.g. by means of etching or by means of a laser. Closing the opening 306o can be carried out e.g. by means of the material 402m, e.g. by the latter being solidified at or in the opening 306o (that is to say that a closure is formed by means of the material 402m). Alternatively, some other closure can be used. Introducing the material 402m into the cutout 106a can be carried out before the semiconductor wafer 102, 202 is processed (e.g. thinned).

Alternatively or additionally, the method may include, in 600a, for the purpose of removing the filling body 402, extracting 501 the material 402m (in a fluid state) from the cutout 106a through an opening 306o of the stiffening structure cover 306. By way of example, the material 402m can be liquefied beforehand. The method can optionally include, in 600a, forming the opening 306o in the stiffening structure cover 306, e.g. before the material 402m is extracted 501 from the cutout 106a. Alternatively or additionally, the method can optionally include, in 600a, closing the opening 306o of the stiffening structure cover 306, e.g. after the material 402m is extracted 501 from the cutout 106a. Forming the opening 306o can be carried out by removing a closure of the stiffening structure cover 306, e.g. by means of etching, by means of a solvent or by means of a laser. Closing the opening 306o can be carried out e.g. by means of the material 402m, e.g. by the latter being solidified at or in the opening 306o (that is to say that a closure is formed by means of the material 402m). Alternatively, some other closure can be used. Extracting the material 402m from the cutout 106a can be carried out after the semiconductor wafer 102, 202 is processed (e.g. thinned). Extracting the material 402m from the cutout 106a can facilitate reusing the stiffening structure 106 and/or the stiffening structure cover 306. Removing the filling body 402 from the cutout 106a can be carried out for example after the removal of the stiffening structure 106 from the semiconductor wafer 102.

The method may include, in 600b, for the purpose of forming the filling body 402, introducing 501 the material 402m (e.g. in a fluid state, i.e. including a gas and/or a liquid) through an opening 106o of the stiffening structure 106 into the cutout 106a. The method can optionally include, in 600b, forming the opening 106o in the stiffening structure 106, e.g. before the material 402m is introduced 501 into the cutout 106a. The opening 106o can extend away from the cutout 106a through a section of the stiffening structure 106 (also referred to as through opening 106o). Introducing the material 402m into the cutout 106a can be carried out before the semiconductor wafer 102, 202 is processed (e.g. thinned).

Forming the opening 106o can be carried out by removing part of the stiffening structure 106, e.g. by means of mechanical eroding, etching or by means of a laser.

Optionally, the method may include, in 600b, closing the opening 106o of the stiffening structure 106, e.g. after the material 402m is introduced 501 into the cutout 106a. Closing the opening 106o can be carried out e.g. by means of the material 402m, e.g. by the latter being solidified at or in the opening 106o (that is to say that a closure is formed by means of the material 402m). Alternatively, some other closure can be used.

Alternatively or additionally, the method may include, in 600b, for the purpose of removing the filling body 402, extracting 501 the material 402m (in a fluid state) from the cutout 106a through an opening 106o of the stiffening structure 106. The method can optionally include, in 600b, forming the opening 106o in the stiffening structure 106, e.g. before the material 402m is extracted 501 from the cutout 106a. Forming the opening 106o can be carried out by removing a closure of the stiffening structure 106, e.g. by means of etching, by means of a solvent or by means of a laser. Extracting the material 402m from the cutout 106a can be carried out after the semiconductor wafer 102, 202 is processed. Extracting the material 402m from the cutout 106a can facilitate reusing the stiffening structure 106 and/or the stiffening structure cover 306. Removing the filling body 402 from the cutout 106a can be carried out for example after the removal of the stiffening structure 106 from the semiconductor wafer 102.

Optionally, the method may include, in 600b, closing the opening 106o of the stiffening structure 106, e.g. after the material 402m is extracted 501 from the cutout 106a. Closing the opening 106o can be carried out e.g. by means of the material 402m, e.g. by the latter being solidified at or in the opening 306o (that is to say that a closure is formed by means of the material 402m). Alternatively, some other closure can be used.

In accordance with various embodiments, the opening 106o can be formed in the form of a channel. A channel can be understood as a through opening that is completely surrounded by a circumferential wall of the stiffening structure 106. Illustratively, the channel may include side walls, a top wall and a bottom wall (i.e. can illustratively be a tunnel).

The channel can optionally have a cross section (cut transversely with respect to a direction away from the cutout 106a) which increases or decreases in a direction away from the cutout 106a (e.g. in a funnel-shaped fashion). By way of example, the cross section (e.g. the width and/or height of the channel) can decrease in the direction away from the cutout 106a. It is thus possible to attain a large outlet region at the cutout 106a, which can facilitate the introducing and/or extracting. Alternatively, the cross section (e.g. the width and/or height of the channel) can increase in the direction away from the cutout 106a. The largest possible cross section of the stiffening structure 106 can thus be maintained, which increases the stiffening effect thereof.

The method may include, in 600c, for the purpose of forming the filling body 402, introducing 501, e.g. inserting, a deformable sleeve 602 into the cutout 106a. Afterwards, the deformable sleeve 602 can be deformed by means of the material 402m, e.g. by the material 402m (e.g. in the fluid state) being introduced into the deformable sleeve 602 and/or by a material 402m arranged in the deformable sleeve 602 being converted into a gaseous state, e.g. by means of evaporation of the material 402m. The material 402m may include or be formed from, for example, a readily volatile material 402m, e.g. having a boiling point of less than 200° C. (e.g. a hydrocarbon).

Optionally, the material 402m in the deformable sleeve 602 can be converted to a solid state (also referred to as solidifying) (e.g. before the semiconductor wafer 102, 202 is processed), e.g. by means of the material 402m being solidified. By way of example, the material 402m may include or be formed from an (e.g. synthetic, animal or vegetable) polymer and/or an (e.g. animal, vegetable or synthetic) wax.

Optionally, the stiffening structure cover 306 can be arranged above the cutout 106a, e.g. before or during the deformation of the deformable sleeve 602 or alternatively after the sleeve 602 has been deformed.

The method can alternatively or additionally include, in 600c, for the purpose of removing the filling body 402, extracting 501 the deformable sleeve 602 from the cutout 106a. Optionally, before extracting the deformable sleeve 602, it is possible to extract the material 402m from the deformable sleeve 602, e.g. through an opening of the deformable sleeve 602.

The deformable sleeve 602 may include or be formed from a plastic, e.g. an elastomer or a thermoplastic. By way of example, deforming the deformable sleeve 602 may include elastically or plastically stretching the latter (e.g. the elastomer thereof). Elastic stretching can be understood to mean that the deformable sleeve 602 can return to its original state. By way of example, the deformable sleeve 602 may include or be formed from an elastomer.

In accordance with various embodiments, the deformable sleeve 602 can provide a separating layer 1502, which separates the material 402m from the circuit region 102s, and thus illustratively prevents physical contact between the two and/or prevents the two from being adhesively bonded to one another.

In order illustratively to increase the stiffening effect, the material 402m in the deformable sleeve 602 can optionally have a pressure greater than outside the deformable sleeve 602. Alternatively, the material 402m in the deformable sleeve 602 can be solidified, e.g. before the processing of the semiconductor wafer 102, 202.

FIG. 7A, FIG. 7B and FIG. 7C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 700a, adapting the filling body 402 to a topography of the circuit region 102s or at least to a topography of the at least one electronic circuit 104. Adapting may include, in 700a, bringing the material 402m in a fluid state into physical contact with the circuit region 102s or at least with the at least one electronic circuit 104. Alternatively or additionally, adapting may include, in 700a, solidifying (e.g. curing) the material 402m of the filling body 402 while said material is in physical contact with the circuit region 102s or at least with the at least one electronic circuit 104.

The method may include, in 700b, adapting the filling body 402 to a topography of the circuit region 102s or at least to a topography of the at least one electronic circuit 104. Adapting may include, in 700b, reducing a number of pores 402p of the filling body 402 by the filling body 402 being brought into physical contact with the circuit region 102s or at least with the at least one electronic circuit 104. Illustratively, the voids or their walls, which are provided by means of the pores 402p, can be pressed in. Adapting can be carried out, for example, by transmitting a force to the filling body 402 which presses the latter against the circuit region 102s or at least against the at least one electronic circuit 104.

By way of example, the filling body 402 may include or be formed from a solid foam that includes or is formed from a polymer, e.g. synthetic resin or Teflon. In other words, the foam may include or be formed from a polymer foam, e.g. a synthetic resin foam and/or a Teflon foam.

The method may include, in 700c, adapting the filling body 402 to a topography of the circuit region 102s or at least to a topography of the at least one electronic circuit 104. Adapting may include, in 700c, bringing a separating layer 1502, e.g. the deformable sleeve 602, into physical contact with the circuit region 102s or at least with the at least one electronic circuit 104, e.g. by deforming it. Adapting may include, in 700c, spreading the separating layer 1502, e.g. the deformable sleeve 602, over the circuit region 102s or at least over the at least one electronic circuit 104.

Figure 8A:
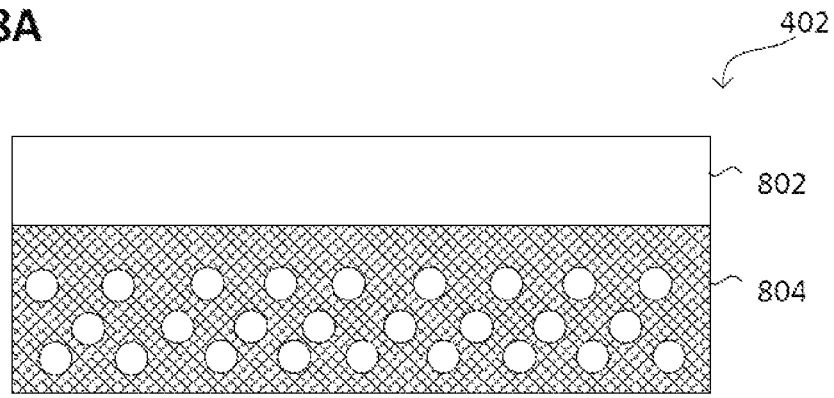
FIG. 8A shows a filling body in a method in accordance with various embodiments in a schematic side view or cross-sectional view.

FIG. 8A illustrates a filling body 402 in a method in accordance with various embodiments in a schematic side view or cross-sectional view.

In accordance with various embodiments, the filling body 402 may include or be formed from a laminate. The laminate may include or be formed from a plurality of (two or more) layers 802, 804. The plurality of layers 802, 804 can be connected to one another, e.g. monolithically or cohesively (e.g. in an adhesively bonded manner). The laminate can increase a stiffening effect without increasing the mechanical loading on the circuit region 102s.

A first layer 802 of the laminate can have a lower porosity than a second layer 804 of the laminate. The second layer 804 of the laminate can be brought into physical contact with the circuit region 102s or at least with the at least one electronic circuit 104. Illustratively, the first layer 802 can be a carrier layer and the second layer 804 can be a sacrificial layer.

By way of example, the first layer 802 may include or be formed from a material of the following materials: a metal; a transition metal, an oxide (e.g. a metal oxide or a transition metal oxide); a dielectric; a polymer (e.g. a carbon-based polymer or a silicon-based polymer); a ceramic (e.g. an oxynitride; a nitride; a carbide and/or a glass or vitreous material); a semimetal (e.g. carbon); a semiconductor; a semiconductor oxide; a semi-organic material, and/or an organic material.

Figure 8B:
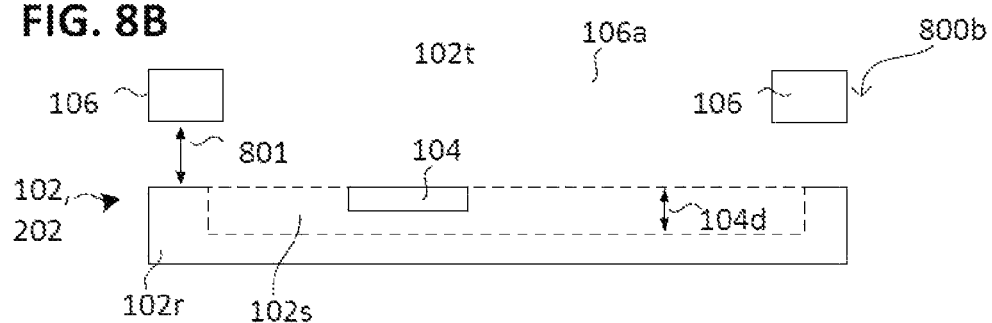
FIGS. 8B and 8C in each case show a semiconductor wafer in a method in accordance with various embodiments in a schematic side view or cross-sectional view.
Figure 8C:
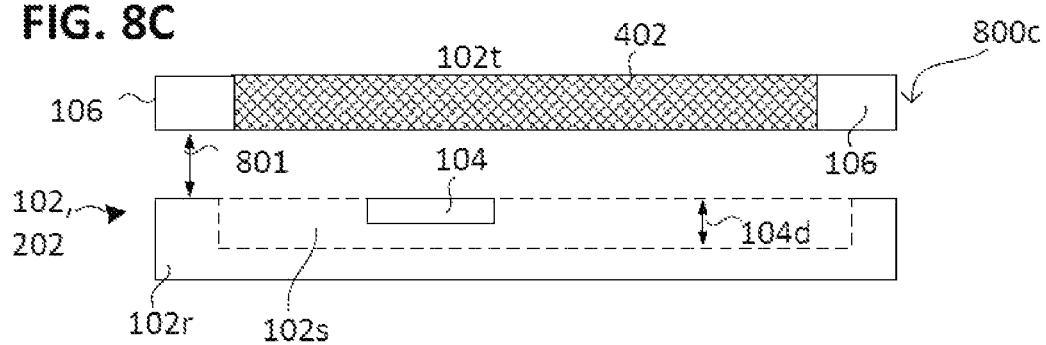

FIG. 8B and FIG. 8C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 800b, for the purpose of forming the stiffening structure 106, joining together 801 the stiffening structure 106 with the circuit region 102s and/or with the edge region 102r. Joining together 801 may include connecting the stiffening structure 106 at least to the edge region 102r, e.g. cohesively and/or in a positively locking manner. Cohesive connection can be carried out by means of an adhesive, by means of anodic bonding and/or by means of laser beam welding. Anodic bonding and/or laser beam welding can enable a connection having a thermal stability of approximately 400° C. or more, e.g. of approximately 500° C. or more, e.g. of approximately 600° C. or more, e.g. of approximately 700° C. or more, e.g. of approximately 800° C. or more, e.g. of approximately 900° C. or more. Adhesive bonding can enable a releasable connection. By way of example, adhesive bonding can be carried out by means of a light-sensitive adhesive and/or by means of a thermosensitive adhesive. In other words, the adhesive can be configured either for curing and/or for separating by means of light or by means of thermal energy.

The method can alternatively or additionally include, in 800b, for the purpose of removing the stiffening structure 106, separating 801 the latter from the edge region 102r, e.g. if they are releasably connected to one another. Separating 801 can be carried out nondestructively, e.g. if they are releasably connected to one another. By way of example, separating 801 the connection between the stiffening structure 106 and the edge region 102r can be carried out by the adhesive (e.g. a light-sensitive adhesive and/or a thermosensitive adhesive) being released, at least by means of light (e.g. infrared and/or ultraviolet light) or by means of thermal energy. Nondestructive separating 801 can enable and/or facilitate reuse of the stiffening structure 106.

If the stiffening structure 106 and the edge region 102r are non-releasably connected to one another, separating 801 can be carried out by these being mechanically processed (e.g. by the semiconductor wafers 102, 202 being divided), e.g. by means of cracking, breaking, splitting, cutting, etc. If the stiffening structure 106 is intended to be reused, separating 801 can be carried out by the edge region 102r being divided. Optionally, that part of the edge region 102r which remains at the stiffening structure 106 can subsequently be removed, e.g. chemically (e.g. by means of etching) or mechanically (by means of grinding). By way of example, the chemical removal of the remaining part of the edge region 102r can be facilitated if the latter differs from the stiffening structure 106 in its chemical composition. By way of example, the edge region 102r may include or be formed from silicon and the stiffening structure 106 may include or be formed from glass.

The stiffening of at least one additional semiconductor wafer 102, 202 can optionally be carried out by means of the removed stiffening structure 106.

The method may include, in 800c, for the purpose of forming the stiffening structure 106, joining together 801 the latter and the circuit region 102s and/or the edge region 102r while the filling body 402 is secured or remains on the stiffening structure 106, e.g. in a positively locking manner, cohesively and/or in a force-locking manner. In 800c, joining together 801 can be configured as described above. The circuit region 102s or at least the at least one electronic circuit 104 can be or remain free of a connection (e.g. an adhesive connection) to the filling body 402, e.g. free of an adhesive. The filling body 402 can be brought into physical contact with the circuit region 102s.

The method can alternatively or additionally include, in 800c, for the purpose of removing the stiffening structure 106, separating 801 the latter from the edge region 102r while the filling body 402 is secured or remains on the stiffening structure 106, e.g. by means of light (e.g. infrared and/or ultraviolet light) or by means of thermal energy. In 800b, separating 801 can be configured as described above.

The stiffening of at least one additional semiconductor wafer 102, 202 can optionally be carried out by means of the removed stiffening structure 106 and the filling body 402 secured thereon.

Figure 9A:
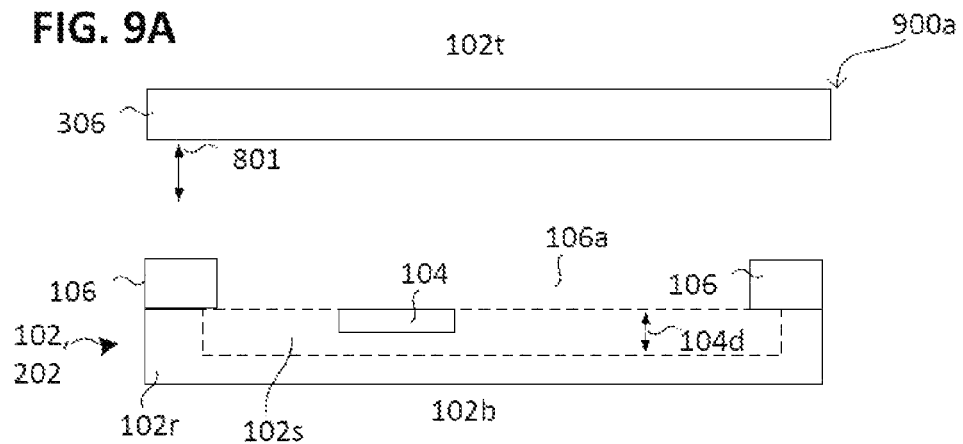
FIGS. 9A to 9C in each case show a semiconductor wafer in a method in accordance with various embodiments in a schematic side view or cross-sectional view.
Figure 9B:
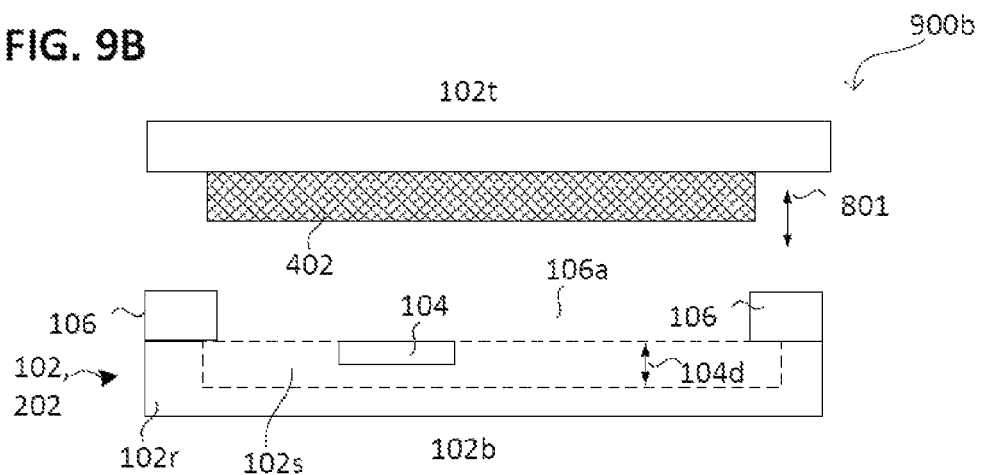
Figure 9C:
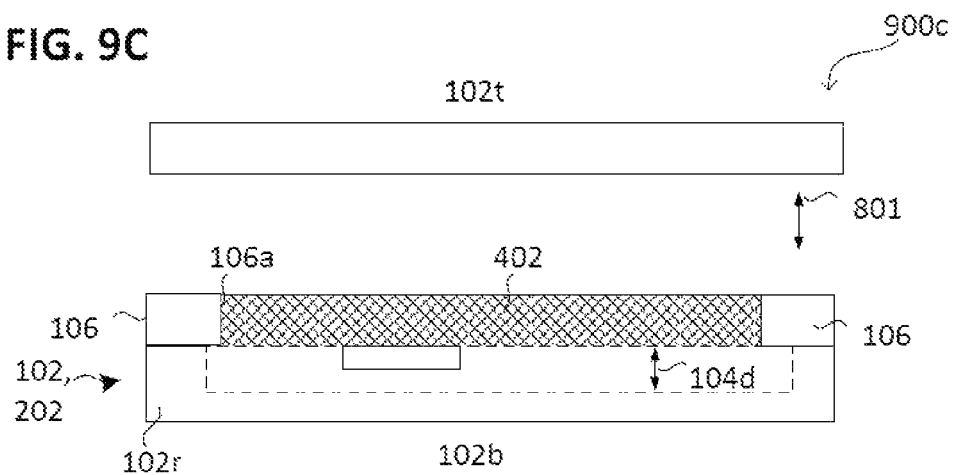

FIG. 9A and FIG. 9B illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 900a, for the purpose of forming the stiffening structure cover 306, joining together 801 the latter and the stiffening structure 106. Joining together 801 may include connecting the stiffening structure 106 to the stiffening structure cover 306, e.g. cohesively and/or in a positively locking manner. The connection can be carried out by means of an adhesive, by means of anodic bonding and/or by means of laser beam welding. Anodic bonding and/or laser beam welding can enable a connection having a thermal stability of approximately 400° C. or more, e.g. of approximately 500° C. or more, e.g. of approximately 600° C. or more, e.g. of approximately 700° C. or more, e.g. of approximately 800° C. or more, e.g. of approximately 900° C. or more. Adhesive bonding and the positively locking engagement can enable in each case a releasable connection. By way of example, adhesive bonding can be carried out by means of a light-sensitive adhesive and/or by means of a thermosensitive adhesive. In other words, the adhesive can be configured either for curing and/or for separating by means of light (e.g. infrared and/or ultraviolet light) or by means of thermal energy.

The positively locking connection between the stiffening structure 106 and the stiffening structure cover 306 may include forming a rotary closure, for example. By way of example, the stiffening structure cover 306 and the stiffening structure 106 may include mutually matching threads or engagement sections (e.g. for forming a plug-rotary closure, such as a bayonet closure, for example).

The method can alternatively or additionally include, in 900a, for the purpose of removing the stiffening structure cover 306, separating 801 the latter from the stiffening structure 106, e.g. if they are releasably connected to one another. Separating can be carried out nondestructively, e.g. if they are releasably connected to one another. By way of example, separating 801 the connection between the stiffening structure 106 and the stiffening structure cover 306 can be carried out by releasing the adhesive (e.g. a light-sensitive adhesive and/or a thermosensitive adhesive), at least by means of light (e.g. infrared and/or ultraviolet light) or by means of thermal energy. Alternatively or additionally, separating 801 the connection between the stiffening structure 106 and the stiffening structure cover 306 can be carried out by cancelling the positively locking engagement. Nondestructive separating 801 can enable and/or facilitate reusing the stiffening structure cover 306.

If the stiffening structure 106 and stiffening structure cover 306 are non-releasably connected to one another, separating 801 can be carried out by mechanically processing them (e.g. by dividing the semiconductor wafer 102, 202), e.g. by means of cracking, breaking, splitting, cutting, etc. If the stiffening structure cover 306 is intended to be reused, separating 801 can be carried out by dividing the stiffening structure 106. Optionally, that part of the stiffening structure 106 which remains on the stiffening structure cover 306 can subsequently be removed, e.g. chemically (e.g. by means of etching) or mechanically (by means of grinding). By way of example, the chemical removal of the remaining part of the stiffening structure 106 can be facilitated if it differs from the stiffening structure cover 306 in its chemical composition. By way of example, the stiffening structure cover 306 may include or be formed from silicon and the stiffening structure 106 may include or be formed from glass, or vice versa.

By means of the removed stiffening structure cover 306, it is optionally possible to carry out the covering and/or stiffening of at least one additional semiconductor wafer 102, 202, e.g. in a dust-tight fashion and/or in a vacuum-tight fashion.

By way of example, for the processing of the circuit region 102s on the first main processing side 102t (e.g. of the circuit region 102s), the stiffening structure cover 306 can be removed. The semiconductor wafer 102, 202 can optionally include the stiffening structure 106 during the processing of the first main processing side 102t (e.g. of the circuit region 102s).

The method may include, in 900b, for the purpose of forming the stiffening structure cover 306, joining together 801 the latter and the stiffening structure 106 while the filling body 402 is secured or remains on the stiffening structure cover 306, e.g. in a positively locking manner, cohesively and/or in a force-locking manner. In 900b, joining together 801 can be configured as described above. The circuit region 102s or at least the at least one electronic circuit 104 can be or remain free of a connection (e.g. an adhesive connection) to the filling body 402, e.g. free of an adhesive. The filling body 402 can be brought into physical contact with the circuit region 102s.

The method can alternatively or additionally include, in 900b, for the purpose of removing the stiffening structure cover 306, separating 801 the latter from the stiffening structure 106 while the filling body 402 is secured or remains on the stiffening structure cover 306, e.g. by means of light (e.g. infrared and/or ultraviolet light) or by means of thermal energy. In 900b, separating 801 can be configured as described above.

By means of the removed stiffening structure cover 306 and the filling body 402 secured thereon, it is optionally possible to carry out the stiffening and/or covering of at least one additional semiconductor wafer 102, 202, e.g. in a dust-tight fashion and/or in a vacuum-tight fashion.

By way of example, for the processing of the circuit region 102s on the first main processing side 102t, the stiffening structure cover 306 and the filling body 402 can be removed. The semiconductor wafer 102, 202 can optionally include the stiffening structure 106 during the processing of the first main processing side 102t (e.g. of the circuit region 102s).

The method may include, in 900c, for the purpose of forming the stiffening structure cover 306, joining together 801 the latter and the stiffening structure 106 while the filling body 402 is secured or remains on the stiffening structure 106, e.g. in a positively locking manner, in a force-locking manner and/or cohesively. In 900c, joining together 801 can be configured as described above. The circuit region 102s or at least the at least one electronic circuit 104 can be or remain free of a connection (e.g. an adhesive connection) to the filling body 402, e.g. free of an adhesive. The filling body 402 can be brought into physical contact with the circuit region 102s.

The method can alternatively or additionally include, in 900c, for the purpose of removing the stiffening structure cover 306, separating 801 the latter and the stiffening structure 106 from one another while the filling body 402 is secured or remains on the stiffening structure 106, e.g. by means of light (e.g. infrared and/or ultraviolet light) or by means of thermal energy. In 900c, separating 801 can be configured as described above.

By means of the removed stiffening structure cover 306, it is optionally possible to carry out the stiffening and/or covering of at least one additional semiconductor wafer 102, 202, e.g. in a dust-tight fashion and/or in a vacuum-tight fashion.

Figure 10A:
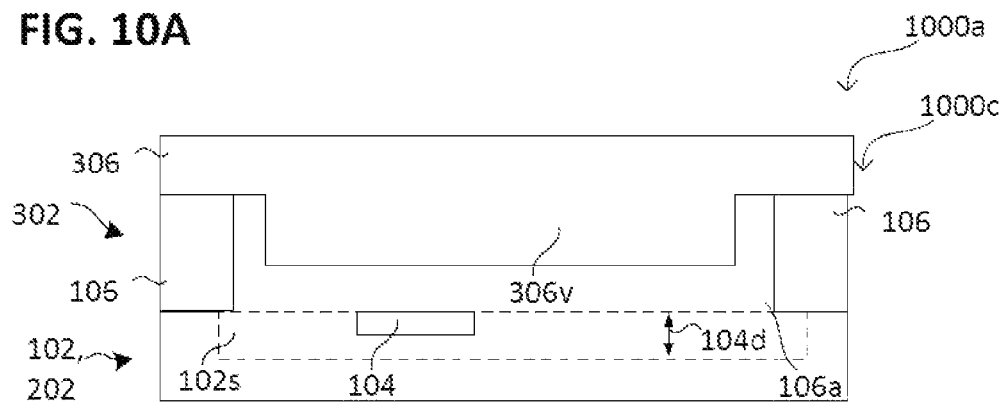
FIGS. 10A to 10C in each case show semiconductor wafers in a method in accordance with various embodiments in a schematic side view or cross-sectional view.
Figure 10B:
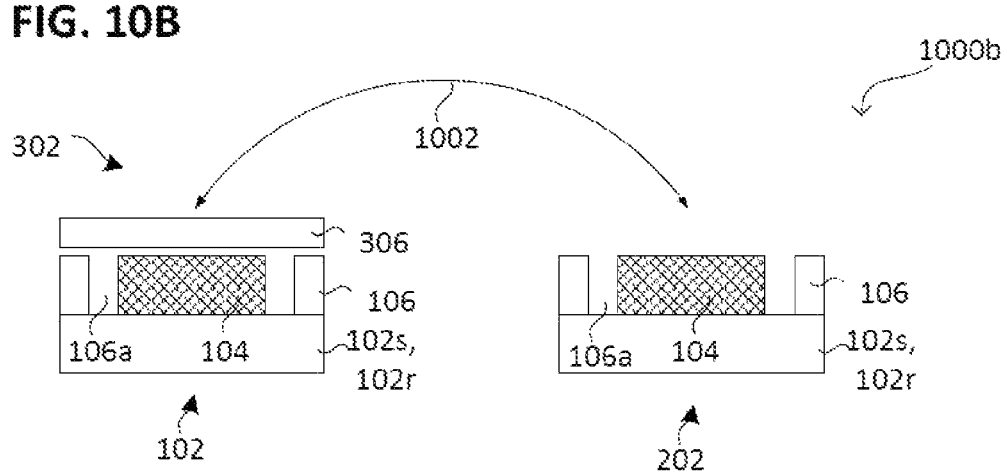
Figure 10C:
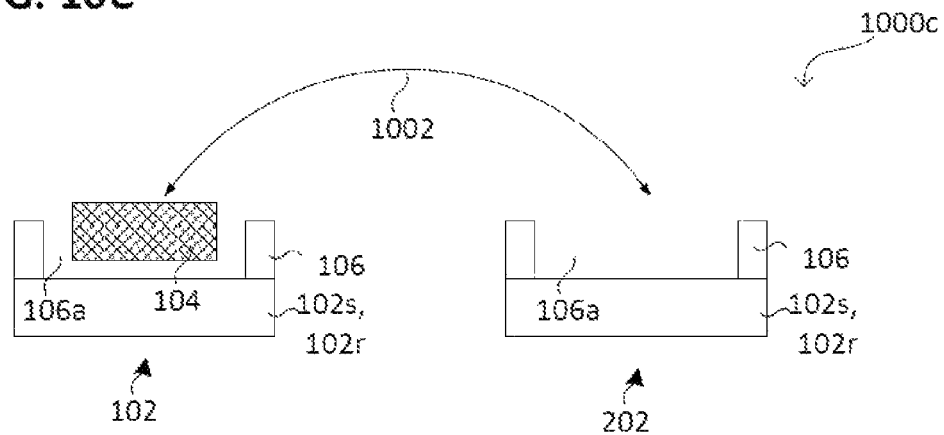

FIG. 10A, FIG. 10B and FIG. 10C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 1000a, arranging a stiffening structure cover 306 above the stiffening structure 106, which has a projection 306v extending into the cutout 106a. Thus, the volume of the cutout 106a and thus the material requirement for the filling body 402 can be reduced.

The method may include, in 1000b: removing (and/or detaching) the stiffening structure cover 306 from the stiffening structure 106 of a first semiconductor wafer 102 and adding the stiffening structure 106 to a second semiconductor wafer 202, which can optionally be processed subsequently. In other words, processing of the second semiconductor wafer 202 including the stiffening structure cover 306 can be carried out. In other words, at least the stiffening structure cover 306 can be reused 1002. Optionally, a filling body 402 can be arranged or remain in the cutout 106a of the first semiconductor wafer 102 and/or in the cutout 106a of the second semiconductor wafer 202.

The method may include, in 1000c: removing (and/or detaching) the filling body 402 from the circuit region 102s of the first semiconductor wafer 102 and adding the filling body 402 to a second semiconductor wafer 202, which can optionally be processed subsequently. In other words, at least the filling body 402 can be reused 1002.

The method may include, in 1000c: extracting the filling body 402 from a cutout 106a of the first semiconductor wafer 102 and introducing the filling body 402 into a cutout 106a of the second semiconductor wafer 202.

Figure 11A:
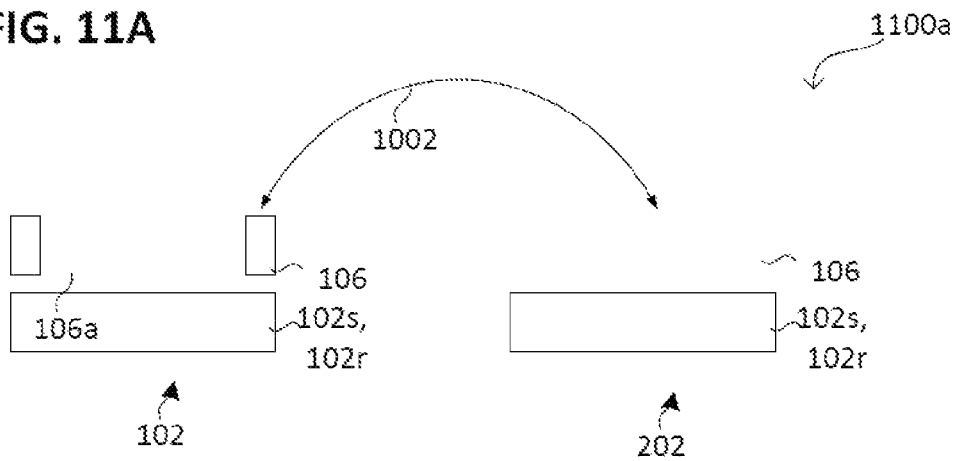
FIGS. 11A to 11C in each case show semiconductor wafers in a method in accordance with various embodiments in a schematic side view or cross-sectional view.
Figure 11B:
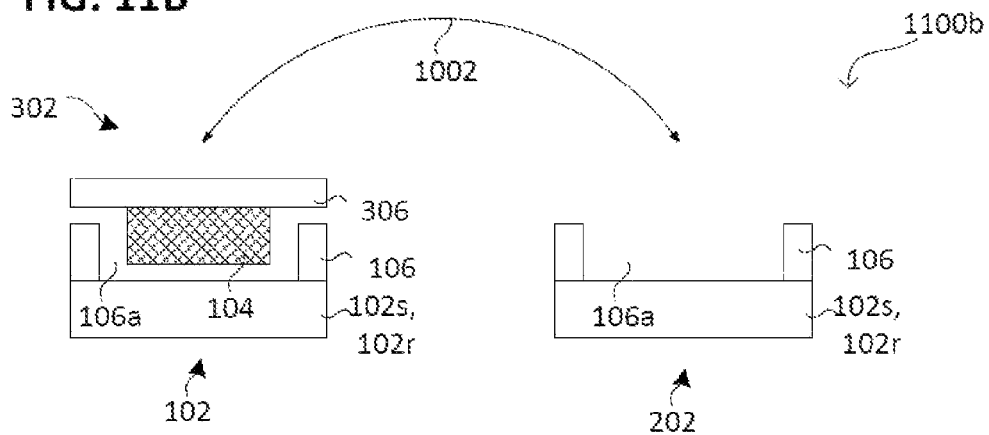
Figure 11C:
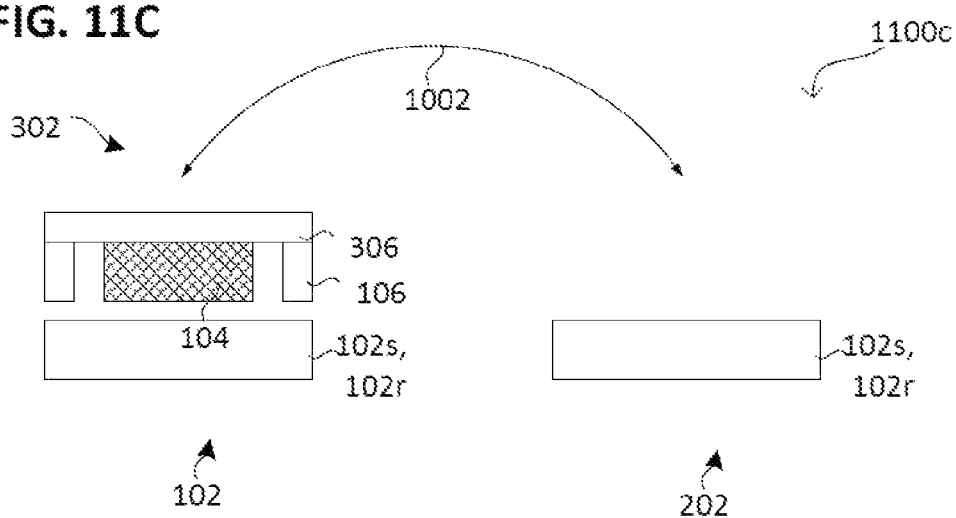
Figure 12A:
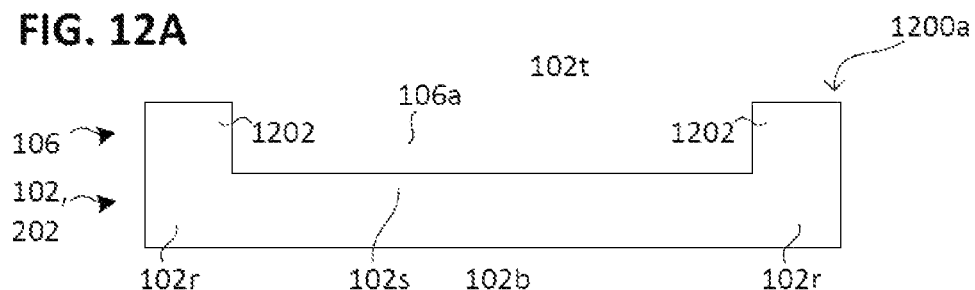
FIGS. 12A to 12D in each case show a semiconductor wafer in a method in accordance with various embodiments in a schematic side view or cross-sectional view.
Figure 12B:
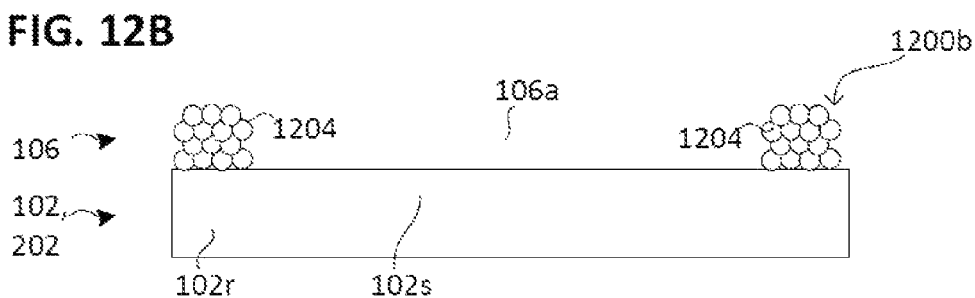
Figure 12C:
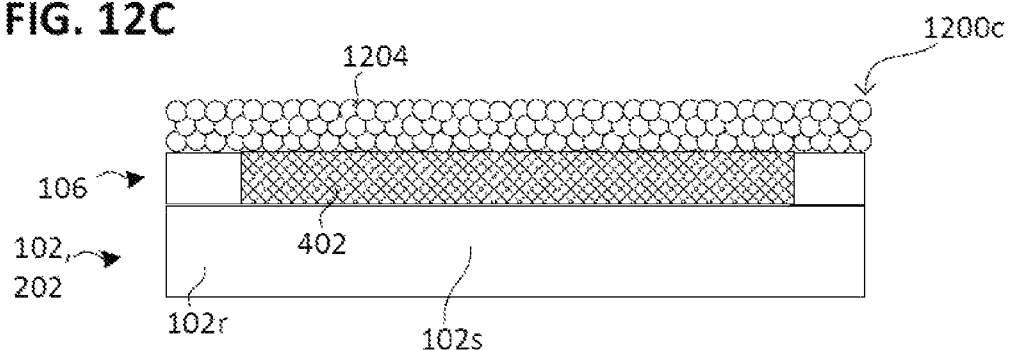
Figure 12D:
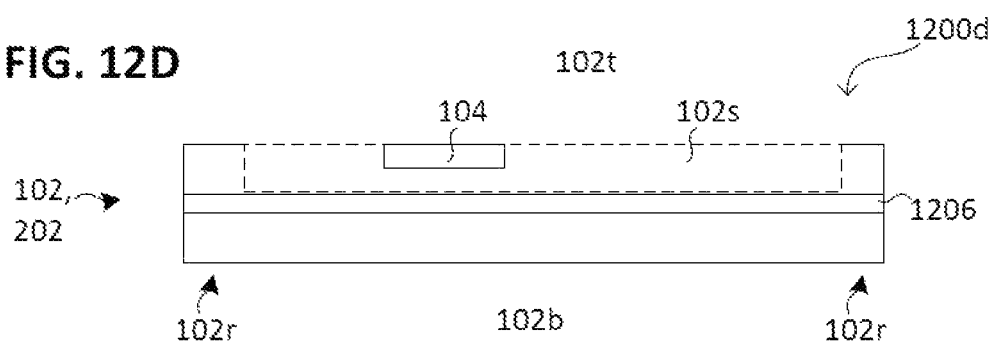

FIG. 11A, FIG. 11B and FIG. 11C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 1100a: removing (and/or detaching) the stiffening structure 106 (e.g. from a first semiconductor wafer 102) from the edge region 102r of the first semiconductor wafer 102 and adding the stiffening structure 106 to a second semiconductor wafer 202, which can optionally be processed subsequently. In other words, at least the stiffening structure 106 can be reused 1002.

The method may include, in 1100b: removing (and/or detaching) the stiffening structure cover 306 jointly with the filling body 402 (e.g. as an interconnected unit) from the stiffening structure 106 of a first semiconductor wafer 102 and adding the filling body 402 jointly with the stiffening structure cover 306 to a second semiconductor wafer 202, which can optionally be processed subsequently. In other words, at least the stiffening structure cover 306 and the filling body 402 can be reused 1002, e.g. as an interconnected unit.

The method may include, in 1100b: extracting the filling body 402 from the cutout 106a of the first semiconductor wafer 102 and introducing the filling body 402 into a cutout 106a of the second semiconductor wafer 202.

The method may include, in 1100c: removing (and/or detaching) the stiffening structure cover 306 jointly with the filling body 402 and also the stiffening structure 106 (e.g. as an interconnected unit) from a first semiconductor wafer 102 and adding the stiffening structure cover 306 jointly with the filling body 402 and also the stiffening structure 106 to a second semiconductor wafer 202, which can optionally be processed subsequently. In other words, the stiffening structure cover 306, the stiffening structure 106 and the filling body 402 can be reused 1002 jointly (e.g. as an interconnected unit).

FIG. 12A, FIG. 12B, FIG. 12C and FIG. 12D illustrate in each case a semiconductor wafer 102, 202 in a method in accordance with various embodiments in a schematic side view or cross-sectional view.

The method may include, in 1200a, for the purpose of forming the stiffening structure 106, arranging a semiconductor material 1202 on the first main processing side 102t of the semiconductor wafer 102, e.g. above the edge region 102r thereof. The semiconductor material 1202 can be deposited by means of a vapour deposition, e.g. a physical vapour deposition (PVD) and/or a chemical vapour deposition (CVD), and can optionally be etched and/or oxidized. The semiconductor material 1202 can optionally be grown epitaxially.

In accordance with various embodiments, the stiffening structure 106 (or the material thereof) and the edge region 102r or the circuit region 102s can be monolithically (e.g. integrally) connected to one another. The edge region 102r and the circuit region 102s can be monolithically (e.g. integrally) connected to one another.

In accordance with various embodiments, the cutout 106a can be formed through the stiffening structure 106 or at least into the latter by material being removed from the stiffening structure 106 (e.g. by means of thermal processing, chemical processing and/or mechanical processing) or by the material being deposited by means of a mask. By way of example, the circuit region 102s can be covered by means of the mask.

After forming the stiffening structure 106, in 1200a forming the at least one electronic circuit 104 can be carried out, e.g. by the circuit region 102s being doped in one or a plurality of sections.

In accordance with various embodiments, the semiconductor material 1202 may include or be formed from silicon. Alternatively, the semiconductor material 1202 may include or be formed from gallium.

Optionally, oxygen, nitrogen or carbon can be incorporated into the stiffening structure 106, e.g. in the form of a semiconductor compound such as silicon carbide or gallium nitride, for example. Alternatively, a ceramic, e.g. silicon oxide, can be formed by means of the oxygen, nitrogen or carbon.

In various embodiments, the stiffening structure 106 and the edge region 102r may include or be formed from the same semiconductor material (for example SiC), the same semiconductor (for example Si) and/or the same chemical composition. In various embodiments, the stiffening structure 106 and the circuit region 102s may include or be formed from the same semiconductor material (for example SiC) and/or the same semiconductor (for example Si). By way of example, the stiffening structure 106 and the circuit region 102s can be deposited by means of the same process, e.g. on a substrate 1302 (cf. FIG. 13B).

The method may include, in 1200b, for the purpose of forming the stiffening structure 106, arranging a polymer 1204 above the edge region 102r, e.g. a ceramic-forming polymer 1204. The ceramic-forming polymer 1204 can be configured to chemically react and/or decompose at or above an activation temperature (illustratively a conversion temperature that activates the conversion) with the formation of a ceramic. In order to form the stiffening structure 106, the ceramic-forming polymer 1204 can be brought to or above the activation temperature. As an alternative to the ceramic-forming polymer, the stiffening structure 106 may include or be formed from a resin or a silicon-based polymer, e.g. a silicone. The resin or the silicone can be applied for example in the viscous state and subsequently cure.

In accordance with various embodiments, the ceramic-forming polymer may include carbon and silicon (e.g. in the form of silanes) and also optionally at least one hydrogen ligand and/or optionally at least one allyl group. By way of example, the ceramic-forming polymer may include or be formed from carbosilanes, e.g. allyl-hydrido-polycarbosilanes. The ceramic-forming polymer can react to form SiC, for example. Hydrogen can be released from the ceramic-forming polymer in the process.

Optionally, after forming the stiffening structure 106 in 1200b forming the at least one electronic circuit 104 can be carried out, e.g. by the circuit region 102s being doped in one or a plurality of sections. Alternatively, it is possible for the at least one electronic circuit 104 to have been formed before the formation of the stiffening structure 106.

The method may include, in 1200c, for the purpose of forming the stiffening structure cover 306, arranging a polymer 1204 above the filling body 402 and/or above the stiffening structure 106, e.g. a ceramic-forming polymer 1204. The ceramic-forming polymer 1204 can be configured to chemically react and/or decompose at or above the activation temperature with the formation of a ceramic. In order to form the stiffening structure cover 306, the ceramic-forming polymer 1204 can be brought to or above the activation temperature. As an alternative to the ceramic-forming polymer, the stiffening structure cover 306 may include or be formed from a resin or a silicon-based polymer, e.g. a silicone. The resin or the silicone can be applied for example in the viscous state and subsequently cure.

The method may include, in 1200d, forming a (buried) etch stop layer 1206 in the semiconductor wafer 102, 202. The etch stop layer 1206 can optionally be in physical contact with the circuit region 102s. This can make it possible to stop the thinning of the semiconductor wafer 102, 202 by means of etching at the etch stop layer 1206. In other words, the semiconductor wafer 102, 202 may include an etch stop layer 1206 at which thinning (e.g. etching) stops.

If thinning is carried out by means of mechanical processing, e.g. by means of machining, or by means of non-etching eroding, the etch stop layer 1206 can be omitted. The use of the etch stop layer 1206 facilitates the force-free thinning of the semiconductor wafer 102, 202 and can thus make it possible optionally to omit the filling body 402.

FIG. 13A illustrates a semiconductor wafer 102, 202 in a method in accordance with various embodiments in a schematic plan view (e.g. looking at the first main processing side 102t).

The method may include, in 1300a, forming a plurality of segments 116a, 116b, 116c, 116d of the stiffening structure 106.

In accordance with various embodiments, the plurality of segments 116a, 116b, 116c, 116d can be formed by removing material from the stiffening structure 106 (e.g. by means of thermal processing, chemical processing and/or mechanical processing) or by depositing material by means of a mask. In each case an opening 106o of the stiffening structure 106 can be arranged between mutually adjacent segments 116a, 116b, 116c, 116d. In other words, the mutually adjacent segments 116a, 116b, 116c, 116d can be at a distance from one another. By way of example, at least the edge region 102r can be covered in sections by means of the mask, e.g. at the sections at which the openings 106o are intended to be formed.

In accordance with various embodiments, the stiffening structure 106 may include or be formed from at least two segments 116a, 116c, e.g. three segments, four segments (as illustrated in FIG. 13A), five segments, six segments, seven segments, eight segments, nine segments, ten segments or more than ten segments, e.g. twenty segments, fifty segments, one hundred segments or more than one hundred segments.

FIG. 13B, FIG. 13C and FIG. 13D illustrate in each case a semiconductor wafer 102, 202 in a method in accordance with various embodiments in a schematic side view or cross-sectional view.

The method may include, in 1300b: forming the circuit region 102s above a substrate 1302. Forming the circuit region 102s may include forming a layer 1304 (also referred to as useful layer 1304) above the substrate 1302. The substrate 1302 may include or be formed from a first semiconductor material, e.g. having a first chemical composition.

The useful layer 1304 may include or be formed from a semiconductor region. The useful layer 1304 or the semiconductor region thereof may include or be formed from a second semiconductor material, e.g. having a second chemical composition. Optionally, the first semiconductor material and the second semiconductor material can be identical, e.g. Si, GaN or SiC. Alternatively or additionally, the first semiconductor material and the second semiconductor material can differ, e.g. in at least their chemical composition, e.g. in a dopant concentration, and/or in their semiconductor. By way of example, Si can be deposited on SiC.

In order to form the dopant concentration in the useful layer 1304, a dopant can be introduced into the latter, e.g. into the circuit region 102s thereof. One or a plurality of doped sections of the circuit region 102s can be formed by means of the dopant. The or each doped section of the circuit region 102s can be part of the at least one electronic circuit 104.

The second semiconductor material can optionally include or be formed from a monocrystalline semiconductor material, e.g. identical to the first semiconductor material. By way of example, the useful layer 1304 and the substrate 1302 (i.e. the materials thereof) can have an epitaxial relation to one another. In other words, the crystal structures of the useful layer 1304 and of the substrate 1302 can have a defined orientation with respect to one another, e.g. the same orientation. The useful layer 1304 can be grown for example epitaxially on the substrate 1302, e.g. homoepitaxially or heteroepitaxially. In other words, the useful layer 1304 may include or be formed from an epitaxial layer (EPI layer).

By way of example, the useful layer 1304 and the substrate 1302 (in the case of homoepitaxy) can correspond in terms of their crystal structure and/or in terms of their chemical composition. By way of example, EPI gallium nitride 1304 can be formed above a gallium nitride substrate 1302. Alternatively, EPI silicon carbide 1304 can be formed above a silicon carbide substrate 1302.

Alternatively, the useful layer 1304 and the substrate 1302 (in the case of heteroepitaxy) can differ in their crystal structure and/or chemical composition. By way of example, EPI gallium nitride 1304 can be formed above a silicon substrate 1302.

In accordance with various embodiments, the substrate 1302 can be a semiconductor substrate 1302 and/or thereon an epitaxially formed semiconductor layer 1304 may include the circuit region 102*s*.

Optionally, an etch stop layer 1206 can be formed between the substrate 1302 and the useful layer 1304, as described above. Alternatively or additionally, a sacrificial layer 1902 can be formed between the substrate 1302 and the useful layer 1304, as described in even greater detail below (cf. FIG. 19A).

The method may include, in 1300*b*: forming a circuit region 102*s* in the useful layer 1304, for example by forming the at least one electronic circuit 104 in the useful layer 1304. The circuit region 102*s* or at least the at least one electronic circuit 104 can at least partly penetrate (i.e. partly or completely) through the useful layer 1304 in a vertical direction. In other words, the useful layer 1304 may include the circuit region 102*s*. Furthermore, the useful layer 1304 may include the edge region 102*r* surrounding the circuit region 102*s*.

The method may include, in 1300*c*, for the purpose of thinning the semiconductor wafer 102, 202, exposing the epitaxially formed material, e.g. on the second main processing side 102*b*. To that end, it is possible for example at least partly to remove the substrate 1302, and optionally the etch stop layer 1206. If the semiconductor wafer 102, 202 includes the etch stop layer 1206, in a first thinning substep the etch stop layer 1206 can be exposed (e.g. by means of a first etchant, which stops at the etch stop layer 1206) and in a second thinning substep the etch stop layer 1206 can be removed (e.g. by means of a second etchant, which removes the etch stop layer 1206).

The first etchant can etch the substrate 1302 more rapidly than the etch stop layer 1206. The second etchant can etch the useful layer 1304 more slowly than the etch stop layer 1206.

The method may include, in 1300*d*, for the purpose of thinning the semiconductor wafer 102, 202, exposing the at least one electronic circuit 104, e.g. on the second main processing side 102*b*. To that end, it is possible for example at least partly to remove the substrate 1302, and optionally at least part of the useful layer 1304 and optionally the etch stop layer 1206.

Optionally, in 1300*d*, the at least one electronic circuit 104 can be processed, e.g. by one or a plurality of layers being deposited and/or structured thereon, e.g. on the first main processing side 102*t* and/or on the second main processing side 102*b*. By way of example, the one or the plurality of layers may include or be formed from a metallization layer including e.g. at least one contact pad.

Figure 14A:
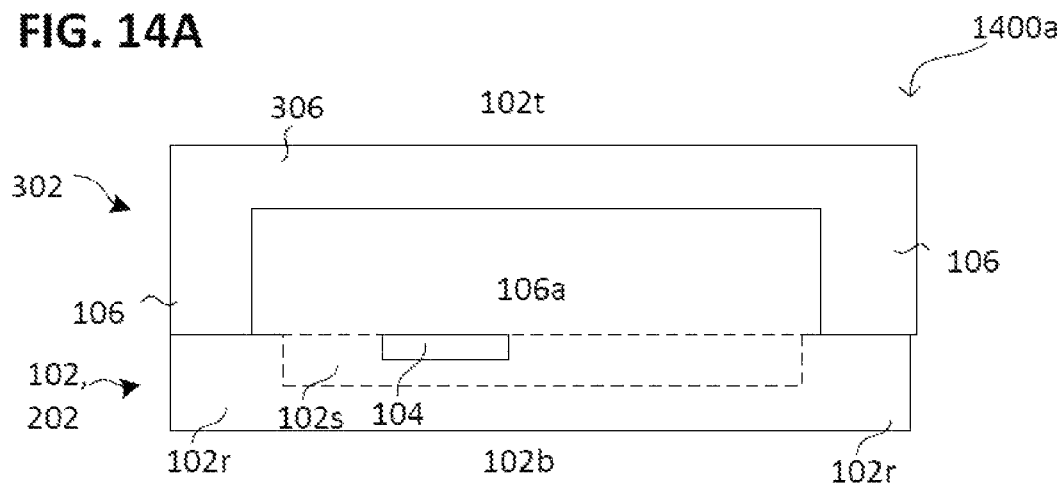
FIGS. 14A to 14C in each case show a semiconductor wafer in a method in accordance with various embodiments in a schematic side view or cross-sectional view.
Figure 14B:
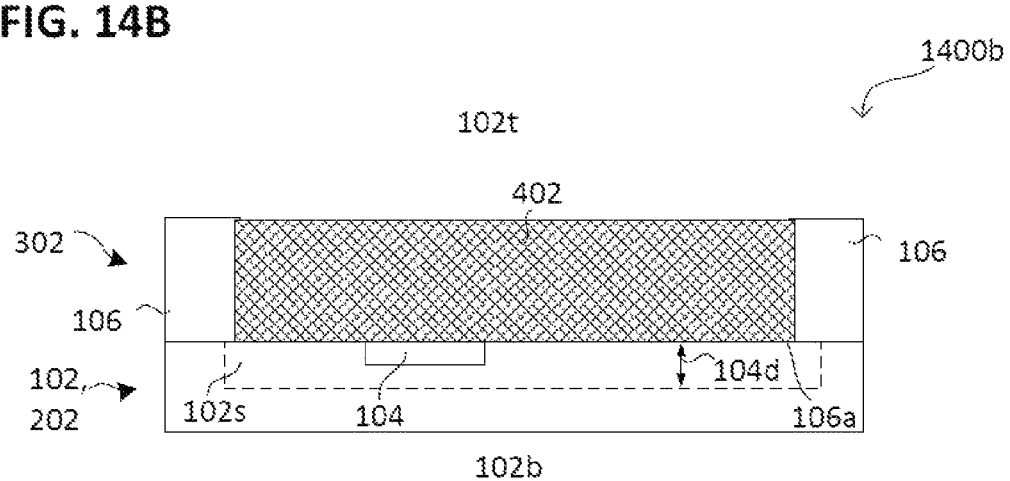
Figure 14C:
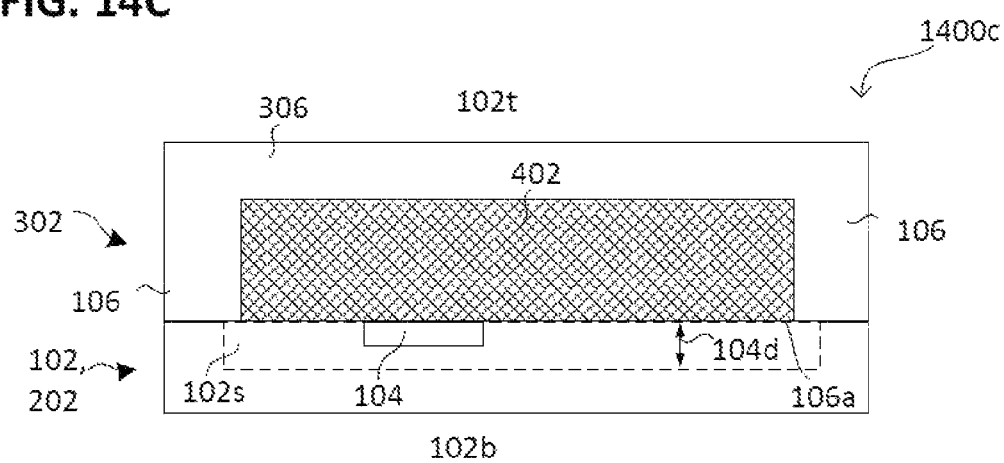
Figure 15A:
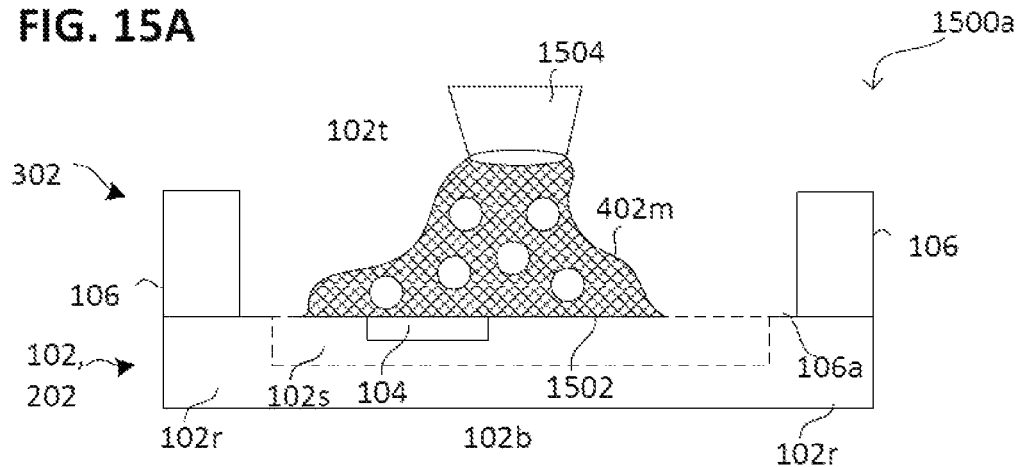
FIGS. 15A to 15D in each case show a semiconductor wafer in a method in accordance with various embodiments in a schematic side view or cross-sectional view.
Figure 15B:
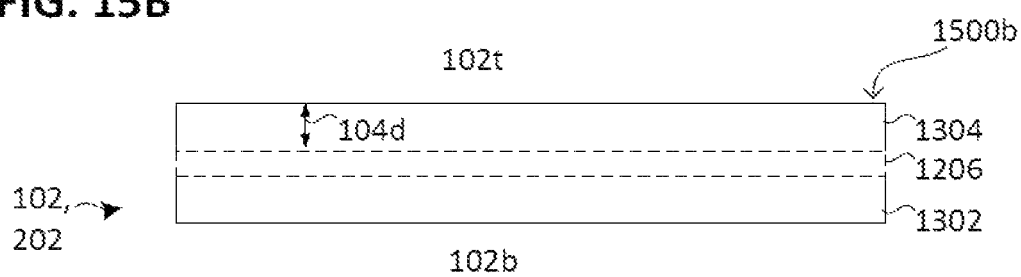
Figure 15C:
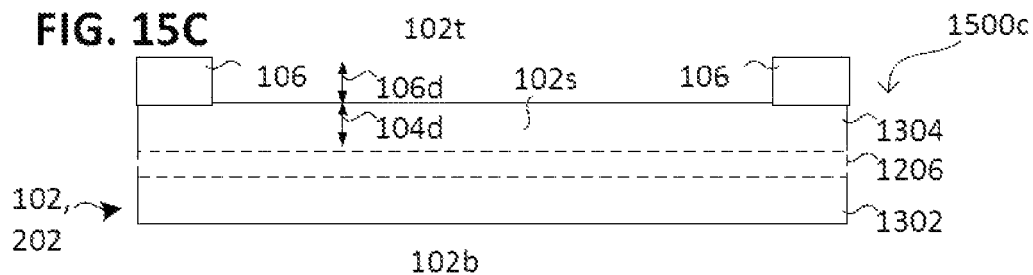
Figure 15D:
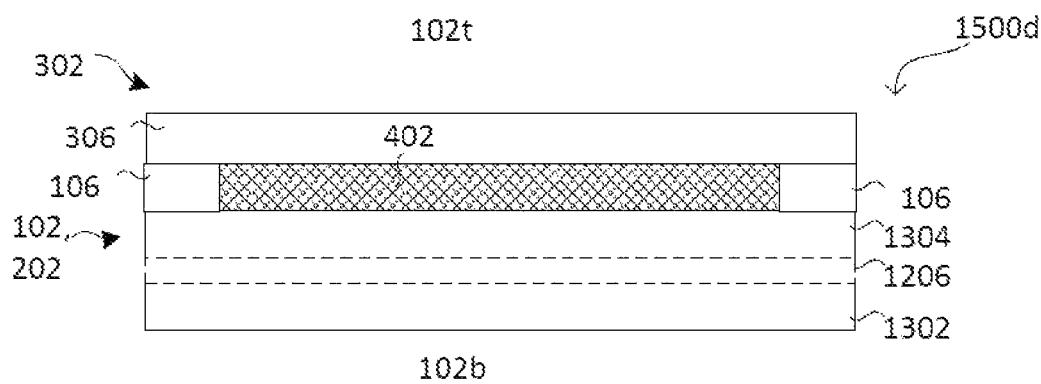

FIG. 14A, FIG. 14B and FIG. 14C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 1400*a*: forming a protective cover 302 on the first main processing side 102*t* of the semiconductor wafer 102, 202. The protective cover 302 can be configured to cover the circuit region 102*s* without contact.

In accordance with various embodiments, the protective cover 302 may include a stiffening structure 106, through which a cutout 106*a* penetrates. Furthermore, the protective cover 302 may include a stiffening structure cover 306 adjoining the cutout 106*a*. The cutout 106*a* can form a cavity when the protective cover 302 and the circuit region 102*s* are joined together.

In accordance with various embodiments, the protective cover 302 (or the stiffening structure 106 thereof) can be in physical contact only with an edge region 102*r* of the semiconductor wafer 102, 202 that surrounds the circuit region 102*s*.

The method may include, in 1400*b*: forming a protective cover 302 on the first first main processing side 102*t* of the semiconductor wafer 102, 202. The protective cover 302 can be configured to cover and optionally support the circuit region 102*s* in a manner free of adhesion.

In accordance with various embodiments, the protective cover 302 may include may include a stiffening structure 106, through which a cutout 106*a* penetrates. Furthermore, the protective cover 302 may include a filling body 402 arranged in the cutout 106*a*. The filling body 402 can substantially fill the cutout 106*a* and optionally be brought into physical contact with the circuit region 102*s* when the protective cover 302 and the circuit region 102*s* are joined together, e.g. in a dust-tight fashion and/or in a vacuum-tight fashion.

In accordance with various embodiments, the stiffening structure 106 can be in physical contact only with an edge region 102*r* of the semiconductor wafer 102, 202 that surrounds the circuit region 102*s*.

The method may include, in 1400*c*: forming a protective cover 302 on the first main processing side 102*t* of the semiconductor wafer 102, 202. The protective cover 302 can be configured to cover and optionally support the circuit region 102*s* in a manner free of adhesion.

In accordance with various embodiments, the protective cover 302 may include a stiffening structure 106, through which a cutout 106*a* penetrates. Furthermore, the protective cover 302 may include a stiffening structure cover 306 adjoining the cutout 106*a* and covering the latter, e.g. in a dust-tight fashion and/or in a vacuum-tight fashion. Furthermore, the protective cover 302 may include a filling body 402 arranged in the cutout 106*a*. The filling body 402 can substantially fill the cutout 106*a* and optionally be brought into physical contact with the circuit region 102*s* and/or with the stiffening structure cover 306 when the protective cover 302 and the circuit region 102*s* are joined together.

In accordance with various embodiments, the stiffening structure 106 can be in physical contact only with an edge region 102*r* of the semiconductor wafer 102, 202 that surrounds the circuit region 102*s*.

Optionally, the stiffening structure 106 and the stiffening structure cover 306 can be monolithically connected to one another in 1400*a* and 1400*c*.

FIG. 15A, FIG. 15B, FIG. 15C and FIG. 15D illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 1500*a*, for the purpose of forming the filling body 402, introducing a material 402*m* into the cutout 106*a* by means of a nozzle 1504 and/or foaming said material in said cutout while the semiconductor wafer 102, 202 includes the stiffening structure 106.

Foaming can be carried out by means of a propellant, for example. Alternatively or additionally, foaming can be carried out by a gas being fed to (mixed with) the material 402m in the cutout 106a (e.g. by means of the nozzle 1504), and/or by the material 402m admixed with a gas in the cutout 106a being relaxed (i.e. being introduced at an elevated pressure and/or outgassing therein).

Optionally, a separating layer 1502 can be formed between the filling body 402 and the circuit region 102s. The separating layer 1502 can have for example no adhesive force with respect to the circuit region 102s or at least less than with respect to the material 402m of the filling body 402. Alternatively or additionally, an adhesive force of the separating layer 1502 with respect to the circuit region 102s can be less than a weight force of the filling body 402, e.g. less than approximately 50% of the weight force of the filling body 402, e.g. less than approximately 25% of the weight force of the filling body 402. What can thus be achieved is that the filling body 402 exerts as little force as possible on the circuit region 102s and/or can be removed more easily. The separating layer 1502 may include or be formed from, for example, a film, e.g. a polymer film.

In accordance with various embodiments, introducing the material 402m into the cutout 106a can be carried out by means of a nozzle 1504, e.g. by means of a printing process.

The method may include, in 1500b, providing a semiconductor wafer 102, 202 including a substrate 1302 and an epitaxially (e.g. homoepitaxially) deposited useful layer 1304 and optionally an etching stop layer 1206 (also referred to as etch stop layer 1206) between them.

The useful layer 1304 can have a vertical extent that is greater than or equal to the thickness 104d of the circuit region 102s.

Optionally, the semiconductor wafer 102, 202 may include the at least one electronic circuit 104 formed in the useful layer 1304.

The method may include, in 1500c, arranging the stiffening structure 106 on the main processing side 102t of the semiconductor wafer 102, 202 including a substrate 1302 and an epitaxially (e.g. homoepitaxially) deposited useful layer 1304. Optionally, an etch stop layer 1206 can be arranged between the substrate 1302 and the useful layer 1304.

The method can optionally include, in 1500c, connecting the stiffening structure 106 to the useful layer 1304, e.g. by means of an adhesive, by means of anodic bonding and/or by means of laser beam welding.

In accordance with various embodiments, a thickness 106d of the stiffening structure 106 can be greater than a thickness 104d of the useful layer 1304, for example approximately double the thickness 104d of the useful layer 1304 or more, for example approximately triple the thickness 104d of the useful layer 1304 or more, for example approximately quadruple the thickness 104d of the useful layer 1304 or more. This can improve the stiffening effect.

The method may include, in 1500d, arranging the stiffening structure cover 306 and the filling body 402 above the circuit region 102s. In accordance with various embodiments, the stiffening structure cover 306 and the filling body 402 can be arranged successively above the circuit region 102s, e.g. individually (i.e. in a manner separated from one another in time). Alternatively, the stiffening structure cover 306 and the filling body 402 can be arranged jointly above the stiffening structure 106, e.g. in a manner already connected to one another.

The method can optionally include, in 1500d, connecting the stiffening structure 106 to the stiffening structure cover 306, e.g. by means of an adhesive, by means of anodic bonding and/or by means of laser beam welding.

Figure 16A:
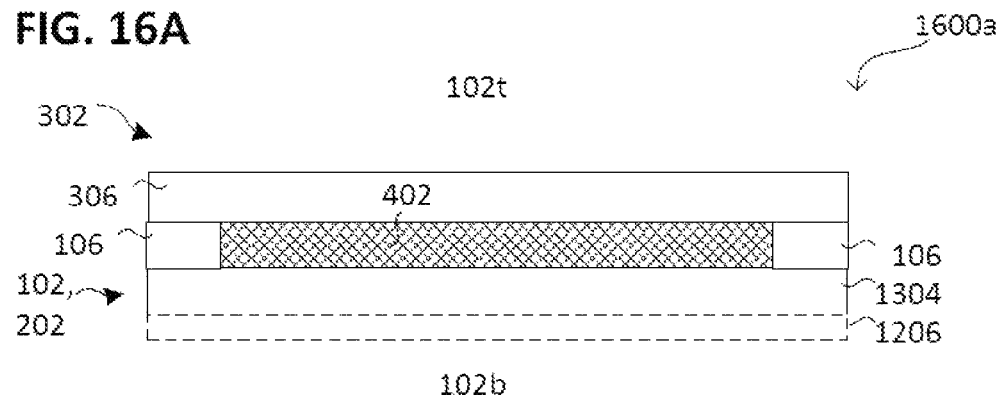
FIGS. 16A to 16C in each case show a semiconductor wafer in a method in accordance with various embodiments in a schematic side view or cross-sectional view.
Figure 16B:
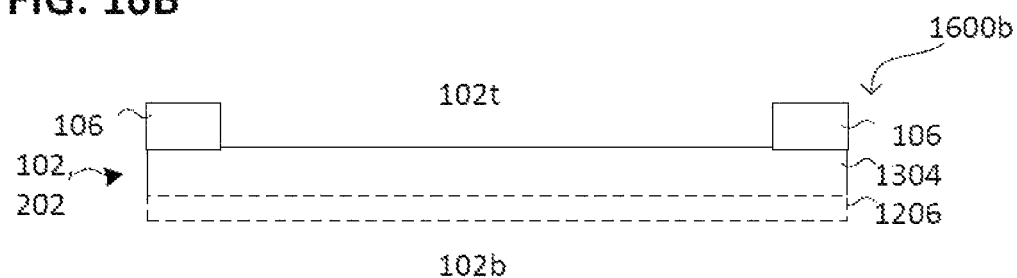
Figure 16C:
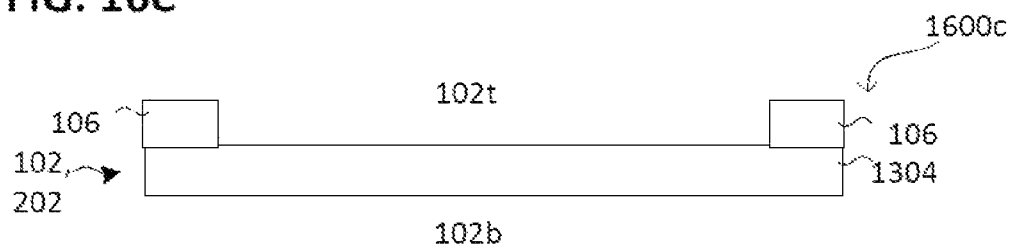

FIG. 16A, FIG. 16B and FIG. 16C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 1600a, at least partly (i.e. partly or completely) removing the substrate 1302 (e.g. from the second main processing side 102b), for example by means of grinding and/or etching. By way of example, the method may include, in 1600a, at least partly exposing the etch stop layer 1206.

By way of example, etching can stop at the etch stop layer 1206. For etching purposes, it is possible to use an etchant which etches the substrate 1302 more rapidly than the etch stop layer 1206. What can thus be achieved is that etching can be stopped at the etch stop layer 1206. Some other subtractive processing process can be used as an alternative to etching.

By way of example, grinding can be stopped after a predetermined time. What can thus be achieved is that grinding stops before or at the useful layer 1304. Some other subtractive processing process can be used as an alternative to grinding.

The method may include, in 1600b (e.g. after 1600a), removing the stiffening structure cover 306 and the filling body 402 from the stiffening structure 106. In accordance with various embodiments, the stiffening structure cover 306 and the filling body 402 can be removed successively from the stiffening structure 106, e.g. individually (i.e. in a manner separated from one another in time). Alternatively, the stiffening structure cover 306 and the filling body 402 can be removed jointly from the stiffening structure 106, e.g. as an interconnected unit.

The method can optionally include, in 1600c (e.g. after 1600b), removing the etch stop layer 1206 (if present), for example by means of eroding or by means of machining, for example by means of etching (e.g. selectively). By way of example, etching can stop at the etch stop layer 1206. For etching purposes, it is possible to use an etchant which etches the etch stop layer 1206 more rapidly than the circuit region 102s. What can thus be achieved is that etching stops at the circuit region 102s.

The method may include, in 1600c, processing the semiconductor wafers 102, 202. Processing may include at least one of the following: chemical processing (e.g. cleaning, doping, etching, implanting, reacting, etc.); thermal processing, (e.g. irradiating, heating, cooling, melting, solidifying, etc.); and/or mechanical processing (e.g. machining, grinding, polishing, milling, sawing, dividing, etc.). Processing may include, for example, processing, e.g. heat treating, the first main processing side 102t and/or depositing one or a plurality of layers on the first main processing side 102t.

Alternatively or additionally, the method may include, in 1600c, carrying out a measuring process. By way of example, the method may include, in 1600c, electrically testing the at least one electronic circuit 104, e.g. by the latter being electrically contacted and measured (e.g. by means of contact pads).

Testing may include: contacting the various contact pads of the structure(s) to be tested (test structure(s)), e.g. of the chip(s) (e.g. semiconductor chip(s)) and carrying out an electrical characterization of the structure(s) to be tested, e.g.

by detecting and/or recording the electrical leakage current thereof, the electrical resistance thereof and/or the voltage drop thereof.

Optionally, the method may include, in 1600c, removing the edge region 102r (if the latter was used as a rear-side support ring). Alternatively or additionally, the method may include, in 1600c, exposing the semiconductor wafer 102, 202 and/or singulating the at least one or each electronic circuit 104.

FIG. 17A, FIG. 17B and FIG. 17C illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 1700a, providing and/or forming a stiffening structure 106 having a depression 106v. The depression 106v together with the cutout 106a can form a common through opening. In other words, the depression 106v can adjoin and/or surround the cutout 106a.

The stiffening structure 106 can be configured in such a way that the circuit region 102s is extended at least partly into the depression 106v. By way of example, the useful layer 1304 can be at least partly extended into the depression 106v. The depression 106v can be surrounded by an edge of the stiffening structure 106 in a lateral direction.

The stiffening structure 106 can have a greater extent 106l than the edge region 102r (or than the useful layer 1304) in a lateral direction. In other words, the stiffening structure 106, in a lateral direction, can project beyond the edge region 102r and/or reach around it (also referred to as overhang). To put it another way, at least part of the stiffening structure 106 (i.e. the overhang) can be arranged next to the edge region 102r in a lateral direction (i.e. laterally).

The depression 106v can have a lateral extent 116b which is greater than a lateral extent 106b of the cutout 106a. Alternatively or additionally, the depression 106v can have a lateral extent 116b which is greater than or equal to the lateral extent of the edge region 102r or at least of the useful layer 1304.

In accordance with various embodiments, the depression 106v can have a depth 116v which is greater than or equal to the thickness 104d of the circuit region 102s and/or which is greater than or equal to the thickness of the useful layer 1304. The useful layer 1304 can have a vertical extent (illustratively thickness) which is greater than or equal to the thickness 104d of the circuit region 102s.

The method can optionally include, in 1700a, arranging the filling body 402 (if present) and/or the stiffening structure cover 306 (if present) above the circuit region 102s, e.g. individually or as an interconnected unit. The method can optionally include, in 1700a, connecting the stiffening structure cover 306 (if present) and/or the filling body 402 (if present) to the stiffening structure 106.

The method may include, in 1700b, providing and/or forming a useful layer 1304, e.g. above the substrate 1302.

The method can optionally include, in 1700b: forming a circuit region 102s in the useful layer 1304, for example by forming the at least one electronic circuit 104 in the useful layer 1304. The circuit region 102s or at least the at least one electronic circuit 104 can at least partly penetrate (i.e. partly or completely) through the useful layer 1304 in a vertical direction.

The method may include, in 1700b, providing and/or forming a stiffening structure 106 having a depression 106v. The depression 106v together with the cutout 106a can form a common through opening. In other words, the depression 106v can adjoin the cutout 106a.

The stiffening structure 106 can be configured in such a way that the useful layer 1304 is extended at least partly into the depression 106v.

The method can optionally include, in 1700b, arranging the stiffening structure cover 306 (if present) and/or the filling body 402 (if present) above the circuit region 102s, e.g. individually or as an interconnected unit, and/or connecting them/it to the stiffening structure 106.

The method may include, in 1700c, thinning the semiconductor wafer 102, 202 from the second main processing side 102b, for example by the substrate 1302 being at least partly (i.e. partly or completely) removed and/or the useful layer 1304 or the circuit region 102s being exposed. Thinning can be carried out for example by means of a mechanical subtractive processing process, e.g. by means of grinding.

Thinning can be configured to stop at the stiffening structure 106. Illustratively, the stiffening structure 106 can form a mechanical barrier vis-à-vis thinning, e.g. vis-à-vis the subtractive processing process. Exact stopping of the thinning can thus be achieved. By means of varying the depth 116v of the depression 106v, it is possible to set the thickness of the remaining semiconductor wafer (e.g. of the circuit region 102s).

The method can optionally include, in 1700c, removing the stiffening structure cover 306 (if present) and/or the filling body 402 (if present) from the stiffening structure 106, e.g. individually or as an interconnected unit.

The method can optionally include, in 1700c, subsequently processing the semiconductor wafer 102, 202. Processing may include at least one of the following: chemical processing (e.g. cleaning, doping, etching, implanting, reacting, etc.); thermal processing (e.g. irradiating, heating, cooling, melting, solidifying, etc.); and/or mechanical processing (e.g. machining, grinding, polishing, milling, sawing, dividing, etc.). Processing may include, for example, processing, e.g. heat treating, the first main processing side 102t and/or depositing one or a plurality of layers on the first main processing side 102t.

Alternatively or additionally, the method may include, in 1700c, carrying out a measuring process. By way of example, the method may include, in 1700c, electrically testing the at least one electronic circuit 104, e.g. as described above.

Figure 18A:
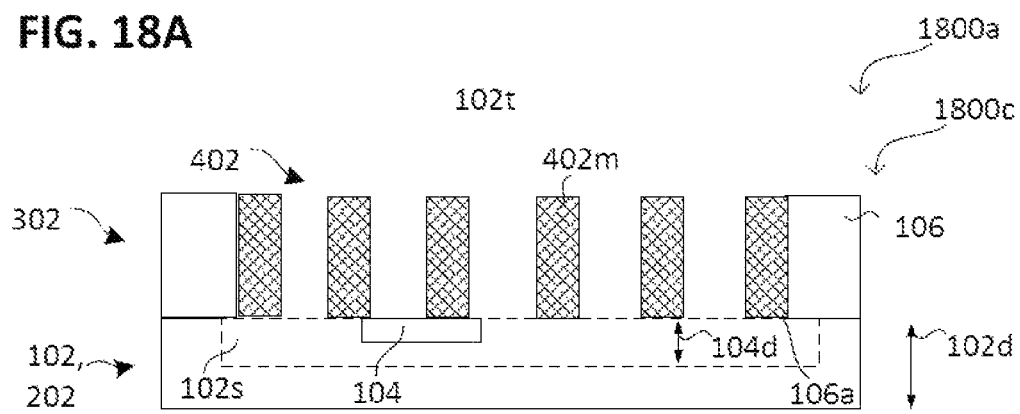
FIGS. 18A and 18B in each case show a semiconductor wafer in a method in accordance with various embodiments in a schematic side view or cross-sectional view.
Figure 18B:
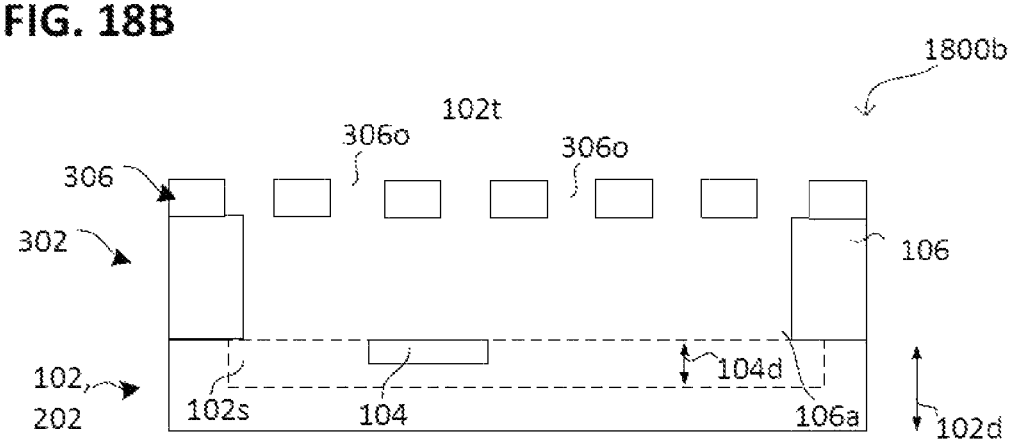

FIG. 18A and FIG. 18B illustrate in each case a semiconductor wafer 102, 202 in a method in accordance with various embodiments in a schematic side view or cross-sectional view, e.g. the first semiconductor wafer 102 and/or the second semiconductor wafer 202.

The method may include, in 1800a, forming a filling body 402 including a plurality of columns and/or a lattice. By way of example, the filling body 402 may include a multiplicity of cavities that penetrate through the filling body 402. The filling body 402 may include for example a multiplicity of columns, e.g. a network of interconnected columns.

The method may include, in 1800b, forming a stiffening structure cover 306 having a plurality of openings 306o and/or a lattice. By way of example, the stiffening structure cover 306 can have a multiplicity of openings 306o that penetrate through the stiffening structure cover 306. Alternatively or additionally, the stiffening structure cover 306 can have a multiplicity of struts, e.g. a network of interconnected struts. In order to prevent dust from penetrating into the cutout 106a through the openings 306o, optionally a filling body 402 can be arranged in the cutout 106a, said filling body being connected to the stiffening structure 106 in a dust-tight fashion (e.g. without gaps).

Figure 18C:
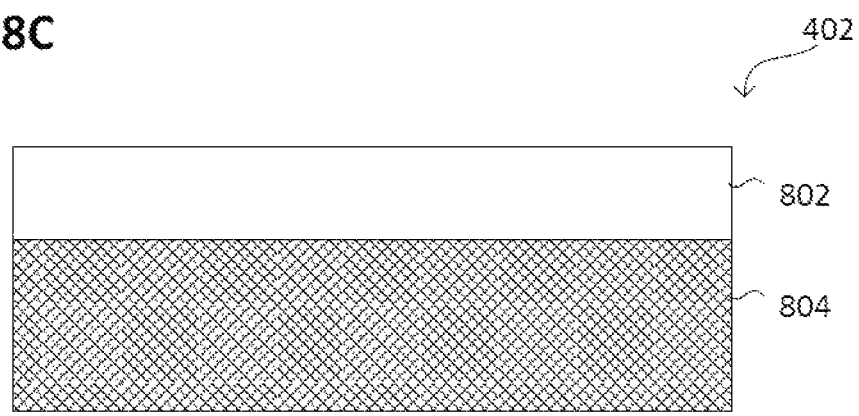
FIG. 18C shows a filling body in a method in accordance with various embodiments in a schematic side view or cross-sectional view.

FIG. 18C illustrates a filling body 402 in a method in accordance with various embodiments in a schematic side view or cross-sectional view.

In accordance with various embodiments, the filling body 402 may include or be formed from a laminate. The laminate may include or be formed from a plurality (two or more) of layers 802, 804. The plurality of layers 802, 804 can be connected to one another, e.g. non-releasably cohesively (e.g. monolithically) or releasably cohesively (e.g. in an adhesively bonded manner).

A first layer 802 of the laminate can have a greater hardness and/or a greater modulus of elasticity than a second layer 804 of the laminate. The second layer 804 of the laminate can be brought into physical contact with the circuit region 102s or at least with the at least one electronic circuit 104. Illustratively, the first layer 802 can be a carrier layer and the second layer 804 can be an elastic absorber layer. The second layer 804 may include or be formed from, for example, a polymer, e.g. an elastomer.

By way of example, the first layer 802 may include or be formed from a material of the following materials: a metal; a transition metal, an oxide (e.g. a metal oxide or a transition metal oxide); a dielectric; a polymer (e.g. a carbon-based polymer or a silicon-based polymer); a ceramic (e.g. an oxynitride; a nitride; a carbide and/or a glass or vitreous material); a semimetal (e.g. carbon); a semiconductor; a semiconductor oxide; a semi-organic material, and/or an organic material.

FIG. 19A, FIG. 19B and FIG. 19C illustrate in each case a semiconductor wafer in a method in accordance with various embodiments in a schematic side view or cross-sectional view (e.g. with a direction of view along a main processing side 102t, 102b), e.g. the first semiconductor wafer 102 and/or the second semiconductor wafer 202.

The method may include, in 1900a, providing the semiconductor wafer 102, 202. The semiconductor wafer 102, 202 may include a first main processing side 102t (illustratively a front side) and a second main processing side 102b (illustratively a rear side). The second main processing side 102b and the first main processing side 102t can be mutually opposite sides of the semiconductor wafer 102, 202.

The semiconductor wafer 102, 202 may include at least one circuit region 102s, in which at least one electronic circuit 104 is formed, on the first main processing side 102t.

The semiconductor wafer 102, 202 can furthermore include an edge region 102r, which at least partly surrounds the circuit region 102s. By way of example, the edge region 102r can be extended around the circuit region 102s in a ring-shaped fashion. Optionally, the edge region 102r can extend from the first main processing side 102t to the second main processing side 102b.

The semiconductor wafer 102, 202 can furthermore include a sacrificial layer 1902, which adjoins e.g. the circuit region 102s and/or is surrounded e.g. in sections by the edge region 102r.

The edge region 102r and the circuit region 102s can be connected to one another for example monolithically (e.g. integrally).

Providing the semiconductor wafer 102, 202 may include for example: forming a sacrificial layer 1902 in or above a substrate 1302 (e.g. including e.g. a semiconductor region which is intended to be at least partly removed later); and forming the circuit region 102s above the sacrificial layer 1902.

By way of example, the circuit region 102s may include or be formed from an epitaxially formed material (e.g. the semiconductor material 1202). The material need not necessarily be formed epitaxially. The epitaxial material makes it possible that an epitaxial layer-based electronic circuit 104 can be formed in the circuit region.

The method may include, in 1900b: forming a stiffening structure 106, which at least partly surrounds the at least one circuit region 102s. The stiffening structure 106 can be configured for stiffening the semiconductor wafer 102, 202. By way of example, the stiffening structure 106 can have a thickness 106d (also referred to as vertical spatial extent 106d) which is greater than a thickness 102d of the semiconductor wafer 102 before the formation of the stiffening structure 106 (e.g. the edge region 102r thereof). Alternatively or additionally, the stiffening structure 106 can have a thickness 106d (more generally a vertical extent 106d) which is greater than a thickness 104d of the circuit region 102s.

Forming the stiffening structure 106 may include joining together the stiffening structure 106 and the edge region 102r of the first semiconductor wafer 102, e.g. by means of a cohesive connection. By way of example, a non-releasable connection can be formed between the stiffening structure 106 and the edge region 102r of the second semiconductor wafer 102, e.g. by means of anodic bonding or by means of laser beam welding. Alternatively, a releasable connection can be formed (e.g. if the stiffening structure 106 is intended to be detached again nondestructively), as described above.

In accordance with various embodiments, the stiffening structure 106 can be extended along a closed path. By way of example, the stiffening structure 106 can be formed in a ring-shaped fashion (also referred to as support ring 106). Illustratively, the stiffening structure 106 can be arranged on a front side 102t of the semiconductor wafer 102 (e.g. including or formed from a front-side support ring 106).

In accordance with various embodiments, the stiffening structure 106 can have a thickness 106d of greater than approximately 200 μm (micrometres), e.g. greater than approximately 300 μm, e.g. greater than approximately 400 μm, e.g. greater than approximately 500 μm, e.g. greater than approximately 600 μm, e.g. greater than approximately 700 μm. Alternatively or additionally, the semiconductor wafer 102 including the stiffening structure 106 can have a thickness 106d, 102d (i.e. the sum of thickness 106d and thickness 102d) of greater than approximately 500 μm, e.g. greater than approximately 600 μm, e.g. greater than approximately 700 μm, e.g. greater than approximately 800 μm, e.g. greater than approximately 900 μm, e.g. greater than approximately 1000 μm.

The stiffening structure 106 can have a cutout 106a at least above part of the at least one circuit region 102s. The cutout 106a can expose the part of the circuit region 102s. In other words, the cutout 106a can extend through the stiffening structure 106. By way of example, the cutout 106a can be at least partly surrounded (i.e. partly or completely) by a section of the stiffening structure 106, e.g. by a ring-shaped section of the stiffening structure 106 (e.g. by a support ring 106).

The method may include, in 1900c: thinning the semiconductor wafer 102, including the stiffening structure 106, from the second main processing side 102b. The thickness 106d, 102d of the semiconductor wafer 102 (including the stiffening structure 106) can be reduced by means of thinning, e.g. over the entire lateral extent 106l of the semiconductor wafer 102, 202. By way of example, the circuit region 102s can be exposed by means of thinning.

Thinning may include at least partly separating the edge region 102r and/or the rear side of the semiconductor wafer 102, 202 (e.g. separating a layer from the semiconductor wafer 102, 202, also referred to as exfoliation), e.g. at least part of the substrate 1302 or the substrate 1302 completely. In other words, thinning the semiconductor wafer 102, 202 from the second main processing side 102b can also be understood to mean that part of the wafer is separated. In general, thinning the semiconductor wafer 102, 202 may include removing material therefrom, e.g. from that main processing side of the semiconductor wafer 102, 202 which is processed by means of thinning.

Forming the sacrificial layer 1902 in 1900a may include depositing a sacrificial material above the substrate 1302 or implanting the substrate 1302. By way of example, the method may include, in 1900a, forming a (buried) sacrificial layer 1902 in the semiconductor wafer 102, 202. The sacrificial layer 1902 can optionally be in physical contact with the circuit region 102s. This can make it possible to bring about the thinning of the semiconductor wafer 102 (e.g. by means of etching or mechanical separation), at the sacrificial layer 1902. In other words, the semiconductor wafer 102, 202 may include a sacrificial layer 1902 at which thinning (e.g. etching or separating) is carried out.

In accordance with various embodiments, the sacrificial layer 1902 can have a lower (e.g. thermal, mechanical and/or chemical) resistance to thinning than the circuit region 102s and/or than the substrate 1302 and optionally than the stiffening structure 106 and/or than the edge region 102r.

By way of example, the sacrificial layer 1902 can have more voids (e.g. cavities), or at least a larger proportion of its volume that is high, than the circuit region 102s and/or than the substrate 1302 and optionally than the stiffening structure 106 and/or than the edge region 102r. By way of example, the sacrificial layer 1902 can have a greater porosity than the circuit region 102s and/or than the substrate 1302 and optionally than the stiffening structure 106 and/or than the edge region 102r. In accordance with various embodiments, porosity can be understood to be a dimensionless measurement variable that denotes the ratio of void volume to total volume of a material, region or section. By way of example, the sacrificial layer 1902 may include or be formed from porous silicon.

By way of example, a porosity of the sacrificial layer 1902 (i.e. the volume of voids in the sacrificial layer 1902 to the volume of the sacrificial layer 1902) can be less than approximately 50% (e.g. less than approximately 25%, e.g. less than approximately 10%, e.g. less than approximately 5%, e.g. less than approximately 1%) and/or greater than approximately 10%, e.g. greater than approximately 25%, e.g. greater than approximately 50%.

The sacrificial layer 1902, e.g. the chemical composition and/or physical structure thereof, can be configured in such a way that the sacrificial layer 1902 has a lower resistance to thinning (e.g. by means of a mechanical force or by means of an etchant) than the circuit region 102s and/or than the substrate 1302 and optionally than the stiffening structure 106 and/or than the edge region 102r.

The resistance of the sacrificial layer 1902 can be for example less than approximately 75% (e.g. less than approximately 50%, e.g. less than approximately 25%, e.g. less than approximately 5%, e.g. less than approximately 1%, e.g. less than approximately 0.1%, e.g. less than approximately 0.01%, e.g. less than approximately 0.001%, e.g. less than approximately 0.0001%) of the resistance of the circuit region 102s and/or of the substrate 1302 and optionally of the stiffening structure 106 and/or of the edge region 102r. By way of example, the selectivity between porous silicon (e.g. in the sacrificial layer 1902) and monocrystalline silicon (e.g. in the substrate and/or in the circuit region 102s) can differ by a factor of $10^{-5}$. A similar difference in selectivity can be achieved between silicon dioxide ($SiO_2$) (e.g. in the sacrificial layer 1902) and silicon (e.g. in the substrate and/or in the circuit region 102s), e.g. with the use of hydrofluoric acid (HF) as processing fluid. The selectivity can represent the speed at which e.g. the etching of a region or material is carried out. To put it more generally, a large selectivity can describe the fact that a specific chemical reaction may takes place. The selectivity can be indirectly proportional to the resistance.

By way of example, the sacrificial layer 1902 can have a lower mechanical hardness, lower breaking force, lower tensile strength, greater chemical reactivity and/or greater roughness (e.g. on account of a porous surface) than the circuit region 102s and/or than the substrate 1302 and optionally than the stiffening structure 106 and/or than the edge region 102r. At least one of the chemical reactivity, roughness, dopant concentration, defect density, porosity and/or softness (corresponds to the inverse hardness) of the sacrificial layer 1902 can be less than approximately 75% (e.g. less than approximately 50%, e.g. less than approximately 25%, e.g. less than approximately 5%, e.g. less than approximately 1%, e.g. less than approximately 0.1%, e.g. less than approximately 0.01%, e.g. less than approximately 0.001%, e.g. less than approximately 0.0001%) of the corresponding chemical reactivity, roughness, dopant concentration, defect density, porosity and/or softness of the circuit region 102s and/or of the substrate 1302 and optionally of the stiffening structure 106 and/or of the edge region 102r.

In accordance with various embodiments, thinning may include chemically separating the circuit region 102s and the substrate 1302 from one another (e.g. by means of chemical exfoliation). In other words, thinning can be carried out by severing the semiconductor wafer 102, 202 along the sacrificial layer 1902.

Thinning can be carried out for example by eroding the sacrificial layer 1902, e.g. by means of thermal eroding (e.g. laser beam processing, plasma etching), chemical eroding (e.g. etching), waterjet cutting and/or electrochemical eroding (e.g. electroeroding). Thinning can be carried out for example by at least partly removing the sacrificial layer 1902 by means of an etchant. A connection of the substrate 1302 and of the circuit region 102s can thus be chemically dissolved.

As an alternative or in addition (to chemical separation), thinning may include mechanically separating the circuit region 102s and the substrate 1302 from one another (e.g. by means of mechanical exfoliation), e.g. by means of splitting, cracking or breaking. By way of example, thinning can be carried out by exerting on the substrate 1302 a mechanical force 1901 that is directed away from the circuit region 102s. What can thus be achieved is that the sacrificial layer 1902 mechanically fails and the connection of the substrate 1302 and of the circuit region 102s is cancelled. The mechanical force 1901 can be greater than the breaking force (or relative to area greater than the tensile strength) of the sacrificial layer 1902.

Optionally, the method may include, in 1900b: forming a filling body 402 in the cutout 106a; and/or forming a stiffening structure cover 306 above the cutout 106a, as described above.

Optionally, the method may include, in 1900c: removing residues of the sacrificial layer 1902 (if present) from the semiconductor wafer 102, 202 (which includes the circuit region 102s), e.g. by means of etching.

In accordance with various embodiments, a method and a protective cover are provided which simplify the processing of one semiconductor wafer or a plurality of semiconductor wafers. Illustratively, the contact between a circuit region of the semiconductor wafer, in which one or each electronic circuit (also referred to as semiconductor circuit or integrated circuit) is arranged, and an adhesive can be substantially avoided, e.g. by a ring-shaped stiffening structure being arranged between the planar carrier and the or each circuit. The stiffening structure can illustratively be configured as a spacer, such that contact between the planar carrier and/or between an adhesive and the or each circuit can be avoided.

In accordance with various embodiments, an additional stiffening effect can be provided by using a filling body which additionally supports the circuit region that is hollow on account of the spacer. The filling body can illustratively provide an areal stiffening effect that exerts as little force as possible on the circuit region. By way of example, the circuit region can be or remain free of an adhesive. In other words, the filling body can mechanically couple the circuit region to the planar carrier.

In accordance with various embodiments, the provided method and/or the protective cover can make it possible to reuse the components used for stiffening, such that the required material outlay is reduced and/or the processing of a plurality of semiconductor wafers is facilitated. By way of example, costs (e.g. stock-keeping costs and/or production costs) can be saved as a result.

In accordance with various embodiments, an, e.g. reusable, protective cover and/or an, e.g. reusable, stiffening structure can be provided, which can simplify the processing of one semiconductor wafer or a plurality of semiconductor wafers and can save costs.

In accordance with various embodiments, a method may include processing a semiconductor wafer including a first main processing side and a second main processing side, which is situated opposite the first main processing side; wherein the semiconductor wafer includes at least one circuit region having at least one electronic circuit on the first main processing side. In accordance with various embodiments, a method for processing the semiconductor wafer may include: forming a stiffening structure, which at least partly surrounds the at least one circuit region and which stiffens the semiconductor wafer, wherein the stiffening structure has a cutout at least above part of the at least one circuit region; thinning the semiconductor wafer, including the stiffening structure, from the second main processing side.

Thinning the semiconductor wafer may include removing material therefrom, i.e. from the main processing side of the semiconductor wafer that is processed by means of the thinning. By way of example, thinning the semiconductor wafer may include separating the semiconductor wafer on the second main processing side, e.g. by means of dividing, by means of eroding and/or by means of machining.

In accordance with various embodiments, a method may include processing a semiconductor wafer including a first main processing side and a second main processing side, which is situated opposite the first main processing side. The semiconductor wafer includes at least one circuit region having at least one electronic circuit on the first main processing side. In accordance with various embodiments, a method for processing the semiconductor wafer may include: forming a stiffening structure, which at least partly surrounds the at least one circuit region and which stiffens the semiconductor wafer, wherein the stiffening structure has a cutout at least above part of the at least one circuit region; thinning the semiconductor wafer, including the stiffening structure, by removing material from the second main processing side of the semiconductor wafer.

In accordance with various embodiments, a method may include processing a first semiconductor wafer and a second semiconductor wafer, each semiconductor wafer of which includes the following: a first main processing side and a second main processing side, which is situated opposite the first main processing side; and a circuit region having at least one electronic circuit on the first main processing side. In accordance with various embodiments, the method may include: forming a stiffening structure, which at least partly (i.e. partly or completely) surrounds the at least one circuit region of the first semiconductor wafer and which stiffens the first semiconductor wafer, wherein the stiffening structure has a cutout at least above part of the at least one circuit region of the first semiconductor wafer; processing the first semiconductor wafer; removing the stiffening structure from the first semiconductor wafer; and stiffening the second semiconductor wafer by means of the stiffening structure.

In accordance with various embodiments, a method may include processing a semiconductor wafer including a first main processing side and a second main processing side, which is situated opposite the first main processing side; wherein the semiconductor wafer includes at least one circuit region having at least one electronic circuit on the first main processing side. In accordance with various embodiments, a method for processing the semiconductor wafer may include: forming a protective cover above the circuit region, wherein the protective cover at least above part of the at least one circuit region has a cutout that is open towards the circuit region in such a way that a cavity is formed between the protective cover and the circuit region; processing the semiconductor wafer, including the protective cover, from the second main processing side.

In accordance with various embodiments, a method may include processing a semiconductor wafer including a first main processing side and a second main processing side, which is situated opposite the first main processing side; wherein the semiconductor wafer includes a circuit region having at least one electronic circuit on the first main processing side. In accordance with various embodiments, a method for processing the semiconductor wafer may include: forming a protective cover above the circuit region, wherein the protective cover has a cutout at least above part of the at least one circuit region, said cutout being opened towards the circuit region; sealing the cutout in a dust-tight fashion (e.g. in a vacuum-tight fashion) by means of a closure; processing the semiconductor wafer, including the protective cover, from the second main processing side.

Sealing the cutout can be carried out by means of a filling body which is arranged in the cutout, and/or by means of a stiffening structure cover which is arranged above the cutout.

In accordance with various embodiments, the closure can be formed by the cutout being covered by means of a stiffening structure cover (at a distance from the circuit region); and/or by a filling body being arranged in the cutout.

Forming the protective cover may include: closing the cutout in a dust-tight fashion by a filling body being formed in the cutout and/or by the cutout being covered by means of a stiffening structure cover.

Closed in a dust-tight fashion can be understood to mean that optionally although gas can penetrate into the cutout, substantially no solid material, e.g. in the form of dust, can penetrate into the cutout. Contamination can thus be prevented. Dust can be understood as extremely fine solid particles (particles of solid material) which can be suspended in a gas, e.g. in a manner swirled up in the air, e.g. having a particle size in a range of approximately 0.1 μm (micrometre) to approximately 10 μm. Optionally, the cutout can also be closed in a gas-tight fashion, such that e.g. no gas can penetrate either.

In accordance with various embodiments, the method can furthermore include: forming a filling body in the cutout, which filling body is in physical contact with the circuit region and differs from the stiffening structure. Alternatively or additionally, the method may include: forming a stiffening structure cover above the cutout, wherein the stiffening structure is arranged between the stiffening structure cover and the circuit region.

In accordance with various embodiments, the filling body can have at least one of the following: a lower modulus of elasticity than the stiffening structure; a lower bulk modulus than the stiffening structure; a lower shear strength than the stiffening structure; a lower viscosity than the stiffening structure; a lower density than the stiffening structure; a lower hardness than the circuit region; and/or a greater porosity than the stiffening structure.

In accordance with various embodiments, forming the filling body may include arranging a material in the cutout, which material can have at least one of the following: a lower modulus of elasticity than the stiffening structure; a lower bulk modulus than the stiffening structure; a lower shear strength than the stiffening structure; a lower viscosity than the stiffening structure; a lower density than the stiffening structure; a lower hardness than the circuit region; and/or a greater porosity than the stiffening structure.

In accordance with various embodiments, forming the filling body may include introducing a material into the cutout and/or solidifying said material therein while the semiconductor wafer includes the stiffening structure.

In accordance with various embodiments, the material can be introduced into the cutout through an opening of the stiffening structure cover.

In accordance with various embodiments, the material can be introduced into the cutout through an opening of the stiffening structure.

In accordance with various embodiments, the material can be introduced into the cutout through an opening between the stiffening structure and the stiffening structure cover.

In accordance with various embodiments, forming the filling body may include introducing a deformable sleeve into the cutout, which is deformed therein by means of the material.

In accordance with various embodiments, forming the filling body may include introducing a separating layer into the cutout, which is arranged between the material and the circuit region. As an alternative or in addition to the separating layer, it is possible for example to form a reversible protective layer above the circuit region. The separating layer and/or the protective layer can have a sufficient thermal stability with respect to subsequent processes.

In accordance with various embodiments, the material may include a fluid and/or be viscous. In accordance with various embodiments, a fluid can be understood as a gaseous material (i.e. a gas) and/or as a liquid material (i.e. a liquid), e.g. a mixture thereof (e.g. an aerosol). The fluid can have a viscosity, e.g. a lower viscosity than the circuit region (or more generally a lower viscosity than a solid), e.g. of less than $10^6$ pascal·seconds.

In accordance with various embodiments, the material may include a propellant and/or a gas, for example dissolved in the fluid.

In accordance with various embodiments, forming the filling body may include adapting the filling body to a topography of the circuit region. The adapting can be carried out for example by introducing the filling body in a fluid and/or viscous state into the cutout and curing it therein. Alternatively or additionally, the adapting can be carried out for example by the filling body being deformed mechanically by means of the topography (e.g. by one or more pores of the filling body collapsing). By way of example, the filling body can be deformed and/or compressed under a smaller force than the circuit region. Alternatively or additionally, the filling body may include or be formed from a compressible material, e.g. a more or more easily compressible material than the circuit region.

In accordance with various embodiments, the filling body may include or be formed from a laminate.

In accordance with various embodiments, the filling body may include or be formed from a polymer.

In accordance with various embodiments, the filling body can have a thermal stability of 400° C. or more.

In accordance with various embodiments, the filling body can have a thermal stability of 900° C. or more.

In accordance with various embodiments, the filling body (e.g. the separating layer thereof) and/or the protective layer can have a lower adhesion (e.g. adhesion force, e.g. adhesive force) to the circuit region than the stiffening structure to the circuit region.

Adhesion can be understood to mean the adhesion force (also referred to as force of adhesion) between two contact areas, e.g. between two different or identical structures (e.g. a layer or a region), conveyed by molecular forces. The structures can be in a solid state or in a liquid state. In association with an adhesive, adhesion can be understood to mean the adhesion of the adhesive at a contact area or between two contact areas (e.g. the joining part surfaces). In other words, the adhesion can be understood to mean the adhesion effect. The magnitude of the adhesion can be influenced by the size of the contact areas, the topographical constitution thereof and/or the chemical composition thereof. A greater adhesion can result in a greater adhesion force (normalized to the size of the contact area), e.g. a greater adhesive force. The adhesion force can be determined by a tensile test (by both structures being pulled apart from one another) and can be normalized, if appropriate, to the area in contact, such that this is comparable.

In accordance with various embodiments, the filling body (e.g. the separating layer thereof) and/or the protective layer can have a lower adhesion (e.g. adhesion force, e.g. adhesive force) to the circuit region than the stiffening structure to the stiffening structure cover.

In accordance with various embodiments, the filling body (e.g. the separating layer thereof) and/or the protective layer can be free of an adhesion (e.g. adhesion force, e.g. adhesive force) to the circuit region.

In accordance with various embodiments, forming the stiffening structure may include joining together the stiffening structure and the circuit region while the filling body is secured on the stiffening structure.

In accordance with various embodiments, forming the stiffening structure cover may include joining together the stiffening structure cover and the stiffening structure while the filling body is secured on the stiffening structure cover.

In accordance with various embodiments, the stiffening structure cover can have a projection which extends into the cutout.

In accordance with various embodiments, forming the stiffening structure cover may include connecting the stiffening structure and the stiffening structure cover to one another.

In accordance with various embodiments, the method can furthermore include: removing (and/or detaching) the stiffening structure cover from the stiffening structure; and processing an additional semiconductor wafer including the stiffening structure cover.

In accordance with various embodiments, the method can furthermore include: extracting the filling body from the cutout; and introducing the filling body into a cutout of an additional semiconductor wafer (also referred to as second semiconductor wafer).

In accordance with various embodiments, the stiffening structure cover may include a semiconductor and/or a ceramic, and/or a polymer, e.g. a mixture of a plurality of polymers.

In accordance with various embodiments, the ceramic and/or the circuit region may include the semiconductor.

In accordance with various embodiments, the stiffening structure cover can be formed by converting a ceramic-forming polymer into the ceramic.

In accordance with various embodiments, a coefficient of thermal expansion of the stiffening structure cover can be in a range of approximately 50% to approximately 150% of a coefficient of thermal expansion of the circuit region.

In accordance with various embodiments, forming a stiffening structure cover may include forming a nondestructively releasable connection between the stiffening structure cover and the stiffening structure. The nondestructively releasable connection (also referred to as reversible connection or releasable connection) can be formed for example by means of an adhesive or by means of a magnetic force.

In accordance with various embodiments, forming a stiffening structure cover may include connecting the stiffening structure cover and the stiffening structure to one another by means of a light-sensitive adhesive, by means of a thermo-sensitive adhesive and/or by means of a positively locking engagement.

In accordance with various embodiments, the adhesive can be configured as releasable by means of light and/or heat. By way of example, the adhesive can have a lower conversion light intensity (at a conversion light wavelength) and/or a lower conversion temperature than the circuit region and/or than the stiffening structure.

In accordance with various embodiments, forming the stiffening structure may include connecting the stiffening structure and the circuit region to one another (e.g. cohesively), e.g. by means of an adhesive, by means of anodic bonding and/or by means of laser beam welding. The anodic bonding and/or the laser beam welding can form a non-releasable connection. The welding can be carried out by means of local supply of heat, e.g. until the local melting of the stiffening structure and/or of the circuit region, and can optionally include exerting an additional force action (pressure) thereon which presses the stiffening structure and the circuit region against one another. The bonding can be carried out by means of a chemical reaction between the stiffening structure and the circuit region which is initiated by electrostatically charging them (oppositely). Optionally, the stiffening structure and/or the circuit region can be heated, e.g. to a temperature below a melting point of the stiffening structure and/or of the circuit region, e.g. below a temperature at which the chemical reaction would not begin independently (without electrostatic charging).

A cohesive connection can be understood as a connection in which the connection partners are held together by atomic or molecular forces. The cohesive connection can be a non-releasable connection (also referred to as irreversible connection), i.e. one which can be cancelled only by destruction of the connection partners. The cohesive connection may include: bonding, welding and/or adhesive bonding. By way of example, a non-releasable connection can be formed by means of a chemisorption.

In accordance with various embodiments, the non-releasable cohesive connection may include or be formed from an atomic-cohesive connection, i.e. can be held together by means of atomic forces (e.g. by means of chemical bonds between the connection partners), e.g. by means of strong atomic forces (such as, for example, in the case of a chemisorption).

In accordance with various embodiments, the stiffening structure and the circuit region can be cohesively connected to one another.

In accordance with various embodiments, the stiffening structure and the circuit region are monolithically (e.g. integrally) connected to one another.

In accordance with various embodiments, thinning can be carried out by means of eroding and/or by means of machining.

In accordance with various embodiments, thinning can be carried out by means of etching and/or by means of grinding.

In accordance with various embodiments, the semiconductor wafer can furthermore include an etch stop layer, at which the etching stops.

In accordance with various embodiments, the stiffening structure can have a depression surrounding the cutout; and the circuit region can be arranged at least partly in the depression.

In accordance with various embodiments, thinning may include or be formed from mechanical processing that stops at the stiffening structure. By way of example, the stiffening structure can have a greater (e.g. mechanical) resistance to the thinning (e.g. a greater mechanical hardness) than at least the circuit region.

In accordance with various embodiments, the stiffening structure can have a greater extent than the circuit region along the main processing side (or along a lateral direction) and/or transversely with respect to the main processing side (or along a vertical direction).

In accordance with various embodiments, the stiffening structure can have a greater extent than the circuit region along a first direction transversely with respect to an interface between the stiffening structure and the circuit region and/or along a second direction parallel to the interface.

In accordance with various embodiments, the circuit region and/or the stiffening structure may include or be formed from silicon (Si) or silicon carbide (SiC) or gallium nitride (GaN).

In accordance with various embodiments, the stiffening structure can have at least one opening which extends from the cutout (away from the latter) through a section of the stiffening structure.

In accordance with various embodiments, the stiffening structure may include or be formed from a plurality of segments. Mutually adjacent segments of the plurality of segments can be at a distance from one another, for example.

In accordance with various embodiments, a coefficient of thermal expansion of the stiffening structure can be in a range of approximately 50% to approximately 150% of a coefficient of thermal expansion of the circuit region.

In accordance with various embodiments, the stiffening structure may include or be formed from a semiconductor and/or a ceramic.

In accordance with various embodiments, the ceramic and/or the circuit region may include or be formed from the semiconductor.

In accordance with various embodiments, the stiffening structure can be formed by converting a ceramic-forming polymer into the ceramic.

In accordance with various embodiments, the method can furthermore include: removing (and/or detaching) the stiffening structure from the semiconductor wafer; and processing an additional semiconductor wafer including the stiffening structure cover.

In accordance with various embodiments, the stiffening structure can have a greater thickness than 200 µm and/or than the circuit region; and/or the semiconductor wafer including the stiffening structure can have a thickness of greater than 500 µm.

In accordance with various embodiments, the semiconductor wafer may include or be formed from a substrate and a material formed epitaxially thereon or at least thereabove in the circuit region, e.g. on which the stiffening structure is formed. The material need not necessarily be formed epitaxially. Optionally, an etch stop layer and/or a sacrificial layer can be formed between the substrate and the material.

In accordance with various embodiments, thinning may include exposing the material formed epitaxially.

In accordance with various embodiments, the material formed epitaxially can be formed as a layer (also referred to as a useful layer or an epitaxial layer). The layer may include the circuit region. In accordance with various embodiments, at least one semiconductor component can be formed in the layer including the material formed epitaxially on the substrate.

In accordance with various embodiments, the at least one electronic circuit may include or be formed from one semiconductor component or a plurality of semiconductor components. The plurality of semiconductor components can be interconnected with one another, for example.

In accordance with various embodiments, thinning may include exposing the at least one electronic circuit.

In accordance with various embodiments, while the second wafer is processed, the stiffening structure can at least partly surround the at least one circuit region of the second semiconductor wafer, wherein the stiffening structure has the cutout at least above part of the at least one circuit region of the second semiconductor wafer.

In accordance with various embodiments, the protective cover may include the stiffening structure and the stiffening structure cover, wherein the cutout includes a through opening in the stiffening structure (which adjoins e.g. the stiffening structure cover).

In accordance with various embodiments, the stiffening structure cover and the stiffening structure can be monolithically connected to one another.

In accordance with various embodiments, the protective cover can bear only on an edge region of the semiconductor wafer, wherein the edge region surrounds the circuit region, e.g. exclusively on the edge region of the semiconductor wafer.

In accordance with various embodiments, a protective cover for covering a circuit region of a semiconductor wafer may include the following: a stiffening structure, through which a cutout penetrates; and a stiffening structure cover configured for covering the cutout in such a way that the protective cover and the semiconductor wafer joined together form a dust-tight cavity; and/or a filling body arranged in the cutout.

In accordance with various embodiments, a protective cover for covering a circuit region of a semiconductor wafer may include the following: a stiffening structure, through which a cutout penetrates; and a stiffening structure cover and/or a filling body, wherein the stiffening structure cover is configured for covering the cutout in such a way that the protective cover and the semiconductor wafer joined together delimit a dust-tight cavity; wherein the filling body is configured for insertion into the cutout in such a way that the cutout is sealed by means of the filling body when the protective cover and the semiconductor wafer are joined together.

In accordance with various embodiments, a protective cover for covering a circuit region of a semiconductor wafer may include the following: a stiffening structure, through which a cutout penetrates in such a way that the protective cover and the semiconductor wafer joined together form a cavity; and a closure configured for sealing the cavity in a dust-tight fashion (at a cavity closure).

The closure may include a stiffening structure cover configured for covering the cutout in such a way that the protective cover and the semiconductor wafer joined together form a dust-tight cavity. Alternatively or additionally, the closure may include a filling body configured for insertion into the cutout in such a way that, having been inserted into the cutout, said filling body seals said cutout in a dust-tight fashion.

In accordance with various embodiments, the closure can have a lower adhesion (e.g. adhesion force, e.g. adhesive force) to the circuit region than the stiffening structure to the circuit region.

In accordance with various embodiments, the closure can have a lower adhesion (e.g. adhesion force, e.g. adhesive force) to the circuit region than the stiffening structure to the stiffening structure cover.

In accordance with various embodiments, the closure can be free of an adhesion to the circuit region.

In accordance with various embodiments, it is possible to configure a method for processing a semiconductor wafer including the following: a first main processing side and a second main processing side, which is situated opposite the first main processing side; wherein the semiconductor wafer includes at least one circuit region having at least one electronic circuit on the first main processing side. The method may include the following: forming a stiffening structure, which at least partly surrounds the at least one circuit region and which stiffens the semiconductor wafer, wherein the stiffening structure has a cutout at least above part of the at least one circuit region; forming a filling body in the cutout, which filling body is in physical contact with the circuit region and differs from the stiffening structure; and thinning the semiconductor wafer, including the stiffening structure and the filling body, from the second main processing side.

In accordance with various embodiments, the filling body can differ from the stiffening structure and/or from the stiffening structure cover in at least a chemical composition, a density, a porosity and/or a gas proportion.

In accordance with various embodiments, forming the filling body may include introducing a material into the cutout and/or foaming said material therein while the semiconductor wafer includes the stiffening structure. Foaming can be carried out by means of a propellant, for example. Alternatively or additionally, foaming can be carried out by a gas being fed to (mixed with) the material in the cutout, and/or by the material admixed with a gas in the cutout being relaxed (i.e. introduced at an elevated pressure and/or outgassing therein). A porous filling body can be formed by means of the foaming.

In accordance with various embodiments, a porous filling body can reduce a mechanical loading on the circuit region.

In accordance with various embodiments, an adhesion force of the filling body (e.g. to the stiffening structure and/or to the stiffening structure cover) can be less than a weight force of the filling body. A mechanical loading on the circuit region can thus be reduced.

In accordance with various embodiments, a weight force of the filling body can be less than a weight force of the stiffening structure and/or of the stiffening structure cover. A mechanical loading on the circuit region can thus be reduced.

In accordance with various embodiments, the semiconductor wafer (e.g. the useful layer thereof) may include an edge region which surrounds the circuit region.

In accordance with various embodiments, the stiffening structure cover can be arranged at a distance from the circuit region. Alternatively or additionally, the filling body can be adapted to a topography of the circuit region.

In accordance with various embodiments, a method may include: forming a semiconductor wafer including a useful layer and a stiffening structure, wherein the stiffening structure and the useful layer are connected to one another; wherein the stiffening structure is arranged on a first side (also referred to as first main processing side) of the useful layer and has a cutout, wherein the cutout exposes at least part of a circuit region of the useful layer; and thinning the semiconductor wafer by processing a second side (also referred to as second main processing side) of the semiconductor wafer, wherein the second side of the semiconductor wafer and the first side of the semiconductor wafer are situated opposite one another.

In accordance with various embodiments, a method may include the following: forming a first semiconductor wafer including a first useful layer, a stiffening structure cover and a stiffening structure between them, wherein the stiffening structure is arranged between the first useful layer and the stiffening structure cover and is connected to them; wherein the stiffening structure has a cutout; wherein the cutout exposes at least part of a circuit region of the first useful layer and is covered by means of the stiffening structure cover; and processing the semiconductor wafer.

In accordance with various embodiments, the method can furthermore include: releasing the stiffening structure from the first semiconductor wafer and/or from the stiffening structure cover; and forming a second semiconductor wafer including a second useful layer by means of the stiffening structure cover and/or by means of the stiffening structure.

In accordance with various embodiments, a method may include the following: covering a circuit region of the semiconductor wafer by means of a protective cover; wherein the protective cover is arranged on a first side of the semiconductor wafer and has a cutout that is open towards the circuit region in such a way that a cavity is formed between the cover and the circuit region; and processing a second side of the semiconductor wafer including the protective cover (i.e. if the circuit region is covered by means of the cover), wherein the second side is situated opposite the first side.

In accordance with various embodiments, the at least one electronic circuit can be an integrated circuit. In accordance with various embodiments, the at least one electronic circuit may include or be formed from exactly one electronic component or a plurality of electronic components.

In accordance with various embodiments, the filling body (or the material thereof) can be free of an adhesive and/or an adhesive effect.

In accordance with various embodiments, the filling body may include a semiconductor and/or a ceramic, e.g. a foam composed thereof.

In accordance with various embodiments, the filling body may include a polymer, e.g. a foam composed thereof.

In accordance with various embodiments, the filling body may include a metal, e.g. a foam composed thereof.

In accordance with various embodiments, the filling body may include a composite material coated with an elastomer and/or with a foam.

An adhesive can be understood to mean a non-metallic material which connects the components to be connected by means of surface attachment (i.e. by means of adhesion) and its internal strength (i.e. by means of cohesion).

In accordance with various embodiments, the filling body can be removed from the cutout without any residues. This facilitates the subsequent processing and can prevent contamination with material of the filling body.

In accordance with various embodiments, the filling body can seal the cutout in a vacuum-tight fashion and/or in a dust-tight fashion. Alternatively or additionally, the stiffening structure cover can seal the cutout in a vacuum-tight fashion and/or in a dust-tight fashion.

In accordance with various embodiments, the stiffening structure and the filling body can be connected to one another in a dust-tight fashion (e.g. in a vacuum-tight fashion).

In accordance with various embodiments, the stiffening structure and the stiffening structure cover can be connected to one another in a dust-tight fashion (e.g. in a vacuum-tight fashion).

In accordance with various embodiments, the stiffening structure, the stiffening structure cover and the filling body may include a solid material.

In accordance with various embodiments, the stiffening structure and/or the stiffening structure cover can have a greater vertical extent (thickness) than the circuit region. Alternatively or additionally, the stiffening structure and/or the stiffening structure cover may include or be formed from a plate (i.e. a plate-shaped carrier), e.g. a self-supporting plate (i.e. which is not irreversibly deformed solely on account of its own weight force).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a semiconductor wafer, the semiconductor wafer comprising:
a first main processing side and a second main processing side, which is arranged opposite the first main processing side;
at least one circuit region having at least one electronic circuit on the first main processing side;

the method comprising:
- forming a stiffening structure, which at least partly surrounds the at least one circuit region and which stiffens the semiconductor wafer by physical contact with at least two opposite regions of the semiconductor wafer, wherein the stiffening structure has a cutout at least above part of the at least one circuit region;
- forming a filling body in the cutout, which is in physical contact with the circuit region and differs from the stiffening structure, wherein forming the filling body comprises adapting a shape of the filling body to a topography of the circuit region while the filling body is in the cutout;
- thinning the semiconductor wafer, comprising the stiffening structure, from the second main processing side.

2. The method of claim 1:
wherein the topography of the circuit region, to which the shape of the filling body is adapted, protrudes into the filling body.

3. The method of claim 1, further comprising:
forming a stiffening structure cover above the cutout, wherein the stiffening structure is arranged between the stiffening structure cover and the circuit region.

4. The method of claim 3,
wherein forming the filling body comprises at least one of introducing a material into the cutout while the semiconductor wafer comprises the stiffening structure or solidifying said material therein while the semiconductor wafer comprises the stiffening structure.

5. The method of claim 4,
wherein the material is introduced into the cutout at least one of through an opening of the stiffening structure cover or through an opening of the stiffening structure.

6. The method of claim 4,
wherein forming the filling body comprises introducing a deformable sleeve into the cutout, which is deformed therein by means of the material.

7. The method of claim 1,
wherein adapting the shape of the filling body comprises deforming and/or compressing the filling body.

8. The method of claim 1,
wherein the filling body at least one of comprises a laminate or has a greater porosity than the stiffening structure.

9. The method of claim 1,
wherein the filling body has a lower adhesion to the circuit region than the stiffening structure.

10. The method of claim 3, further comprising:
removing the stiffening structure cover from the stiffening structure; and
forming an additional semiconductor wafer comprising an additional circuit region by means of the stiffening structure cover.

11. The method of claim 1, further comprising:
extracting the filling body from the cutout; and
introducing the filling body into a cutout of an additional semiconductor wafer comprising an additional circuit region.

12. The method of claim 11,
wherein thinning is carried out at least one of by eroding or by machining.

13. The method of claim 1,
wherein the stiffening structure has a depression surrounding the cutout; and
wherein the circuit region is arranged at least partly in the depression.

14. The method of claim 13,
wherein thinning comprises mechanical processing that stops at the stiffening structure.

15. The method of claim 3, further comprising:
removing the stiffening structure from the semiconductor wafer; and
processing an additional semiconductor wafer comprising the stiffening structure cover.

16. The method of claim 1,
wherein the semiconductor wafer comprises a substrate and a material formed epitaxially thereon in the circuit region.

17. The method of claim 1,
wherein thinning comprises exposing the at least one electronic circuit.

18. A method for processing a semiconductor wafer, the semiconductor wafer comprising:
- a first main processing side and a second main processing side, which is situated opposite the first main processing side;
- at least one circuit region having at least one electronic circuit on the first main processing side;

the method comprising:
- forming a stiffening structure, which at least partly surrounds the at least one circuit region and which stiffens the semiconductor wafer, wherein the stiffening structure has a cutout at least above part of the at least one circuit region;
- forming a porous filling body in the cutout; and
- thinning the semiconductor wafer, comprising the stiffening structure and the filling body, from the second main processing side;
- wherein a porosity of the filling body is in a range of 5% to 95%.

19. A method for processing a first semiconductor wafer and a second semiconductor wafer,
each semiconductor wafer comprising:
- a first main processing side and a second main processing side, which is arranged opposite the first main processing side;
- at least one circuit region having at least one electronic circuit on the first main processing side;

the method comprising:
- forming a stiffening structure, which at least partly surrounds the at least one circuit region of the first semiconductor wafer and which stiffens the first semiconductor wafer, wherein the stiffening structure has a cutout at least above part of the at least one circuit region of the first semiconductor wafer;
- forming a porous filling body in the cutout;
- processing the first semiconductor wafer;
- removing the stiffening structure from the first semiconductor wafer; and
- stiffening the second semiconductor wafer by means of the stiffening structure;
- wherein a porosity of the filling body is in a range of 5% to 95%.

20. A method for processing a semiconductor wafer, the semiconductor wafer comprising:
- a first main processing side and a second main processing side, which is arranged opposite the first main processing side;
- at least one circuit region having at least one electronic circuit on the first main processing side;
the method comprising:

forming a protective cover above the circuit region, wherein the protective cover has a cutout at least above part of the at least one circuit region, said cutout being opened towards the circuit region;

sealing the cutout in a dust-tight fashion by means of a closure, wherein the closure is formed by a filling body being arranged in the cutout, wherein the filling body is adapted to a topography of the circuit region;

processing the semiconductor wafer, comprising the protective cover from the second main processing side;

wherein the closure is further formed by the cutout being covered by a stiffening structure cover; and/or wherein a porosity of the filing body is in a range of 5% to 95%.

21. The method of claim 20, wherein the protective cover bears on an edge region of the semiconductor wafer which surrounds the circuit region.

\* \* \* \* \*